US010822690B2

(12) United States Patent
    Shin

(10) Patent No.: US 10,822,690 B2
(45) Date of Patent: Nov. 3, 2020

(54) LITHIUM-CONTAINING TRANSITION METAL OXIDE TARGET

(71) Applicant: UMICORE, Brussels (BE)

(72) Inventor: Jong-Won Shin, Providence, RI (US)

(73) Assignee: UMICORE, Brussels (BE)

( * ) Notice: Subject to any disclaimer, the term of this patent is extended or adjusted under 35 U.S.C. 154(b) by 442 days.

(21) Appl. No.: 15/558,364

(22) PCT Filed: Mar. 17, 2016

(86) PCT No.: PCT/EP2016/055779
    § 371 (c)(1),
    (2) Date: Sep. 14, 2017

(87) PCT Pub. No.: WO2016/146732
    PCT Pub. Date: Sep. 22, 2016

(65) Prior Publication Data
    US 2018/0100231 A1    Apr. 12, 2018

Related U.S. Application Data

(60) Provisional application No. 62/134,807, filed on Mar. 18, 2015, provisional application No. 62/134,762, filed on Mar. 18, 2015.

(51) Int. Cl.
    *C23C 14/34*     (2006.01)
    *H01J 37/34*     (2006.01)
    (Continued)

(52) U.S. Cl.
    CPC ............ *C23C 14/3414* (2013.01); *B22F 3/04* (2013.01); *B23K 1/002* (2013.01); *C01G 51/42* (2013.01);
    (Continued)

(58) Field of Classification Search
    CPC .......................... H01J 37/3426; H01J 37/342
    See application file for complete search history.

(56) References Cited

U.S. PATENT DOCUMENTS

5,955,051 A    9/1999   Li et al.
6,787,011 B2   9/2004   Ueda et al.
                        (Continued)

FOREIGN PATENT DOCUMENTS

CN    102054964 A    5/2011
CN    102206802 A    10/2011
                     (Continued)

OTHER PUBLICATIONS

Office Action received in JP Application 2017-549003 dated Dec. 23, 2019 (6 pages with 5 pages of English translation).
(Continued)

*Primary Examiner* — Jason Berman
(74) *Attorney, Agent, or Firm* — Smith, Gambrell & Russell, LLP

(57) ABSTRACT

A process for the formation of an $LiMO_2$ (e.g., $LiCoO_2$) sputtering target with a bi-modal grain size distribution (as in a hollow cylinder target body) that includes a CIP-based process involving, for example, forming or sourcing an $LiMO_2$ (e.g., $Li\text{—}CoO_2$) powder; dispersion and milling (e.g., wet milling); binder introduction; drying (e.g., spray drying) to form a granulate; CIP processing of the granulate into a molded shape; and a heating cycle for debinding and sintering to form a densified sintered shape. The target body produced is suited for inclusion on a sputtering target assembly (as in a rotary sputtering target assembly with a plurality of cylindrical target bodies attached to a backing support). The invention is inclusive of the resultant target bodies formed under the CIP based process as well as an induction heater based process for attachment (e.g., metal solder bonding) of the low conductivity target body(ies) of
(Continued)

Particle Size Distribution Following Milling

LiMO$_2$ (e.g., LiCoO$_2$) to a common backing support through use of an added conductive wrap or layer provided to the target body and heated with the induction heater during the attachment process.

43 Claims, 23 Drawing Sheets

(51) Int. Cl.
  *B23K 1/002* (2006.01)
  *B22F 3/04* (2006.01)
  *C01G 51/00* (2006.01)
(52) U.S. Cl.
  CPC ........ *H01J 37/342* (2013.01); *H01J 37/3426* (2013.01); *H01J 37/3491* (2013.01); *C01P 2004/53* (2013.01)

(56) References Cited

U.S. PATENT DOCUMENTS

| | | | |
|---|---|---|---|
| 8,303,855 | B2 | 11/2012 | Paulsen et al. |
| 8,337,727 | B2 | 12/2012 | Chen et al. |
| 8,608,987 | B2 | 12/2013 | Chen et al. |
| 2007/0074969 | A1 | 4/2007 | Simpson et al. |
| 2011/0311436 | A1* | 12/2011 | Yura ............... C01G 45/1242 423/599 |
| 2012/0270104 | A1 | 10/2012 | Paulsen et al. |
| 2012/0305392 | A1 | 12/2012 | Kim et al. |
| 2013/0118898 | A1 | 5/2013 | Shin et al. |
| 2015/0376773 | A1* | 12/2015 | Taketomi ............... H01M 4/525 204/298.13 |
| 2016/0064200 | A1 | 3/2016 | Taketomi et al. |
| 2018/0051371 | A1 | 2/2018 | Shin et al. |

FOREIGN PATENT DOCUMENTS

| | | |
|---|---|---|
| CN | 102770391 A | 11/2012 |
| EP | 2524904 A1 | 11/2012 |
| EP | 2532634 A1 | 12/2012 |
| JP | 2009-158416 A | 7/2009 |
| JP | 2010-532075 A | 9/2010 |
| JP | 2014-231639 A | 12/2014 |
| WO | 2009-003573 A1 | 1/2009 |
| WO | 2011-086650 A1 | 7/2011 |
| WO | 2013-108715 A1 | 7/2013 |

OTHER PUBLICATIONS

First Office Action for Chinese Patent Application No. 201680016509.2 dated May 5, 2019 (3 pages in Chinese with English Translation).
Search Report for Chinese Patent Application No. 201680016509.2 dated Apr. 24, 2019 (1 page in Chinese with English Translation).
Written Opinion of the International Searching Authority for International Patent Application No. PCT/EP2016/055779 dated May 6, 2016 (4 pages).
International Preliminary Report on Patentability for International Patent Application No. PCT/EP2016/055779 dated Sep. 19, 2017 (5 pages).
International Search Report for PCT/EP2016/055779, dated May 6, 2016 in English Language.

* cited by examiner

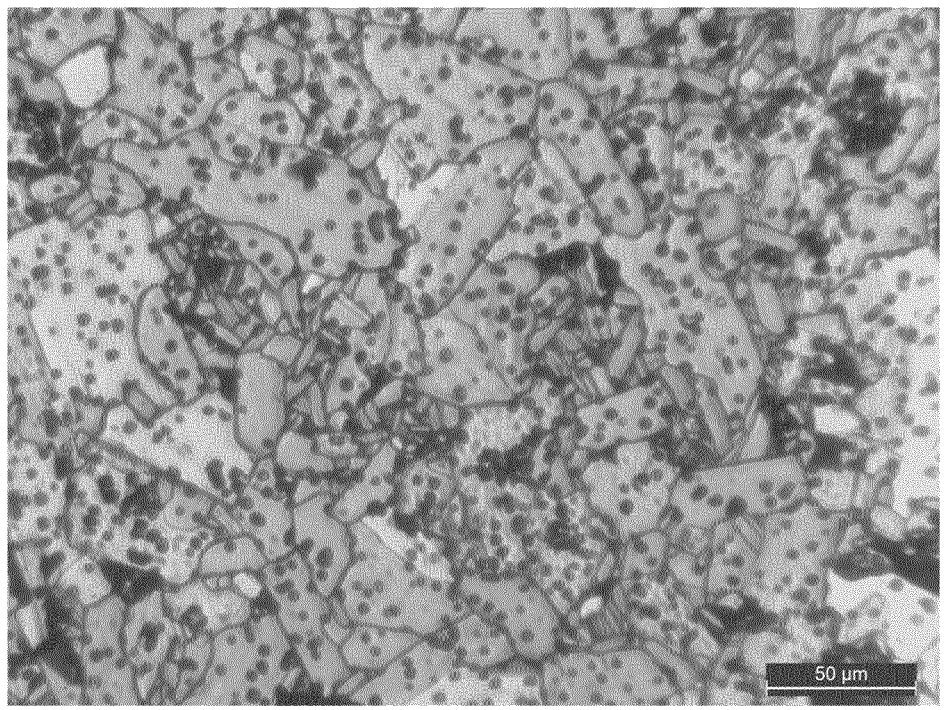
FIG. 2A SEM Micrograph of Sintered Body
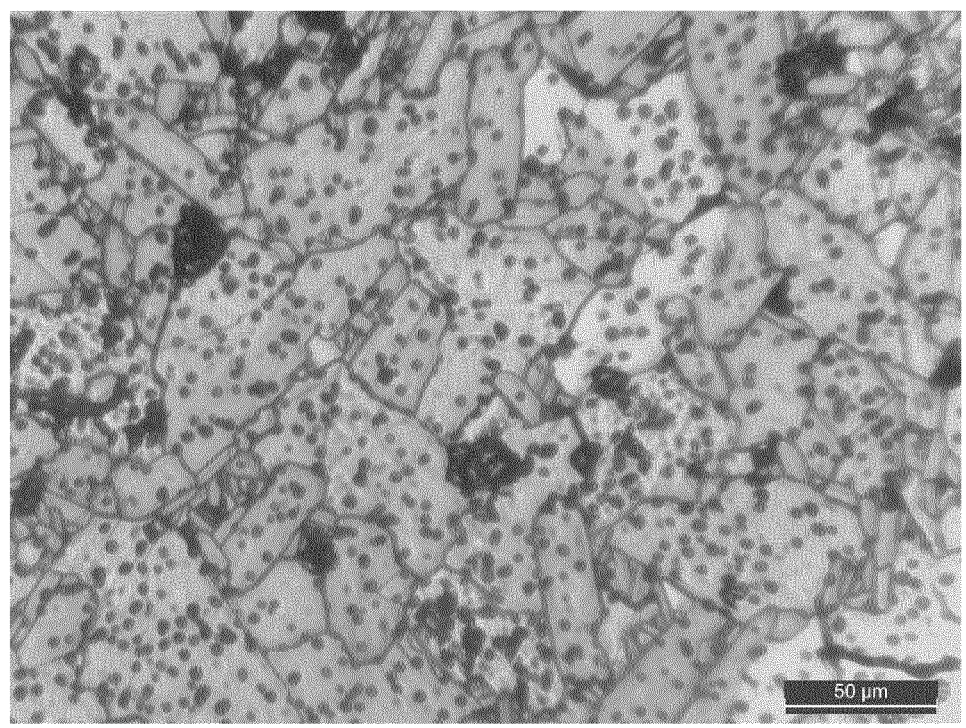
FIG. 2B SEM Micrograph of Sintered Body

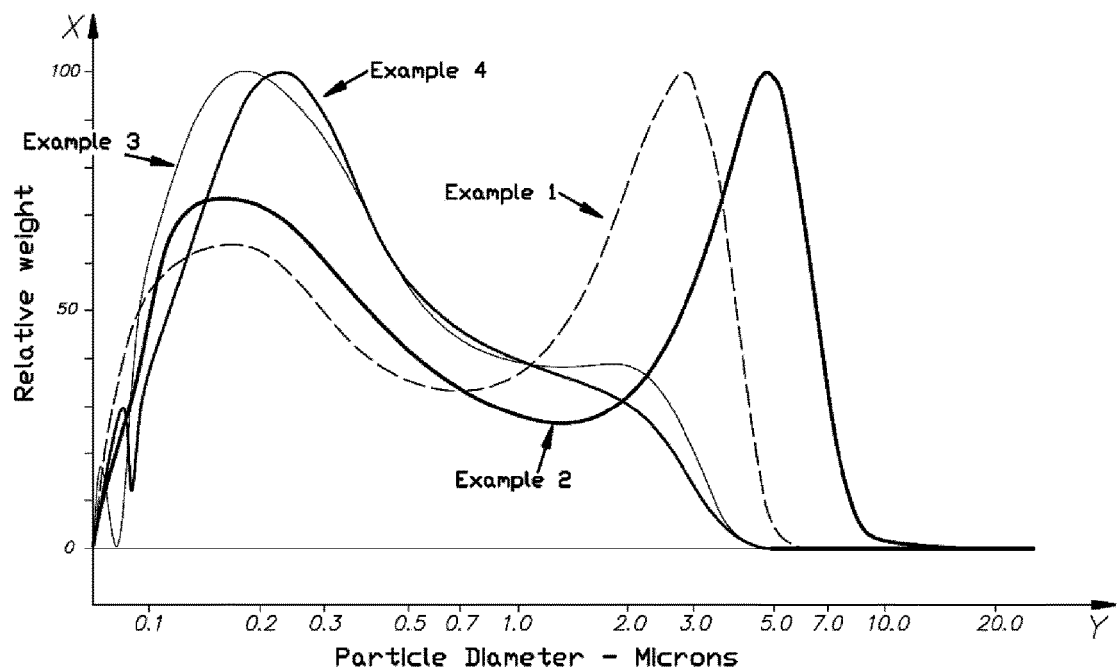
FIG. 3 Particle Size Distribution Following Milling
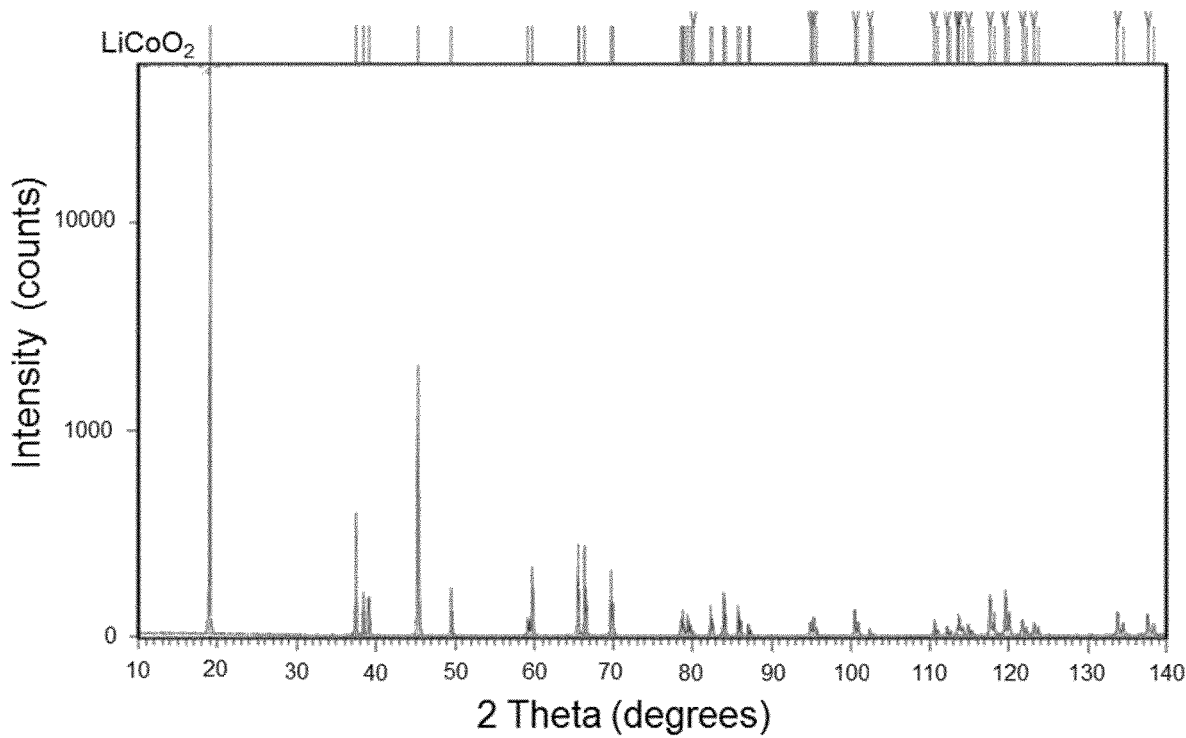
FIG. 4 Powder X-Ray Diffractogram of Cellcore ® D5

Grain Size Determination
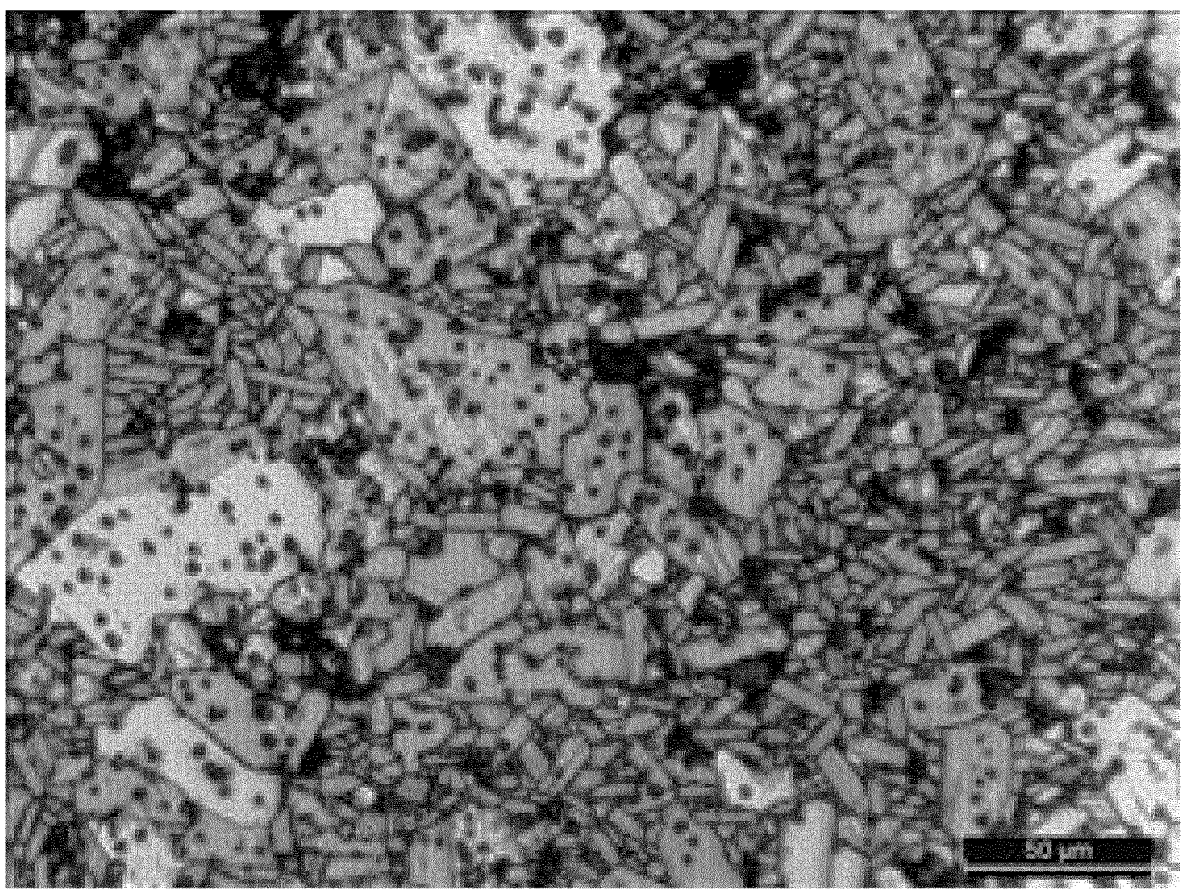
FIG. 5A Original Image

Grain Size Determination
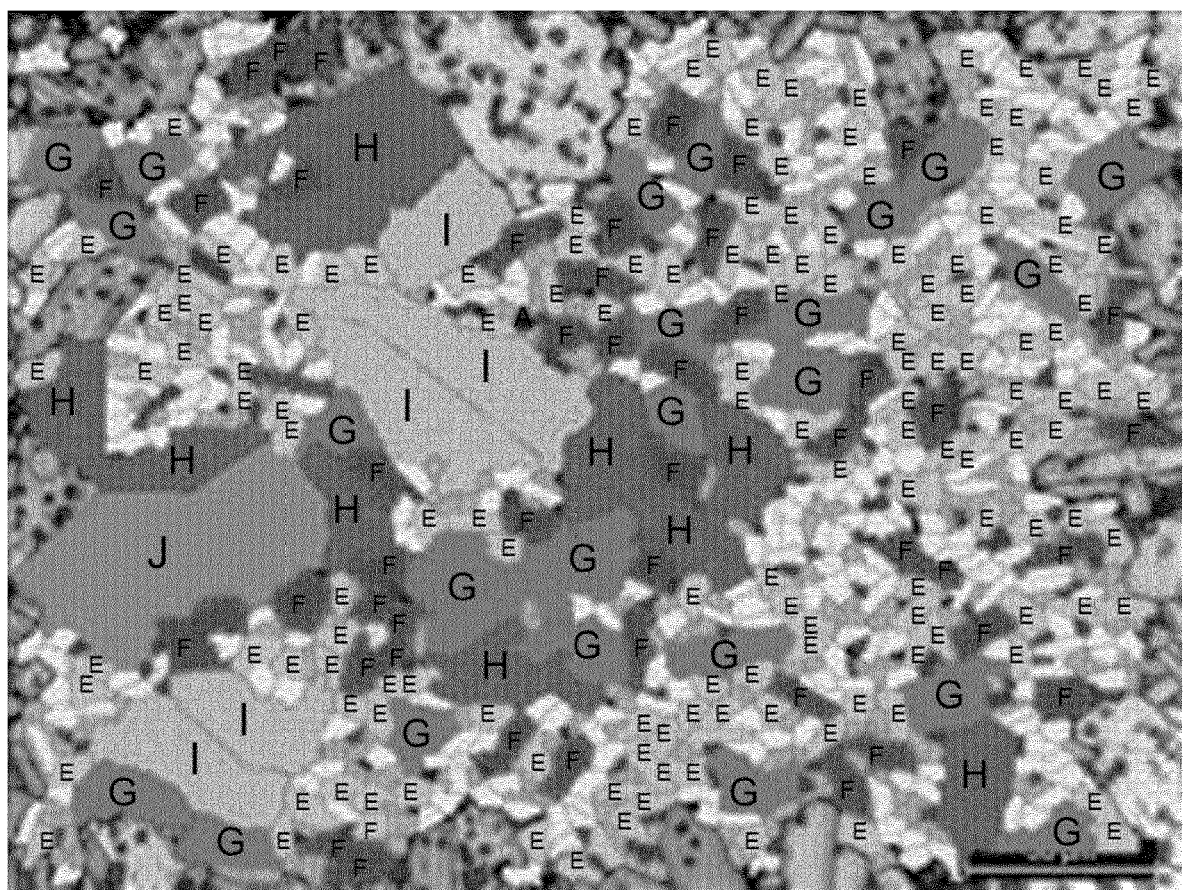
FIG. 5B Processed Image

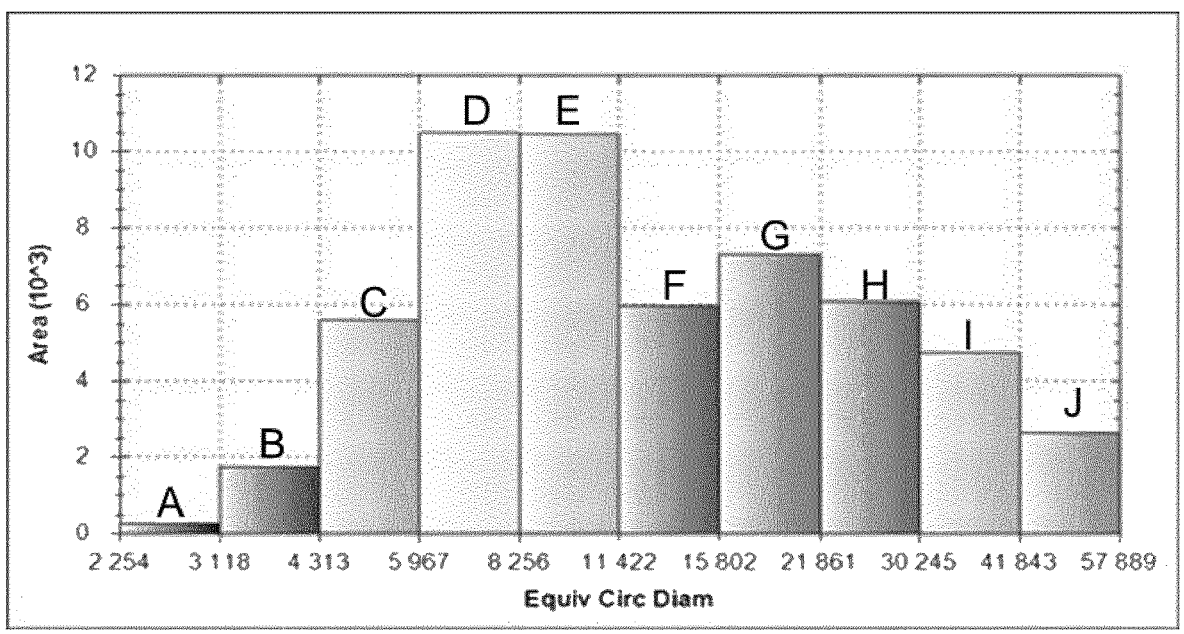
FIG. 5C Grain Size Distribution

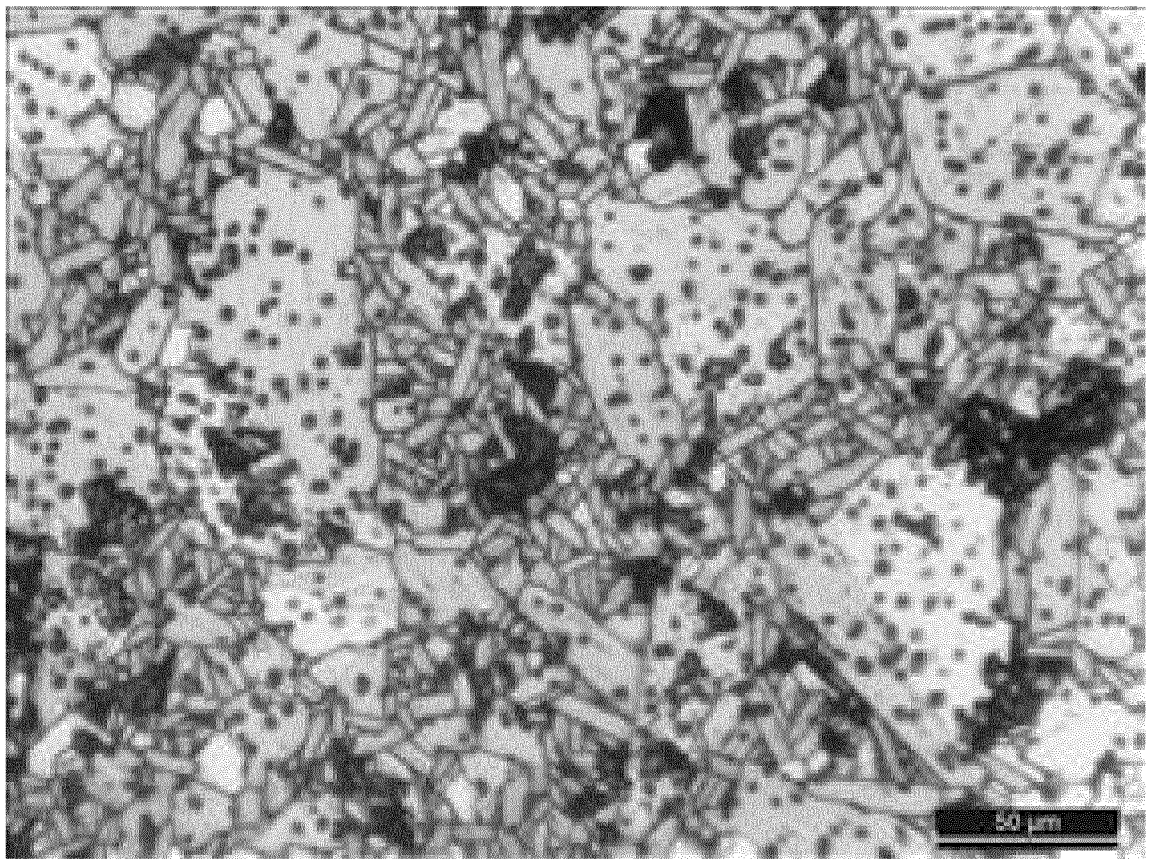
FIG. 5D Original Image

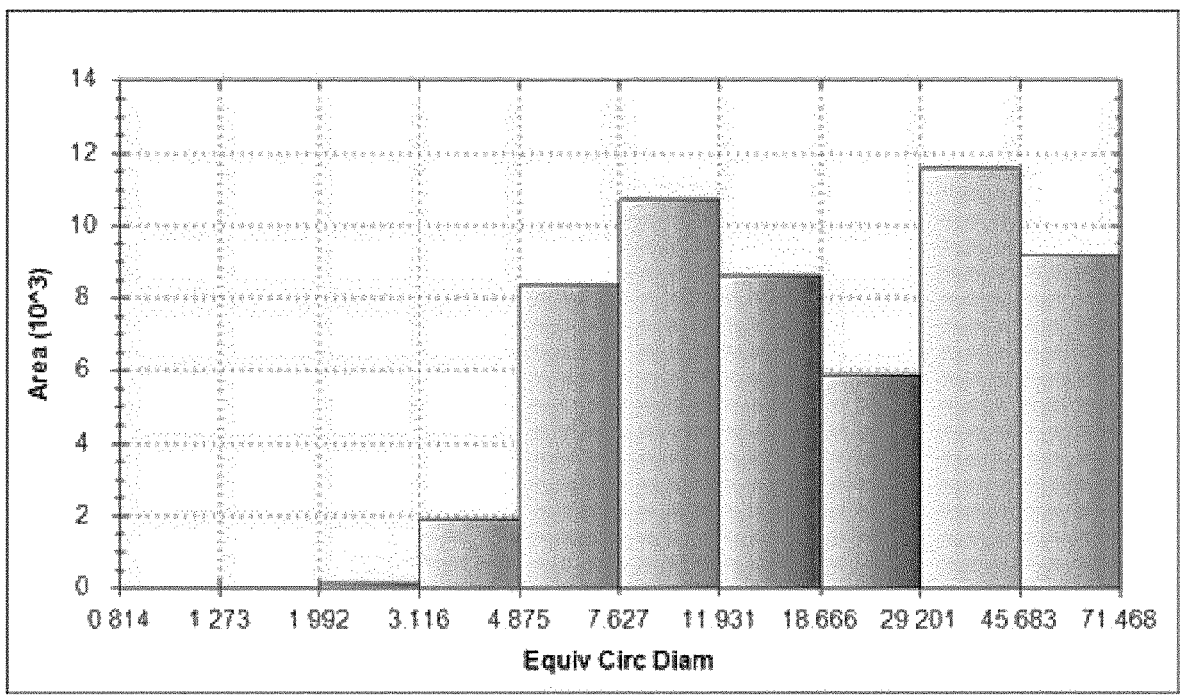
FIG. 5E Grain Size Distribution

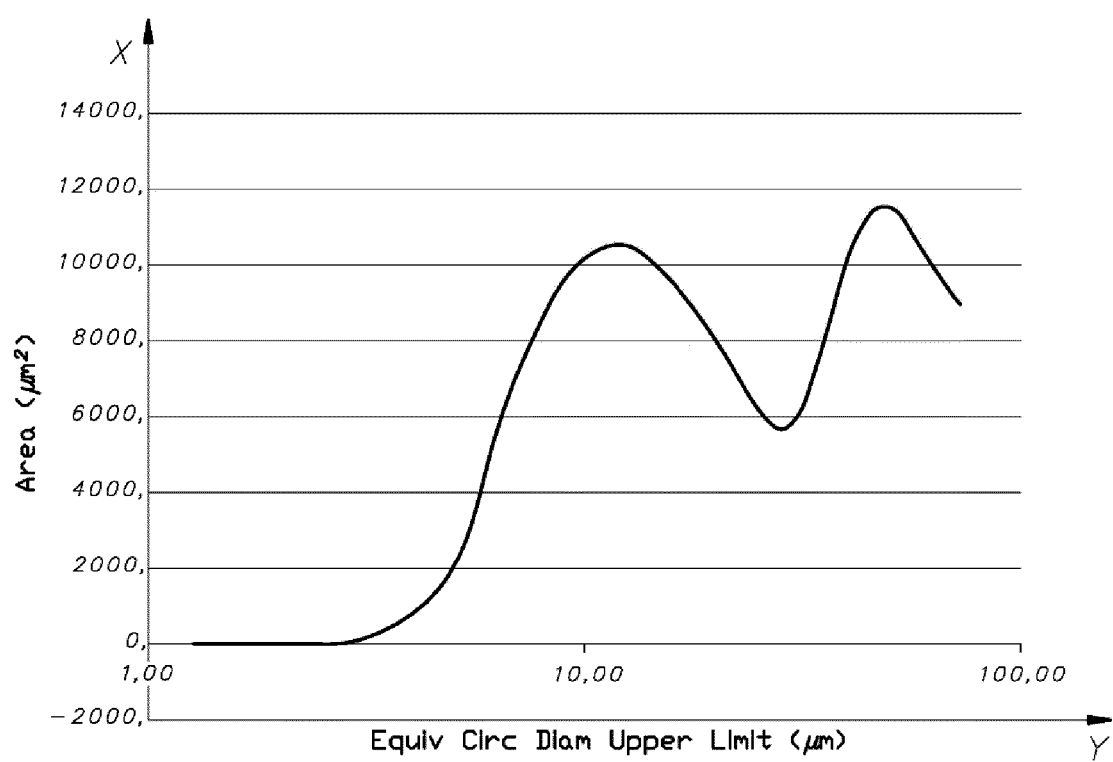
FIG. 5F Grain Size Distribution

LITHIUM-CONTAINING TRANSITION METAL OXIDE TARGET

FIELD OF THE INVENTION

The present invention relates to sputtering targets and sputtering target assemblies, and methods of producing sputtering targets and sputtering target assemblies.

BACKGROUND OF THE INVENTION

There is a growing demand for sputtering targets and sputtering target assemblies that can be economically formed and operated (with economic losses to be avoided including losses associated with sputtering target bodies that fail to meet predetermined quality criteria or that fail during a formation stage so as to require discarding or recycling, as well as losses associated with the manufacture of target assemblies that fail to meet predetermined quality criteria or fail during a formation stage so as to require discarding or recycling).

Sputtering target assemblies are used in the formation of a wide variety of products. Some typical substrates on which the target material supplied by the sputtering target assembly is deposited include items such as semiconductor devices, compact discs (CD), hard disks for use in magnetic disk drives, and optical devices such as flat panel displays.

Sputtering technology is also used in the production of thin film batteries utilizing lithium-containing transition metal oxide targets formed from a sintered compact of lithium-containing transition metal oxides such as $LiCoO_2$. For example, lithium-based layered transition metal oxides such as $LiMO_2$ (where M includes the primary metals of interest such as Ni, Co, and Mn, or combinations thereof, and other dopants or modifiers including Ti, Al, V, Cr, Y, Sr, Ca, Zr, Zn, Si, Mg, Ga, W, Fe, Cu, La, or combinations thereof) have attracted great interest. Properties such as high energy density, long cycle life, good safety features, stable discharge properties and wide range of operating temperatures make them excellent candidates for active compounds as high capacity cathode materials in rechargeable lithium batteries. A typical sputtering apparatus comprises a vacuum chamber inside of which are positioned the target assembly and the substrate on which a film is to be deposited. The target of the target assembly is electrically configured to be an electrode with a large ion flux. An inert gas, often in conjunction with a reactive gas, is introduced into the chamber and ionizes when power is supplied to the target/electrode. The positively charged inert gas ions collide with the target causing atomic sized particles to be ejected from the target. The particles are then deposited on the surface of the substrate as a thin film.

Because of this electrical configuration, the target can become very hot and needs to be cooled. In a typical sputtering apparatus, the cooling is provided by a water-cooled backing member to which the target is attached by an attachment layer to form a target assembly. When the sputtering target is configured of a sintered body of a raw material powder, there are numerous factors (physical and chemical attributes) both in the production and in the use of such targets that can lead to problems. For example, it is difficult to consistently manufacture a sintered body that has good homogeneity, is defect-free, and is of high density. The sputtering target is also placed in a harsh environment and subject to potentially degrading influences during use (again, physical and chemical), and thus has to be formed in an effort to avoid such degradation during use (e.g., undesirable nodule formation, chipping, peeling, cracking, separation from its support, etc.).

The above issues are also true in the formation of $LiMO_2$ target bodies (e.g., $LiCoO_2$ crystal structures) that comprise a layered structure that is known to peel off between layers in certain situations.

In some sputtering systems, a rectangular target and backing plate are used, while in other systems, in which the sputtering target material has been found suitable (such as ITO sputtering target based systems), the target and backing plate are cylindrical in shape. The cylindrical shape is more difficult to form as a target and to assemble into a sputtering target assembly. For example, there is known in the art planar $LiCoO_2$ sputtering targets formed by hot pressing (HP) $LiCoO_2$ powders, as well as by other known ceramic formation processes such as cold axial pressing (CAP), cold isostatic pressing (CIP), and hot isostatic pressing (HIP). Each of these processes readily supports the formation of suitably dense materials for use in planar sputtering target assemblies. However, there is lacking in the art suitable $LiMO_2$ cylindrical sputtering targets (e.g., $LiCoO_2$ cylindrical sputtering targets) despite the known potential for a cylindrical target to provide increased deposition rates, a lower propensity for nodule formation, and a higher material utilization as compared to a corresponding sputtering planar target. Again, this deficiency in the art is considered due to the additional complexity associated with a hollow, cylindrical target body as opposed to a planar target body such as a rectangular or circular disc target body (e.g., from the standpoint of differences in material composition and manufacturing requirement characteristics in the initial formation, and the additional issues associated with mounting a cylindrical body in a target assembly).

Examples in the art relative to the formation of planar $LiCoO_2$ targets through use of HIP or HP can be found in EP Publication 2524904 (A1) which discloses the formation of sintered planar targets of $LiCoO_2$ using these high temperature pressing processes wherein the material compression temperature is between, for example, 800° C. and 880° C. Such high temperature pressing techniques introduce high costs associated with the high temperature generation as well as higher temperature operator risks. Additionally, processes which use a hot press such as described in EP Publication 2524904 (A1) are considered poorly suited for cylindrical sputtering target molding since pressing is constrained to a single axial direction and thus can only yield hollow cylinders limited in length, better described as rings. While HIP processes in general are potentially capable of pressing intricate ceramic shapes such as tall hollow cylinders, a pre-forming step (CIP or spraying) is required to mold or otherwise generate the cylindrical shape which is subsequently pressed at high temperature. In the case of spray pre-forming, the ceramic precursor must be distributed homogeneously onto a suitably-shaped strong and thermally resistant support structure which can survive the HIP temperature and pressure. Additionally, the support structure must be subsequently removed unless this structure also serves as the backing tube for the sputtering target. In this case, elaborate measures must be taken to ensure no loss in contacting (for proper thermal and electrical transport) between the ceramic and the backing tube surface despite differences in coefficients of thermal expansion for the two materials. As a result, neither of these process approaches is particularly suited with respect to ceramic source materials such as $LiMO_2$ (e.g., $LiCoO_2$) powders. As an example of differences in the coefficient of thermal expansion ("CTE"— linear) in general, some $LiCoO_2$ material has a CTE of 11.5 while titanium (an example of a suitable metal backing tube) has a CTE of 7-9.

Reference is also made to EP Publication No. 2532634 (A1) which describes the formation of planar disc $LiCoO_2$ targets using a CIP-and-Sintering method involving a dry ball mill technique to achieve a desired resultant average particle size, with a description of a repulverization (dry ball mill-CIP mold-pulverize-CIP mold) process relative to binder addition examples. This re-molding is taught specifically to overcome limitations in material strength which are inherently critical for the survivability of the formed targets, either during subsequent machining to final dimensions, bonding to a backing support, or utilization in a sputtering process. It is considered that the described process, in addition to failing to describe a material well suited for achieving the more difficult cylindrical sputtering target body and target assembly formation, represents an uneconomical method of formation.

SUMMARY OF THE INVENTION

Accordingly, the present invention is directed at the need in the art for a more cost effective sputtering alternative to the standard planar target format featured for materials such as $LiCoO_2$, which includes providing cost effective cylindrical sputtering targets formed from ceramics such as $LiMO_2$ (e.g., $LiCoO_2$) for use in the sputtering formation of film products such as thin film batteries.

The present invention is thus directed at providing a method for forming cylindrical sputtering targets of $LiMO_2$ (e.g., $LiCoO_2$) and resultant cylindrical sputtering targets of $LiMO_2$ (e.g., $LiCoO_2$), as well as cylindrical sputtering target assemblies (e.g., one or more cylindrical target bodies of $LiMO_2$ (e.g., $LiCoO_2$) supported on a backing tube and appropriately attached (e.g., bonded) thereto in order to accommodate the harsh sputtering target environment).

The present invention is inclusive of a CIP-based process for the densification of $LiMO_2$ (e.g., $LiCoO_2$) in the form of hollow cylinders suited for use in sputtering target assemblies, as well as a technique of assembling such hollow cylinders on a suitable target backing support so as to provide a functioning $LiCoO_2$ rotating sputtering target assembly.

The present invention is inclusive of forming an $LiMO_2$ (e.g., $LiCoO_2$) hollow cylindrical target body having characteristics that enable the target body to serve as a sputtering target having one or more (with "more" being any available subset or all of a) to h)) of the following:
  a) a relative density range of ≥90%, more preferably 91 to 99.8% (as in 95 to 99.8%), as determined by an Archimedes' technique such as described in ASTM C693: Standard Test Method for Density of Glass by Buoyancy";
  b) a resistivity value of ≤5 kΩ-cm, more preferably ≤2 kΩ-cm, values consistent with DC pulse sputtering;
  c) a mean grain diameter of 5 to 40 microns (more preferably 5 to 20 microns, inclusive of a mono-modal grain size distribution and/or a bimodal distribution of grain sizes);
  d) a surface roughness (Ra)≤3.0 microns as in 0.2 to 3.0 microns (with a preference for a higher (more easily wetted) value within this range for the inside diameter (ID) and a lower value, also within this range, for the outside diameter (OD));
  e) an axial length range (per cylinder body) of 150 to 500 mm or more (which can form a section or segment in a multi-cylinder target assembly or be used alone in a sputtering target assembly)
  f) an OD range of 75 to 175 mm;
  g) an ID range of 50 to 160 mm; and/or
  h) a contaminate percentage in the sintered body of less than 1500 ppm, more preferably less than 500 ppm, most preferably less than 100 ppm.

Embodiments of the present invention also include the formation of an $LiMO_2$ (e.g., $LiCoO_2$) sputtering target (e.g., a flat plate, cylinder body, or other sputtering body configuration) that includes the following:
  a) Forming or sourcing an $LiMO_2$ (e.g., $LiCoO_2$) powder of suitable characteristic;
  b) Dispersion and wet milling of the raw powder into an aqueous slip (i.e., a slurry);
  c) Introduction of binders to the slip;
  d) Drying (e.g., spray drying) of the slip (with binder included) to form a granulate;
  e) Loading of granulate in an appropriately designed and dimensioned mold (e.g., a polymer-lined mold);
  f) Cold Isostatic Pressing (CIP) of the granulate to form a molded shape (e.g., in a pressure range of 2000 to 4000 bar, and more preferably at the higher half of the range as in 4,000 bar);
  g) Removal of the CIP densified molded shape from the mold;
  h) Debinding (burn off of the organic binders) and sintering the shape (e.g., a two stage firing sequence to first burn of the binder and then form a sintered shape); and
  i) Machining or otherwise refining the shape to a desired dimension (unless already in a suitable configuration after sintering).

Under the present invention there is also featured a method of forming a sputtering target assembly that includes the above described cylindrical $LiMO_2$ (e.g., $LiCoO_2$) ceramic bodies as well as a suitable backing support and attachment layer therebetween.

The present invention is thus directed at providing a cylindrical $LiMO_2$ (e.g., $LiCoO_2$) target body that has characteristics designed to afford advantages in terms of increased deposition rates, a lower propensity for nodule formation, and higher material utilization than the corresponding sputtering of planar targets. Further, the present invention provides a target body that has characteristics directed at satisfying the notion that, when performing deposition with the sputtering method, a quality target for properly supplying elements to be deposited is indispensable, and the target needs to be of a material that properly matches with the desired composition of the film to be sputtered, while not causing any problems during the deposition. This is also true for $LiMO_2$ (e.g., $LiCoO_2$) sputtering with a sputtering target assembly comprising one or more of the aforementioned target bodies, as in sputtering to produce thin films used in the formation of, for instance, solid thin film Li-based batteries or cells.

In addition to providing a technique for forming high quality hollow $LiMO_2$ cylindrical sputtering target bodies, there is also provided a technique for attachment (e.g., with a bonding step) of such a ceramic hollow target body (or bodies) onto a suitable support structure that is both economical and results in a target assembly with good survivability and high quality sputtering operation performance. For example, the present invention is directed at providing a rotating, cylindrical $LiMO_2$ sputtering target assembly that features a bonding technique that is (e.g., a metal solder binder such as Indium) directed at avoiding issues, such as cumulative thermal and contraction stress leading to delamination of the solder layer from either the backing body or the target segment material or from both, and the associated provoking of cracking of the target body(ies) during sputtering.

In view of the circumstances as described above, an object of the present invention is to provide a manufacturing method for producing a ceramic sputtering target body, such as an $LiMO_2$ (e.g., $LiCoO_2$) sintered sputtering target body, as well as a manufacturing method for producing a sputtering target assembly with one or more target bodies such as the noted $LiMO_2$ (e.g., $LiCoO_2$) sintered sputtering target body, particularly a hollow cylindrical ceramic $LiMO_2$ based target body. These sputtering target assemblies are formed of one or more of such target bodies (e.g., a stack of cylindrical segments arranged in series with or without spacing (e.g., no spacing or with spacing provided, for example, by permanent or removable spacer bodies) between adjacent target bodies in the series), together with a backing support such as a common tubular interior, circumferentially located support tube that is attached (e.g., bonded) to the target body or bodies with suitable bonding/attachment material. While a fixation type material bonding arrangement is featured under the present invention, other attachment arrangements include, for example, a friction retention, circumferential gap filling material in general (e.g., a compressible material provided within the circumference gap such as conductive felt).

The present invention's methods of forming target bodies, the method of assembling target assemblies, and the respective products of each of these methods have features directed at avoiding or alleviating difficulties such as one or more of the above described difficulties in manufacture, while also providing a target assembly that is well suited for producing quality products (e.g., the noted thin film products such as the thin films used in rechargeable batteries, as but one example).

The present invention includes an $LiMO_2$ (e.g., $LiCoO_2$) sintered target body (with embodiments featuring material M as a component of a transitional metal oxide material, such as with M selected as a metal from the group consisting of Ni, Co, Mn, Ti, Al, V, Cr, Y, Sr, Ca, Zr, Zn, Si, Mg, Ga, W, Fe, Cu, La, or combinations thereof (inclusive of stoichiometric and non-stoichiometric $LiMO_2$ compositions relative to the Li and metal(s) M featured in the ceramic material). For example, M includes primary metals such as Ni, Co, and Mn, or combinations thereof, and other dopants or modifiers including Ti, Al, V, Cr, Y, Sr, Ca, Zr, Zn, Si, Mg, Ga, W, Fe, Cu, La, or combinations thereof). The present invention further features an $LiMO_2$ (e.g., $LiCoO_2$) cylindrical sintered target body (or bodies) that is/are bonded to a tubular backing support such as a metallic tubular support with suitable attachment means to form a sputtering target assembly.

The present invention further includes a method of forming a target ("target body"), such as an $LiMO_2$ target body, by densifying a powdered ceramic source by way of a Cold-Isostatic-Press ("CIP") process, and then sintering the ceramic cylindrical molded target body. The powdered ceramic source is preferably subjected to wet milling and drying (e.g., spray drying) into a granulation that is utilized in the CIP densification process. In this way, the CIP and sintering process are used to form a hollow cylindrical sputtering target body such as the noted $LiMO_2$ (e.g., $LiCoO_2$) cylindrical sputtering target body that is suited for use in a sputtering process. The same densification and sintering process is also useful for generating planar tiles or discs and other different configured sputtering target bodies.

The invention further includes a manufacturing method for an $LiMO_2$ (e.g., $LiCoO_2$) target assembly that features an $LiMO_2$ (e.g., $LiCoO_2$) cylindrical sintered target body (or bodies) that is/are bonded to a tubular backing support such as a metallic tubular support. An embodiment of the present invention further includes an $LiMO_2$ (e.g., $LiCoO_2$) sputtering target assembly that is assembled from a pre-formed cylindrically-shaped sintered $LiMO_2$ (e.g., $LiCoO_2$) target body or bodies that is/are bonded to an internal cylindrical tubular support (preferably a metallic tube as in one that is formed of titanium and is used as a common support in embodiments with multiple target bodies). An example of an attachment means for positioning between opposing surfaces of the target body(ies) and the backing structure being attached includes bonding of the two components by way of bonding material as in a metal solder (e.g., a bonding material of In or an In alloy, Sn or Sn alloys, Ag or Ag alloys, with such alloys potentially including a certain amount of other metallic elements to improve the material's wetting property and bonding strength or to reduce the melting point or as a desirable contaminant. Ti, Zn, Cu, Ni, Ga, Ce, Bi, Sb, Si, and Pb can be such elements. Such bonding material (e.g., alloys) can also be utilized in conjunction with a surface wetting process before the final gap filling bonding material is provided to join the backing substrate to the target body. That is, reference to bonding material in the present application is inclusive of wetting material as well as "gap filling" bonding material (that might be used alone or in conjunction with wetting material supplied on either or both of the ID of the target body(ies) or OD of the backing support(s)). The wetting material or gap filling material can either be of a common material or a different material. Further, different materials such as those providing bridging/varying coefficients of thermal expansion may be applied within the circumferential gap.

The present invention is also inclusive of utilizing, in thin film formation, the aforementioned inventive sintered target body or bodies of, for example, the $LiMO_2$ (e.g., $LiCoO_2$) sintered target body material, preferably following combination with a suitable support. For example, the thin film formation can be that used in the formation of a positive electrode of a thin film lithium secondary cell. In such use, a preferred embodiment features a rotary cylindrical sputtering target assembly comprised of one or more of the noted $LiMO_2$ (e.g., $LiCoO_2$) cylindrical target body(ies) as the source for the generation of sputtered material in a sputtering chamber as in the vacuum sputtering chamber discussed above.

The field of the invention further includes a method for forming a target assembly (e.g., a rotary cylindrical sputtering target assembly formed of one or more cylindrical target bodies) which includes an inductive heating technique in the assembly and which is applicable to, for example, $LiMO_2$ (e.g., $LiCoO_2$) target body assemblies such as those described above. Embodiments of the present invention further relate to methods for producing an $LiMO_2$ (e.g., $LiCoO_2$) sintered body in the form of a sputtering target that is well suited for use in the forming, for example, of a positive electrode in a thin film lithium secondary cell or battery. The present invention further relates to sputtering target bodies and sputtering target assemblies used in the formation of thin film products, such as target assemblies that include planar (e.g., disc or sheet(s)) or cylindrical (unitary or stacked target arrangements), and have a backing body in the form of a plate or tube to which the target material is bonded.

Embodiments of the present invention also include the formation of sputtering target assemblies, with sputtering target bodies produced under the present invention, via a variety of assembly techniques. An example of a preferred assembly technique is one that is particularly suited for bonding relatively lower conductivity target material bodies, such as forms of the ceramic $LiMO_2$ (e.g., $LiCoO_2$) producible under the present invention, and which assembly technique involves induction heating with a combination of an induction heater and an added conductive material associated with the target body to be heated (e.g., an added conductive fabric wrap wrapped about the target body and internal to the coil of the induction heater). This induction heating technique provides for controlled heating of the attachment (e.g., bonding) material, such as wetting or gap filler bonding material positioned within the circumferential gap located between the one or more hollow cylindrical ceramic sputtering bodies and a suitable internal backing support structure. This bonding technique, with an induction heater and preferably also an intermediate conductive material facilitates the avoidance of problems such as thermal shock and poor or non-lasting attachment which can be potentially associated with other attachment/binder application heating techniques such as techniques limited to radiative heating only in the bonding process. The present invention is however inclusive of using other bonding techniques for attaching sputtering target bodies like those described herein to a suitable backing support inclusive of alternate assembly bonding techniques such as radiative heat bonders. An example of another bonding technique/assembly suited for use with the target bodies of the present invention includes that which is described in US Publication No. 2007/0074969, published on Apr. 5, 2007 to Simpson et al. (US '969 Publication), the disclosure of which is incorporated herein by reference and is outlined further below.

An additional example of a bonding technique suited for formation of sputtering target assemblies with the target body(ies) described herein, is found in U.S. Publication No. 2013/0118898 (US '898), published May 16, 2013, to the same Applicant, and which is incorporated herein by reference. This publication includes intentionally forming distinct areas in one or both of the opposing surfaces defining a region between the target bodies and the backing support by selective, superficial treatment designed to enhance the bonding strength during the bonding stage.

In embodiments under the present invention, such as the above described bonding technique utilizing one or more induction heaters (with or without an added conductive component such as the aforementioned conductive wrap), there is provided improved capability in the control of temperature gradients within a rotary target assembly during the attachment (e.g., bonding) process. For example, there is facilitated added control over the axial thermal gradient that arises in the attachment material that is supplied within the region between the opposing surfaces of the target body and associated backing support. Electric frequencies and energy levels of the induction heater(s) are controllable to facilitate balanced heating axially and radially. Frequencies can be selected to effectively control the heating of, for example, an only moderately conductive ceramic target material (such as represented by forms of the present invention's $LiMO_2$ (e.g., $LiCoO_2$) target bodies) in the presence of the backing support such as one of a higher conductivity (e.g., a metallic backing tube). Rates of heating and cooling can be maximized while minimizing gradients with simple power controls. This reduces assembly times. The inductive heating elements can also be made relatively small so as to provide excellent access to the assembly being heated, and the noted added conductive component such as the noted conductive wrap(s) can be used to supplement the induction heating in a controllable fashion relative to, for example, an only moderately conductive target body being heated.

The rate of inductive heating of an object is dependent on several factors including the frequency of the induced current, the intensity of the induced current, the specific heat of the material, the magnetic permeability of the material, and the resistance of the material to the flow of current. In situations where the physical properties render the components of the sputtering assembly not well suited for inductive heating directly (e.g., certain forms of $LiMO_2$ (e.g., $LiCoO_2$) target bodies being representative) the present invention provides a method that obviates this limitation. Instead of inductively heating the ceramic directly with inductive heater(s) alone, the ceramic piece (target body) is wrapped with an inductively susceptible material which is heated, using conventional heat transfer to raise the temperature of the wrapped ceramic.

Although a number of conductive wraps (e.g., conductive sleeves), including those of metallic and non-metallic materials, are featured under the present invention, a conductive wrap of a carbon-embedded woven fabric (e.g., a fabric composed of fiberglass or other ceramic fibers) is featured for providing efficient heating of the wrapped $LiMO_2$ (e.g., $LiCoO_2$) cylinder. Advantageously, with appropriate selection of the power and frequency of the inductive heater controls, an annular inductive heating unit with dimensions allowing the wrapped hollow $LiMO_2$ (e.g., $LiCoO_2$) cylinder to be surrounded by the associated coils of the inductive heating unit provides efficient heating. Additionally, a backing tube of outer diameter (OD) smaller than the internal diameter (ID) of the $LiMO_2$ (e.g., $LiCoO_2$) cylinder can be positioned within the hollow $LiMO_2$ (e.g., $LiCoO_2$) cylinder, and the combination heated simultaneously.

Embodiments of the present invention also include the inclusion of a protective wrap (either alone or in combination with a conductive wrap, if utilized). The protective wrap is provided about the OD of the target body formed under the techniques of the present invention prior to the attachment/bonding stage. The protective wrap is formed of a material suited for the intended heated environment such as a wrap of polyamide film (e.g., Kapton® film). In a preferred embodiment the protective wrap is attached directly to the underlying ceramic target's OD surface with no substantive air pockets and is free of glue or adhesive. If additional securement is desired, it can be done with retention means such as tape applied about the external surface of the protective wrap. In embodiments where a conductive wrap is used, the protective wrap provides a degree of protection from degrading reactions or deposits (e.g., stains) that might result if the conductive wrap was placed directly in contact with the target body. The conductive wrap, when used, is also preferably sufficiently thin and flexible as to avoid air pocket formation relative to the underlying surface (e.g., the protective wrap, if used, or the target body, if the protective wrap is not utilized). A ribbon, helical wrap for either or both of the noted wraps is preferable. An additional advantage of the protective wrap featured under the present invention is that it (preferably as well with any tape utilized on its exterior as in a polyamide with silicone adhesive tape) can be retained in place after induction heater usage stoppage and conductive wrap removal, and retained for protection during the subsequent period until it is desired for sputtering usage.

Embodiments of the invention thus include methods for forming CIP based $LiMO_2$, such as $LiCoO_2$, methods for bonding sputtering targets such as circumferentially arranged hollow ceramic target bodies (monolithic or stacked with and without spacers) to a backing tube, and an advantageous arrangement wherein there is combined, in a target assembly formation process, a CIP based $LiMO_2$ (e.g., $LiCoO_2$) target body using the inductive heating techniques described herein.

Under the present invention there is featured an $LiMO_2$ (e.g., $LiCoO_2$) cylindrical target body. An embodiment of the target body includes one that has a density of 90% or more, a mean grain size (as in a bimodal grain size distribution, although alternate possible embodiments feature a mono-modal grain size distribution) of 5 to 40 microns, a resistivity of ≤5 kΩ-cm (as in a value suitable for pulsed DC sputtering), and a surface roughness of 0.2 to 3.0 microns (for both the ID and OD).

Under the present invention there is also featured a sputtering target assembly that includes one or more $LiMO_2$ (e.g., $LiCoO_2$) cylindrical target body(ies) with a backing support (e.g., a sputtering target assembly comprised of the above described $LiMO_2$ cylindrical target body(ies), a tubular backing support, and attachment means as in a binder positioned to bond the target and backing support together).

Under the present invention there is featured a method of forming an $LiMO_2$ (e.g., $LiCoO_2$) target body, as in a planar plate shape or an alternate shape, such as a hollow cylindrical target body by way of a CIP densification molding of a granulate formed following a wet milling of a source ceramic powder and binder, followed by a heat treatment as in a two stage debinding and sintering heat treatment of the CIP molded body.

The present invention also includes a method that comprises the orientating of a hollow cylindrical target body of $LiMO_2$ (e.g., $LiCoO_2$), formed under the present invention so as to be suitable for use in sputtering of a film material, in relationship to a backing support such as a metallic cylindrical tube, and joining the two with a bonding material. An example of a suitable bonding material includes a metal solder such as indium or an indium alloy that is positioned between the interior of the target body and the exterior of the backing tube as to join the two surfaces for use in a sputtering system.

Under the present invention there is also featured a method of forming a sputtering target assembly that includes one or more target bodies such as that described above (e.g., an $LiCoO_2$ sintered target body or bodies) that is/are bound to a backing support. In the embodiment described below the sputtering target body or segment that is bound to the backing support is a cylindrical target body, although the technique is also suited for other target body shapes such as the bonding of one or more planar target bodies to a backing planar support plate. In the sputtering target assembly method described below, the cylindrical target body or bodies is/are joined to a suitable support (e.g., a metallic tubular support) using a bonding technique such as set out below:

Bonding the cylindrically shaped sintered, target body (having an ID and an OD such as one refined by ID and/or OD machining) to a suitable backing support such as a tubular support with a bonding technique that comprises the following:

i) wetting (e.g., direct wetting) of the ID of the cylinder (e.g., an $LiCoO_2$ cylinder) with a wetting material such as indium or an indium alloy (with or without additional intermediate layers such as Ag or Ni to enhance the bonding interface in some environments);

ii) wetting (e.g., direct wetting) of the OD of the backing tube with a wetting material such as indium or an indium alloy (with or without additional intermediate layers such as Ag or Ni to enhance the bonding interface in some environments);

iii) providing intermediate (e.g., circumferential gap filling) bonding material between the wetted surface such as additional indium or indium alloy to bind the target body or bodies to a corresponding backing support as to form a cylindrical sputtering target assembly (i.e., filling the gap between OD of the backing tube and the ID of the cylinder); and iv) utilizing an induction heat generator in conjunction with the binding process.

Under some embodiments of the invention, as wherein the wetting layering (and/or additional intermediate layers) is sufficiently radial thick and readily softened upon heat application, there is featured a direct telescopic sliding of the target body relative to the backing support without an intermediate gap spacing to be filled by attachment means. However, for the $LiMO_2$ (e.g., $LiCoO_2$) cylindrical target bodies featured under the present invention, there is a preference for using a bonding technique that provides for a circumferential gap between the target body(ies) and backing support, followed by the addition of a gap filling bonding (attachment) material.

The present invention includes inventive subject matter both in target formation, target assembly formation and their respective manufacture and uses. For example, the present invention is inclusive of:

A) A method for forming a sputtering target comprising: configuring a source of $LiMO_2$ material into a hollow cylindrical sputtering target body.

B) A method of forming the hollow cylindrical sputtering target body of A, comprising compressing the $LiMO_2$ material in a cold isostatic process (CIP) so as to shape the hollow cylindrical sputtering target body.

C) The method of B wherein only one CIP step is carried out in forming a finalized cylindrical sputtering target body.

D) The method of B wherein the cylindrical sputtering target body has an axial length of at least 100 mm.

E) The method of D wherein the axial length is from 100 mm to 1000 mm.

F) The method of B wherein the compressed $LiMO_2$ material is compressed together with a binder material G) The method of B wherein the $LiMO_2$ material is subject to wet milling prior to compression.

H) The method of G wherein the wet milled $LiMO_2$ is mixed with the binder prior to compression (with illustrative binders being those selected from the group consisting of polyvinylalcohol and polyvinylacetate).

I) The method of H wherein the mix of the wet milled $LiMO_2$ and binder is subjected to spray drying to form a granulate.

J) The method of I wherein at least 70% of the total number of granulates has a size of 40 to 120 microns which is subjected to compression in the CIP stage (more preferably in a range of 60-100 microns).

K) The method of I wherein the granulate is placed in a mold and subjected to the CIP compression.

L) The method of K wherein the CIP compression level is from 3000 to 4000 bar.

M) The method of H wherein the CIP compression is carried out in a temperature range from 20 to 30° C. (e.g., as in ambient temperature).

N) The method of B wherein $LiMO_2$ material is wet milled prior to CIP and is spray dried as to form a granulate that is positioned within a CIP mold for the CIP stage.

O) The method of N wherein the $LiMO_2$ that is wet milled has M as a component of a transitional metal oxide material, such as with M selected as a metal from the group consisting of Ni, Co, Mn, Ti, Al, V, Cr, Y, Sr, Ca, Zr, Zn, Si, Mg, Ga, W, Fe, Cu, La, or combinations thereof (e.g., M includes primary metals such as Ni, Co, and Mn, or combinations thereof, and other dopants or modifiers including Ti, Al, V, Cr, Y, Sr, Ca, Zr, Zn, Si, Mg, Ga, W, Fe, Cu, La, or combinations thereof). For example, the Li/M ratio can be varied (e.g., stoichiometric or non-stoichiometric) to fit the intended final product attributes and the sputtering apparatus characteristics, with Li/M (e.g., Li/Co) atomic ratios of 0.90 to 1.25 (as in 0.98 to 1.05) being illustrative of some embodiments.

P) The method of K wherein a molded shape formed in the CIP process is subject to sintering.

Q) The method of P wherein the sintering is carried out as part of a two stage heat application comprising a debinding stage wherein binder material is removed followed by the sintering as a subsequent heat application stage.

R) The method of Q wherein the two stage heat application includes the binder removal stage in a range of 125 to 600° C. and a sintering stage in a range of 600 to 1050° C. (with embodiments featuring the sintering temperature exceeding the debinder removal temperature). A preferred sintering temperature range is 950 to 1050° C., and more preferably 1000 to 1050° C., which sintering temperature is featured, for example, following CIP pressure ranges of 3000 to 4000 Bar and more preferably 3050 to 4000 Bar.

S) The method of Q wherein the sintered body that is generated after the two stage heat application has the $LiMO_2$ material as comprising $LiCoO_2$ material.

T) The method of Q comprising providing a wetting material to the inside diameter of sintered body to provide a wetted sputtering target body.

U) The method of A wherein the sputtering target body is formed as to have a bi-modal grain pattern.

V) The method of U wherein each peak of the bi-modal pattern is below 40 microns.

W) The method of A wherein the sputtering target body is formed from a raw ceramic $LiMO_2$ powder that has a mean particle size of less than 40 μm and is subjected to wet milling.

X) The method of W wherein the $LiMO_2$ material after wet milling has a mean particle size of 0.15 to 2.0 micron (as in one that is reduced down at least by a ratio of 10/1 (e.g., a sourced mean particle size of 7 to 8 μm down to a wet milled reduced mean particle size of 0.15 to 1.0 μm as in 0.5+/−0.3 μm).

Y) The method of A wherein a binder is included in a slurry with wet milled $LiMO_2$ particles and spray dried with the wet milled $LiMO_2$ as to provide a source $LiMO_2$ granulate material for configuration into the hollow cylindrical sputtering target body.

Z) The method of B wherein the CIP compressed body is subjected to sintering and has a density of ≥90%.

AA) A method of forming a sputtering target assembly comprising combining one or more of the sputtering target body(ies) formed in the manner set forth in A to Z with a backing support.

BB) The method of AA wherein the backing support is a tubular body with an outside diameter OD that is joined with the inside diameter ID of the one or more sputtering target body(ies).

CC) The method of BB wherein the OD of the tubular body and ID of the one or more sputtering target body(ies) define(s) a circumferential gap, and the tubular body and sputtering target body(ies) are joined by supplying a bonding material within the circumferential gap.

DD) The method of CC wherein there is a plurality of sputtering target bodies, each formed in a common CIP process, and wherein each is joined to the tubular body.

EE) The method of DD wherein each sputtering target body joined to the tubular body comprises $LiCoO_2$.

FF) The method of AA wherein the method of combining comprises supplying heat with one or more induction heaters.

GG) The method of FF further comprising positioning a conductive wrap about one or more of the sputtering target bodies so as to be positioned to receive energy generated by at least one of the one or more induction heaters.

HH) A method of forming an $LiMO_2$ sputtering target body that includes the following:
j) forming or sourcing an $LiMO_2$ powder material;
k) dispersing and wet milling of the powder into an aqueous slip;
l) introducing binders to the slip;
m) drying (e.g., spray drying) of the slip with binder included to form a granulate;
n) loading of granulate in a mold;
o) Cold Isostatic Pressing (CIP) of the granulate within the mold to form a molded shape;
p) removal of the CIP densified molded shape from the mold;
q) debinding and sintering the CIP densified molded shape.

II) The method of HH further comprising machining of the molded shape to a desired configuration of the sputtering target body.

JJ) The method of HH wherein the $LiMO_2$ powder material includes $LiCoO_2$ powder material.

KK) The method of HH wherein the CIP molding is carried out in a pressure range of 3000 to 4000 bar.

LL) The method of HH wherein the debinded and sintered densified molded shape has a density value of ≥90%.

MM) The method of LL wherein the debinded and sintered densified molded shape has a resistivity of ≤5 kΩ-cm.

NN) A method of forming a sputtering target assembly comprising joining the sputtering target body formed in HH with a backing support.

OO) The method of NN wherein the backing support is a tubular body with an outside diameter OD that is joined with the inside diameter ID of the sputtering target body.

PP) The method of OO wherein the OD of the tubular body and ID of sputtering target body define a circumferential gap, and the tubular body and sputtering target body are joined by supplying a bonding material within the circumferential gap.

QQ) The method of PP wherein there are a plurality of sputtering target bodies each formed by CIP densification process, and wherein each sputtering target body is joined to the tubular body.

RR) The method of QQ wherein each sputtering target body joined to the tubular body comprises $LiCoO_2$.
SS) The method of NN wherein the method of joining comprises supplying heat with one or more induction heaters.
TT) The method of SS further comprising positioning a conductive wrap about one or more of the sputtering target bodies so as to be positioned to receive energy generated by at least one of the one or more induction heaters.
UU) A sputtering target, comprising: a hollow cylindrical target body comprising $LiMO_2$.
VV) The sputtering target of UU wherein the target body of $LiMO_2$ comprises $LiCoO_2$.
WW) The sputtering target of UU wherein the axial length of the target body is at least 100 mm.
XX) The sputtering target of UU wherein the target body has a mean grain diameter of 5 to 40 microns and has a relative density range of ≥90%.
YY) The sputtering target of XX wherein the mean grain diameter is 5 to 20 microns.
ZZ) The sputtering target of UU wherein the sputtering target body has a bi-modal grain distribution with each peak under 40 microns.
AAA) The sputtering target of XX wherein the $LiMO_2$ comprises $LiCoO_2$.
BBB) The sputtering target of UU wherein the target body has a bi-modal grain distribution with each peak mean diameter peak under 20 microns.
CCC) The sputtering target of BBB wherein the target body is of $LiCoO_2$.
DDD) A sputtering target assembly comprising one or more of the sputtering target body(ies) of UU to CCC and a backing support that supports the target body(ies).
EEE) The sputtering target assembly of DDD further comprising an attachment device (e.g., solder, felt, elastomer, adhesive, and other attachment means) that attaches the one or more of the sputtering target body(ies) with the backing support.
FFF) The sputtering target assembly of DDD wherein each of the one or more sputtering target body(ies) has a hollow cylindrical shape, and the backing support is a tubular body with an outside diameter OD that is joined with the inside diameter ID of the one or more sputtering target body(ies).
GGG) The sputtering target assembly of FFF wherein the OD of the tubular body and ID of one or more sputtering target body(ies) define a circumferential gap, and the attachment device comprises bonding material positioned within the circumferential gap.
HHH) The sputtering target assembly of FFF wherein there is a plurality of sputtering target bodies and wherein each sputtering target body is joined to the tubular body.
III) The sputtering target assembly of HHH wherein each sputtering target body joined to the tubular body comprises $LiCoO_2$.
JJJ) The sputtering target assembly of FFF further comprising one or more conductive wraps positioned about the one or more of the sputtering target body(ies).

In the above described illustrative inventive embodiments, the reference back from one lettered example to an earlier lettered example can be varied and expanded upon. For example, the reference of example "U" to "A" can be expanded upon to be each of "A" to "T" rather than just "A", with each other possible consistent combination being a feature of the present invention relative to the examples "A" to "JJJ" provided above.

Embodiments of the Invention

Viewed from a first aspect, the invention can further provide the following product embodiments:

Embodiment 1

A lithium-containing transition metal oxide-based cylindrical hollow target body that is adapted for use in a sputtering target assembly, said cylindrical hollow target body being destined to be bonded (and therefore suitable for bonding) on a backing tube so as to form said sputtering target assembly, said cylindrical hollow target body having a relative density value superior or equal to 90.0%, preferably superior or equal to 91.0% and inferior or equal to 99.8%, and wherein said lithium-containing transition metal oxide consists of—or has a microstructure that contains a bimodal grain size distribution.

By achieving a lithium-containing transition metal oxide-based cylindrical hollow target body having a (high) relative density≥90.0%, the void space in the body is minimized so that, during use (during sputtering), the cylindrical target body according to the present invention present an improved resistance and mechanical strength (compared to cylindrical target body having a relative density that is lower than 90%) on its outer surface so as to prevent the emission of particles from the target body surface which are re-condensed on the outer surface of the target, inducing the formation of nodules at the sputtering target surface which is known to be detrimental as it affects the electrical property of the sputtering target surface. This effect/consequence can compromise the operating mechanism governing the sputtering process itself. Furthermore, void spaces are irremediably at the origin of local inhomogeneity of the material distribution in the target, as void spaces are locally distributed in the material, inducing inhomogeneity of the coating properties [as a result of sputtering a target having void spaces]. In that sense, achieving a high relative density such as the values claimed in the present invention allows to significantly reduce the void space so as to obtain a material with suitable mechanical and composition properties allowing its use, preferably in an optimal way, as a sputtering target.

Embodiment 2

The lithium-containing transition metal oxide-based cylindrical hollow target body has a resistance value< or = to 5 kΩ cm, preferably < or = to 3 kΩ cm, more preferably < or = to 2 kΩ cm.

A high resistivity (i.e. a resistivity superior to 5 kΩ cm) of the target body is linked to the formation of local arcing phenomena. Arcing phenomena are at the origin of an increasing amount of fine dusts (resulting from the fine breakage of the outer surface of the sputtering body), which will have a detrimental impact on the homogeneity of the coating properties of the substrate resulting from the sputtering.

So in order to keep a stable plasma coating process during the sputtering as to guarantee the homogeneous coating properties, low resistivity (i.e. <1=5 kΩ cm, preferably <1=3 kΩ cm, more preferably <1=2 kΩ cm) are desired.

The low resistivity is directly related to the high density since a high density is related to less voids which are electrical insulators.

Embodiment 3

The lithium-containing transition metal oxide of the hollow cylindrical target body has a mean grain diameter superior or equal to 1 μm, preferably 5 μm, and inferior or equal to 46 μm, more preferably 45 μm, most preferably 40 μm.

Embodiment 4

The lithium-containing transition metal oxide of the hollow cylindrical target body has a mean grain diameter superior or equal to 5 μm and inferior or equal to 20 μm.

Embodiment 5

The lithium-containing transition metal oxide of the hollow cylindrical target body has a bi-modal grain size distribution for which each mode (or peak) is centered at a mean diameter value inferior or equal to 50 μm, preferably 46 μm, more preferably 40 μm, even more preferably inferior or equal to 30 μm, optionally inferior or equal to 20 μm.

Embodiment 6

The lithium-containing transition metal oxide-based cylindrical hollow target body has a bi-modal grain size distribution for which each mode (or peak) is centered at a mean diameter value superior or equal to 1 μm, preferably 5 μm, and inferior or equal to 20 μm, preferably inferior to 20 μm.

Embodiment 7

The lithium-containing transition metal oxide of the hollow cylindrical target body has a general formula: $LiMO_2$ or $LiMM'O_2$, wherein M is a transition metal selected from the group consisting of: Ni, Co, Mn, Ti, Al, V, Cr, Y, Sr, Ca, Zr, Zn, Si, Mg, Ga, W, Fe, Cu, La, or at least one combination thereof, and M' is a dopant selected from the group consisting of: Ti, Al, V, Cr, Y, Sr, Ca, Zr, Zn, Si, Mg, Ga, W, Fe, Cu, La, or at least one combination thereof.

Embodiment 8

The $LiMO_2$ or $LiMM'O_2$ lithium-containing transition metal oxide of the hollow cylindrical target body has a Li/M or Li/(M+M') atomic ratio superior or equal to 0.90 and inferior or equal to 1.25, preferably superior or equal to 0.98 and inferior or equal to 1.05.

Embodiment 9

The $LiMM'O_2$ lithium-containing transition metal oxide of the hollow cylindrical target body has a M'/M atomic ratio superior or equal to 0.001 and inferior or equal to 0.05.

Embodiment 10

The $LiMO_2$ lithium-containing transition metal oxide of the hollow cylindrical target body has a general formula: $LiCoO_2$.

Embodiment 11

The lithium-containing transition metal oxide of the hollow cylindrical target body has a Li/Co ratio is equal to 1.00+/−0.01, preferably, the ratio is equal to 1.00+/−0.50, more preferably, the ratio is superior or equal to 0.60+/−0.01 and inferior or equal to 0.80+/−0.01.

Embodiment 12

The lithium-containing transition metal oxide-based hollow cylindrical target body has an outer surface and/or an inner surface roughness superior or equal to 0.2 μm and inferior or equal to 3.0 μm.

Embodiment 13

The lithium-containing transition metal oxide-based hollow cylindrical target body has an outer surface and/or an inner surface roughness equal to 2.5+/−0.25 μm.

Embodiment 14

The lithium-containing transition metal oxide-based hollow cylindrical target body has an axial length range superior or equal to 100 mm and inferior or equal to 1000 mm, preferably superior or equal to 150 mm and inferior or equal to 500 mm.

Embodiment 15

The lithium-containing transition metal oxide-based hollow cylindrical target body has an outer diameter superior or equal to 75 mm and inferior or equal to 175 mm, and an inner diameter superior or equal to 50 mm and inferior or equal to 160 mm.

Embodiment 16

The lithium-containing transition metal oxide-based hollow cylindrical target body has a contaminate percentage of less than 1500 ppm, preferably less than 1000 ppm, more preferably less than 100 ppm.

In the framework of the particular embodiment 16, lithium-containing transition metal oxide-based hollow cylindrical target body has a purity of at least 99.995% by weight, preferably 99.99% by weight, more preferably 99.9% by weight.

Viewed from a second aspect, the invention can provide the following method embodiments:

Embodiment 17

A process for manufacturing a lithium-containing transition metal oxide-based cylindrical hollow target body, comprising the following steps:
providing a lithium-containing transition metal oxide material, preferably a lithium-containing transition metal oxide powder;
providing an aqueous solution;
contacting said lithium-containing transition metal oxide material or said lithium-containing transition metal oxide powder, and said aqueous solution under agitation so to form a slurry wherein said lithium-containing transition metal oxide material or said lithium-containing transition metal oxide powder is dispersed, preferably in a homogenous way, in said aqueous solution;
wet-milling said slurry, preferably so to form a homogenous slurry made of said powder/material and said aqueous solution;
adding under agitation at least one binder in said slurry resulting in a homogenous slurry comprising said at least one binder;

spray-drying said slurry comprising said at least one binder so to form a lithium-containing transition metal oxide-based granulate; and molding said lithium-containing transition metal oxide-based granulate in a hollow cylindrical-shaped mold under cold isostatic pressure (CIP) conditions so to form a molded body;

heating said molded body so as to remove said at least one binder and to preferably obtain a binder-free molded body (this step is also called debinding step in the present patent application); and sintering, after said heating step, said molded body so to obtain the lithium-containing transition metal oxide cylindrical hollow target body consisting in a lithium transition metal oxide microstructure that contains or consists of a bimodal grain size distribution.

Optionally, in the process of embodiment 17, the lithium-containing transition metal oxide material is provided under a powder form having median particle size of less than 40 µm.

Embodiment 18

The process comprises a first step of machining said cylindrical hollow body so to shape it in an axial length range superior or equal to 100 mm and inferior or equal to 1000 mm, in an outer diameter superior or equal to 75 mm and inferior or equal to 175 mm, and an inner diameter superior or equal to 50 mm and inferior or equal to 160 mm.

Embodiment 19

The process comprises a second step of machining said cylindrical hollow body so to shape it in an outer surface and/or an inner surface roughness superior or equal to 0.2 µm and inferior or equal to 3.0 µm.

Embodiment 20

The first and second step of machining of the sintered body can be done simultaneously or consecutively.

Embodiment 21

The step of molding said lithium-containing transition metal oxide-based granulate is done under CIP with a pressure range between 2000 to 4000 bars, and more preferably between 3000 and 4000 bar.

Embodiment 22

The step of molding is performed at a temperature ranging between 20° C. and 30° C.

Embodiment 23

The step of wet-milling is performed so to obtain a lithium-containing transition metal oxide-based granulate comprising at least 50%, preferably at least 70% of the total number of granulates with a size between 40 µm and 120 µm.

Embodiment 24

The step of heating so as to remove said at least one binder is performed, preferably continuously, at a first temperature superior or equal to 150° C. and inferior or equal to 600° C., and wherein the sintering step is performed, preferably continuously, at a second temperature that is superior to the first temperature and inferior or equal to 1100° C., more preferably inferior or equal to 1050° C., said second temperature of sintering being preferably superior to 600° C. More preferably, the heating step and the sintering steps are preformed continuously and consecutively, involving a continuous transition between the heating and sintering steps, in such a way there is no interruption and decrease of the temperature that occur during the smooth transition from the heating step to the sintering step.

Embodiment 25

The step of heating the molded body is performed, preferably continuously, during a first period P1 superior or equal to 10 hours and inferior or equal to 25 hours, preferably superior or equal to 12 hours and inferior or equal to 25 hours.

Preferably, the step of heating is performed by sequences, and comprises:

a) a first step of heating, preferably continuously, the molded body from a first ambient stage-temperature ST1 or $T_{amb}$. (said first ambient temperature being included in a range between 20° C. to 30° C.) to a second stage-temperature ST2, with 150° C. ≤ ST2≤300° C., preferably ST2=250° C., said first step of heating being preferably applied during a second period P2 superior or equal to 3 hours and inferior or equal to 5 hours, preferably equal to 3.75 hours;

b) a second step of heating, preferably continuously, the molded body at the second stage-temperature ST2, during a third period P3 superior or equal to 2 hours and inferior or equal to 5 hours, said P3 being preferably equal to 3 hours;

c) a third step of heating, preferably continuously, the molded body from a third stage-temperature ST3 equal to the second stage-temperature ST2, so that ST3=ST2, to a fourth stage-temperature ST4, with ST4>ST3 and with 400° C.≤ST4≤600° C., preferably ST4=500° C., during a fourth period P4 superior or equal to 5 hours and inferior or equal to 10 hours, said P4 being preferably equal to 8 hours, said P4 being more preferably equal to 9 hours, said P4 being most preferably comprised in a range defined between 8 and 9 hours; and d) a fourth step of keeping heating, preferably continuously, the molded body at the fourth stage-temperature ST4, during a fifth period P5 superior or equal to 2 hours and inferior or equal to 5 hours, said P5 being preferably equal to 3 hours so as to obtain a (heated) molded body wherein the at least one binder has been removed;

Embodiment 26

The process according the embodiment 25, wherein steps a), c) and d) are optional.

Embodiment 27

The step of sintering the molded body is performed, preferably continuously, during a sixth period P6 superior or equal to 20 hours and inferior or equal to 31 hours.

Preferably, the step of sintering is performed by sequences, and comprises:

a) a first step of sintering, preferably continuously, the molded body from the fourth stage-temperature ST4 to a fifth stage-temperature ST5, with ST5>ST4 and with preferably 600° C.≤ST5≤800° C., preferably ST5=750° C., said first step of sintering being preferably applied during a seventh period P7 superior or equal to 1 hours and inferior or equal to 3 hours, P7 being preferably equal to 2 hours;
b) a second step of sintering, preferably continuously, the molded body from the fifth stage-temperature ST5 to a sixth stage-temperature ST6, with ST6>ST5 and with 900° C.≤ST6≤1100° C., preferably from 1000° C.≤ST6≤1100° C., more preferably ST6=1025° C., said first step of sintering being preferably applied during an eight period P8 superior or equal to 8 hours and inferior or equal to 10 hours, P8 being preferably equal to 9 hours;
c) a third step of sintering, preferably continuously, the molded body at the sixth stage-temperature ST6, during an eight period P8 superior or equal to 10 hours and inferior or equal to 16 hours, P8 being preferably equal to 15 hours, so to obtain a sintered molded body;
d) a fourth step of heating, preferably continuously, the molded body from the sixth stage-temperature ST6 to a seventh stage-temperature ST7, with ST7<ST6 and with 500° C.≤ST7≤700° C., preferably ST7=600° C., during a ninth period P9 superior or equal to 1 hours and inferior or equal to 2 hours, P9 being preferably equal to 1.5 hours, P9 being more preferably equal to 1.75 hours; and
Optionally, step d) of embodiment 27 is followed by a step e) of cooling, taking place after the fourth step of sintering, the step of cooling, preferably performed continuously, of the molded body (or sintered molded body) is done from the seventh stage-temperature ST7 or from the sixth stage-temperature ST6 to an eighth stage-temperature, with $ST8=T_{amb}$ ($T_{amb}$ being the ambient temperature comprise in a range defined between 20° C. and 30° C., preferably equal to 25° C.).

In particular, said step e) of cooling said sintered molded body is performed during a tenth period P10 of between 2 hours and 3 hours, preferably of 2.5 hours.

In the embodiment 27, steps a), b), d), and e) are optional.

Embodiment 28

The wet-milling step is performed so to provide suspending particles powder having a median particle size superior or equal to 0.15 μm and inferior or equal to 2.0 μm, preferably superior or equal to 0.15 μm and inferior or equal to 1.0 μm, even more preferably superior or equal to 0.15 μm and inferior or equal to 0.8 μm, most preferably, the mean particle size is equal to 0.5 μm+/−0.3 μm.

Embodiment 29

The wet-milling step is performed so to provide suspending particles powder having a bi-modal particle size distribution wherein a first mode (or peak) is centered at a first particle size value comprised between 0.1 μm and 0.3 μm, preferably 0.15 to 0.25 μm, and wherein a second mode (or peak) is centered at a second particle size value comprised between 1.0 μm and 7.0 μm.

Embodiment 30

The wet-milling step is performed so to obtain a slurry that has a viscosity superior or equal to 30 cP and inferior or equal to 120 cP, preferably superior or equal to 30 cP and inferior or equal to 100 cP.

Embodiment 31

The step of adding of at least one binder step is performed so to obtain a slurry that has a viscosity superior or equal to 25 cP and inferior or equal to 125 cP, preferably superior or equal to 30 cP and inferior or equal to 100 cP.

Embodiment 32

The at least one binder is added to said slurry in a quantity represented by 0.25 wt % to 3.0 wt % of the lithium-containing transition metal oxide material or of the lithium-containing transition metal oxide powder.

Embodiment 33

The step of sintering results in a lithium-containing transition metal oxide that has a mean grain diameter superior or equal to 5 μm and inferior or equal to 40 μm. Alternatively, the lithium-containing transition metal oxide of the hollow cylindrical target body has a mean grain diameter superior or equal to 5 μm and inferior or equal to 46 μm, more preferably 45 μm, mots preferably 40 μm.

Embodiment 34

The step of sintering results in a lithium-containing transition metal oxide that has a mean grain diameter superior or equal to 5 μm and inferior or equal to 20 μm.

Embodiment 35

The step of sintering results in a lithium-containing transition metal oxide presenting a bi-modal grain size distribution wherein each mode (or peak) of said bi-modal grain size distribution is centered at a mean diameter value inferior or equal to 50 μm, preferably 40 μm, more preferably inferior or equal to 30 μm, most preferably inferior or equal to 20 μm.

Preferably, the lithium-containing transition metal oxide of the hollow cylindrical target body has a bi-modal grain size distribution for which each mode (or peak) is centered at a mean diameter value inferior to 50 μm, preferably 46 μm.

Embodiment 36

The step of sintering results in a lithium-containing transition metal oxide presenting a bi-modal grain size distribution wherein each mode (or peak) of said bi-modal grain size distribution is centered at a mean diameter value superior or equal to 5 μm and inferior or equal to 20 μm, preferably inferior to 20 μm.

Embodiment 37

The process comprises a step of providing a lithium-containing transition metal oxide powder having a general formula: $LiMO_2$ or $LiMM'O_2$, wherein M is a transition metal selected from the group consisting of: Ni, Co, Mn, Ti, Al, V, Cr, Y, Sr, Ca, Zr, Zn, Si, Mg, Ga, W, Fe, Cu, La, or at least one combination thereof, and M' is a dopant selected from the group consisting of: Ti, Al, V, Cr, Y, Sr, Ca, Zr, Zn, Si, Mg, Ga, W, Fe, Cu, La, or at least one combination thereof.

Embodiment 38

The process comprises a step of providing a lithium-containing transition metal oxide powder having a Li/M or Li/(M+M') atomic ratio superior or equal to 0.90 and inferior or equal to 1.25, preferably superior or equal to 0.98 and inferior or equal to 1.05.

Embodiment 39

The process comprises a step of providing a lithium-containing transition metal oxide powder having a M'/M atomic ratio superior or equal to 0.001 and inferior or equal to 0.05.

Embodiment 40

The process comprises a step of providing a lithium-containing transition metal oxide powder having as a general formula: $LiCoO_2$.

Embodiment 41

The process comprises a step of providing a lithium-containing transition metal oxide powder having as a general formula: $LiCoO_2$ and wherein the Li/Co ratio is equal to 1.0+/−0.01, preferably, the ratio is equal to 1.0+/−0.50, more preferably, the ratio is superior or equal to 0.60+/−0.01 and inferior or equal to 0.80+/−0.01.

Embodiment 42

The process is suitable for manufacturing a lithium-containing transition metal oxide-based cylindrical hollow target body having a relative density value≥90.0%, preferably between 91.0% and 99.8%.

Embodiment 43

The process is suitable for manufacturing a lithium-containing transition metal oxide-based cylindrical hollow target body having a resistance value inferior or equal to 5 kΩ cm, preferably inferior or equal to 3 kΩ cm, more preferably inferior or equal to 2 kΩ cm.

Embodiment 44

The process is suitable for manufacturing the lithium-containing transition metal oxide-based cylindrical hollow target body according to any of the embodiments 1 to 17.

Viewed from a third aspect, the invention can provide the following use embodiment:

Embodiment 45

Use of the lithium-containing transition metal oxide-based cylindrical hollow target body according to any of the embodiments 1 to 17 in a sputtering target assembly. The sputtering target assembly comprising:
 the cylindrical hollow target body according to any of the embodiments 1 to 17; and
 a backing tube on which said cylindrical hollow target is mounted.

In the framework of the present invention, the term "grain" can be interpreted as a crystallite, and the microstructure is a polycrystalline microstructure containing crystallites, the crystallites being possibly of varying size and orientation.

In such a context, the lithium-containing transition metal oxide contains a metal oxide, optionally doped with at least one dopant, containing a microstructure of grains, said grains having a bimodal size distribution.

In addition, in the context of the present invention, the term "contaminants" refers to any element or group of elements that is considered to be an unavoidable impurity. Such a contaminant is for instance, but not limited to this example, the binder remaining, at least after the heating step, or after the heating and sintering steps of the process according to the invention.

Another contaminant can be, for instance, the $Co_2O_3$ phase in the lithium-containing transition metal oxide-based powder.

An impurity or contaminant is considered, in the framework of the present invention, as an unavoidable undesirable compound or element present in a (chemical) composition or material compound.

In such a context, it can be considered that the binder comprised in the lithium-containing transition metal oxide-based hollow cylindrical target body according to the present invention is present in a percentage of less than 1500 ppm, preferably less than 1000 ppm, more preferably less than 100 ppm, based on the total weight of the lithium-containing transition metal oxide-based hollow cylindrical target body.

Moreover, in the framework of the present invention, the terms "homogenous/homogenously" refer here to the fact that the solid phase contained in the liquid phase is not present in this liquid phase under the form of settlings, sediments, or event precipitates.

Furthermore, it is to be considered in the present embodiments describe above that the following terms:
 "target segment";
 "target body";
 "target body cylinder";
 "cylindrical (or rotary) target body";
 "cylindrical (or rotary) target segment";
 "cylindrical sputtering target body or segments";
 "cylindrical hollow target body"; and similar expressions, are considered as synonyms in the context of the present invention, in the summary and description of the invention, including the examples.

It is understood that the present invention is by no means limited to the forms of the above embodiments and that many modifications can be made without departing from the scope of the appended claims.

BRIEF DESCRIPTION OF THE DRAWINGS

FIGS. 2A and 2B illustrate SEM micrographs of a post sintered ceramic molded body produced in accordance with the present invention.

FIG. 3 illustrates post-milling particle size distribution graphing of multiple $LiMO_2$ source examples referenced in TABLE B (y/vertical axis: Relative Weight; x/horizontal axis: Particle diameter (μm).

FIG. 4 illustrates a powder X-ray diffractogram of Cellcore® D5 ceramic powder representing an example of a sourced $LiMO_2$ ceramic powder material (y/vertical axis: Intensity (Counts); x/horizontal axis: 2 Theta)(°).

FIG. 5A illustrates an original image of a CIP densified and sintered target body section based on Cellcore® D5 source or precursor ceramic powder.

FIG. 5B illustrates a processed image of the CIP densified and sintered target body section shown in FIG. 5A.

FIG. 5C shows a grain size distribution derived from the processed image in FIG. 5B. In FIG. 5C y/vertical axis is Equivalent Circle Diameter (μm) and x/horizontal axis is Area ($10^{-3}$ μm$^2$)

FIG. 5D illustrates an original image of another section of the CIP densified and sintered target body based on Cellcore® D5 source or precursor ceramic powder.

FIG. 5E shows another grain size distribution derived from the processed image of FIG. 5D. In FIG. 5E x/horizontal axis is Equivalent Circle Diameter (μm) and y/vertical axis is Area ($10^{-3}$ μm$^2$)

FIG. 5F depicts the grain size distribution derived from data in FIG. 5E. In FIG. 5F x/horizontal axis is Equivalent Circle Diameter (μm) and y/vertical axis is Area ($10^{-3}$ μm$^2$)

DETAILED DESCRIPTION

Figure 1:
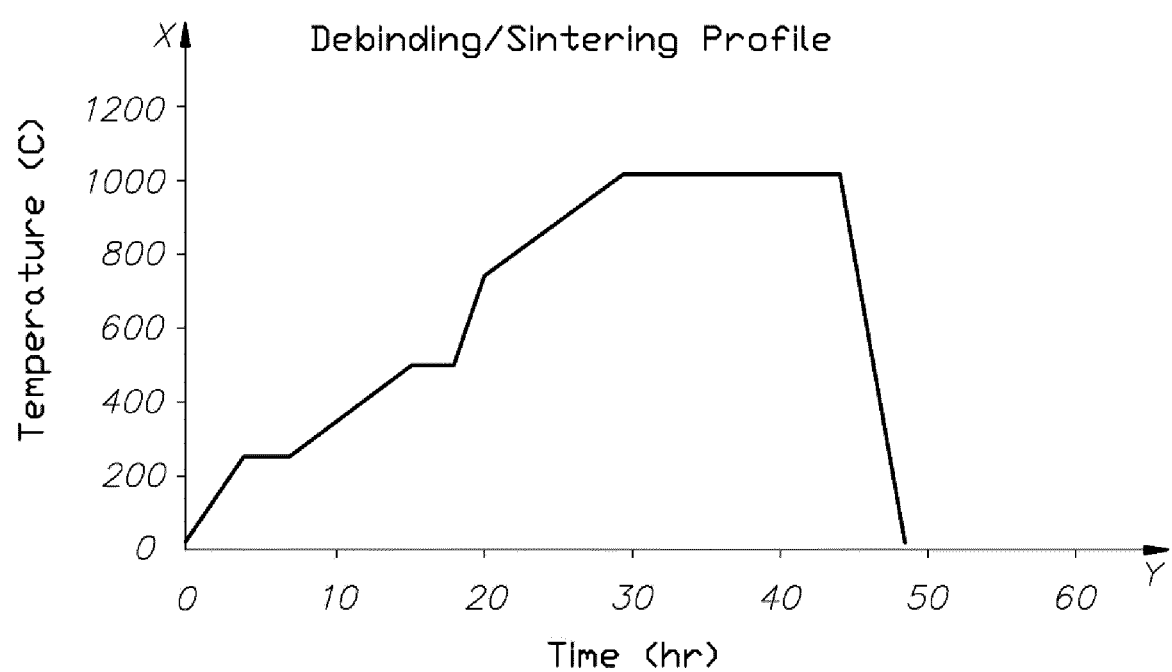
FIG. 1 is a temperature vs. time profile graph for the multi-stage debinding and sintering of a molded green ceramic piece for use as a target body (y/vertical axis: Temperature (° C.); x/horizontal axis: Time (hours).

An embodiment of the present invention includes a CIP-based process for the densification of an LiMO$_2$ (e.g., LiCoO$_2$) ceramic sputtering target body, as in a hollow, cylindrically-shaped sintered LiMO$_2$ (e.g., LiCoO$_2$) ceramic sputtering target body.

A CIP-based process under the present invention is inclusive of a process involving
  a) Forming or sourcing an LiMO$_2$ (e.g., LiCoO$_2$) powder of suitable characteristic;
  b) Dispersion and milling (as in wet milling) of the raw powder into an aqueous slip (i.e. a slurry);
  c) Introduction of binders to the slip;
  d) Drying (e.g., spray drying) of the slip to form a granulate;
  e) Loading of the granulate in appropriately designed and dimensioned mold (as in a polymer-lined mold);
  f) Cold Isostatic Pressing (CIP) of the granulate to form a molded shape;
  g) Debinding (burn off of the organic binders) and sintering the shape (e.g., a two stage firing sequence) to form a sintered shape—while a preferred technique is to utilize a one-time common heater assembly approach for both debinding and sintering, embodiments of the invention are inclusive of debinding at one time and sintering at another time either in a common heater assembly or a second, different one; and
  h) Machining or otherwise refining the shape to a desired dimension (unless already in a suitable configuration after sintering).

a) Forming or Sourcing an LiMO$_2$ (e.g., LiCoO$_2$) Powder with Suitable Characteristic;

LiMO$_2$ powders can be prepared by a range of methods including hydrothermal growth, sol-gel, co-precipitation, and solid state reactions. The Li content is known to affect the electronic and ionic conductivity of the resultant material, which is a criteria in the performance of sputtered thin films such as the thin film featured in Li batteries, which is one of the potential applications of the associated sintered ceramic sputtering targets under the present invention. The powder can further feature a stoichiometric or non-stoichiometric relationship relative to the Li and metal(s) M featured in the ceramic material.

Under an embodiment of the present invention the process includes a step of forming an LiMO$_2$ powder having similar qualities to the below described "sourced" LiMO$_2$ ceramic powder with suitable techniques for such formation being described in U.S. Pat. Nos. 5,955,051, 8,303,855, 8,337,727, 8,608,987, and US 2012/270104.

An alternate embodiment of the present invention relative to a) includes sourcing an LiMO$_2$ material such as an LiCoO$_2$ ceramic powder material from a suitable supplier, with an embodiment of the present invention featuring the use of "Cellcore"® lithium cobalt oxide powder available from Rechargeable Battery Materials, a business unit of the present Applicant (the Umicore company). "Cellcore"® D5 has the composition: $Li_{1.00}Co_{1.00}O_{2.00}$. Optionally, the "Cellcore"® D5 can have a variant composition wherein:
Preferably, the Li/Co ratio is superior or equal to 0.50±0.01 and inferior or equal to 1.50±0.01;
More preferably, the Li/Co ratio is equal to 1.00±0.01;
In particular, the Li/Co ratio is equal to 0.60±0.01 or is equal to 0.80±0.01.

An embodiment of the present invention relative to a) includes sourcing any one or both of the following D5 and D20 lithium cobalt dioxide ceramic raw powder Cellcore® materials designated in TABLE A below, or a combination of the designated materials in TABLE A below.

TABLE A

| LiCoO2 | Particle Size Distribution (microns) | | | Tap density $(g/cm^3)$ | Surface Area $(m^2/g)$ |
|---|---|---|---|---|---|
| | D10 | D50 | D90 | | |
| D5 | 24 | 5~7 | 9~15 | >1.8 | >2.6 |
| D20 | 59 | 15~19 | 25~40 | 0.30~0.55 | 0.10~0.25 |

In TABLE A, the D10, D50 and D90 values have been obtained through a conventional method of determining particle size distribution such as the laser scattering analysis, whereas the Surface Area is measured via conventional BET techniques. The tap density values are obtained for instance via the ASTM B527 method.

X-Ray Diffraction Intensity Values:

The powder x-ray diffraction pattern of the Cellcore® D5 raw material is presented in FIG. 4. The sharp peaks are indicative of the high level of crystallinity of the material. $LiCoO_2$ obtained by processing at low temperature (LT-$LiCoO_2$) is known to adopt a cubic spinel-type structure (Fd 3̄m) which displays a single reflection at 2θ-63° corresponding with the <440> plane. Upon heating to temperatures above 400° C., $LiCoO_2$ transitions to a layered-type structure (HT-$LiCoO_2$) of rhombohedral symmetry (R3̄m). With this transformation the <440> reflection splits into a set of reflections corresponding to the <108> and <110> planes of the layered structure. These reflections are clearly evident in the D5 raw material. The absence of intensity at 20-31° which is characteristic of the <220> plane of $Co_3O_4$ is indicative of the absence of this contaminant phase in the D5 raw material. Notably, the peak intensity of the <104> plane is significantly greater than that of the <101> plane. The relative intensities of the <101> and <104> reflections are reported to be indicative of the preferential orientations of these planes. During RF sputtering, an oxygen-rich atmosphere during $LiCoO_2$ deposition and crystallization is reported to favor orientation of the oxygen-rich planes, resulting in an increase in the relative intensity of the <101> relative to the <104> reflection. The crystalline orientation of the film is reported to influence Li transfer rate, with orientation of the <110> plane being particularly beneficial.

b) Dispersion and Milling

For reasons set out below, preferred embodiments of the invention feature a wet milling process using wet milling means to mill/disperse the sourced or formed $LiMO_2$ powder. Suitable wet milling means include, for example, an internally agitated high energy media mill or batch attritor (e.g., a Union Process Model 1-S) or a continuous horizontal media mill such as that supplied by Buehler AG (e.g., a SuperTex Model FSTX 5), or similar milling means. The wet milling processing featured under the present invention has been found to provide advantages over dry milling processes utilized in the prior art in the formation of a suitable material for CIP densification and subsequent formation of a sintered target body. For example, relative to the wet mill processing of the sourced material featured in the present invention, there is improved energy dissipation (i.e., heat transfer) potential from particle and media surfaces heated by shearing and impact forces. This is facilitated by the fluid such as water because of its high heat capacity. The ability of water, in conjunction with appropriate dispersants, to efficiently stabilize charged particles and maintain their dispersion in a slurry also allows more efficient removal of fines from contact surfaces which would otherwise lead to agglomeration. These factors can lead to faster and more efficient generation of the desired particle size distribution and facilitates the appropriate set up in the resultant densified target body (e.g., achieving advantageous grain mean size, grain relationships (e.g., a bimodal set up) and grain patterning (different grain interrelationships following densification) in the resultant target body).

Under embodiments of the present invention, following obtainment of the desired (e.g., characterized) ceramic powder, the powder is subject to a dispersion and milling step preferably within an aqueous slip (i.e., a wet slurry). Embodiments include, in conjunction with formation of the desired slurry, the inclusion of additives such as dispersant(s), viscosity adjuster(s), and antifoaming agent(s) (that is, one or more of these additives—with "more" being in reference to all available sub-combinations or the full combination of the above listed additives).

An embodiment of the present invention includes an aqueous batch milling process featuring the mixing of deionized water and a dispersant and adjustment of the pH to a range 11±0.5 such as by the addition of a base material (e.g., $NH_4OH$ solution). This technique minimizes the viscosity and settling of particles out of the slurry while allowing the solids content to be maximized, which facilitates the efficiency and productivity of the subsequent spray drying step and subsequent use of that spray dried granulate in the forming a desirable resultant densified (with suitable grain arrangement) target body.

A suitable dispersant for $LiMO_2$ (e.g., $LiCoO_2$) ceramic powders is a synthetic polyelectrolyte. The weight percent of the dispersant is preferably set in a range of from 0.25 to 3%, more preferably 1.5 to 2.5%, and most preferably (for many dispersant materials) 2% relative to the $LiMO_2$ solid. For example, dispersants such as those described above are preferably supplied, for example, in the mixing tank in an amount 2 wt % relative to the $LiCoO_2$ solid.

Also in conjunction with the milling and dispersing stage of the process for the mixed $LiMO_2$ (e.g., $LiCoO_2$) ceramic particles and aqueous slurry, there is preferably provided an antifoam agent. The antifoam agent additive is used to prevent formation of foam or is added to break foam already formed. Commonly used antifoams are insoluble oils, polydimethylsiloxanes and other silicones, certain alcohols, stearates and glycols. With the composition of the $LiMO_2$ powder already established, the use of an antifoam agent that will be completely evolved upon debinding is highly desirable to maintain chemical purity. With typical antifoam agents only a few drops are required relative to the batch to attain the antifoaming effect. N-octane has been found to be particularly useful for defoaming $LiMO_2$ slurries during mixing and wet milling, and is added as needed.

The slurry is processed so as to have a desired viscosity (e.g., a range of 30 to 120 cP, and more preferably 30 to 100 cP) each achieved for example by adjusting the amount of dispersant and pH so as to obtain a sufficiently low viscosity level well suited for use in the below described spray drying stage and which facilitates providing the desired attributes in, for example, a CIP densified target body. A suitable milling time is 3 to 4 hours with equipment such as described above, and variations can be made to accommodate for example different equipment and batch size with a goal towards reaching the noted viscosity levels.

In addition, the slurry milling is a means to achieve a reduction in particle size of the sourced $LiMO_2$ raw powder, such as a reduction of a sourced $LiCoO_2$ mean particle size of 7 to 8 microns down to a reduced mean particle size of 0.15 to 1.0 µm as in 0.5+/−0.3 µm (e.g., a 10/1 to 20/1 reduction ratio (or higher ratio) of reduction is featured under the present invention). During the milling samples are collected periodically such as on the hour with a target d50 value such as the aforementioned 0.5 micron illustrative target value, as determined by a CPS Disc Centrifuge (Model DC 12000).

An embodiment of the present invention further includes milling the source $LiMO_2$ (e.g., $LiCoO_2$) ceramic powder from an original state to smaller particles which exhibit a bimodal distribution of particle size values. That is, under embodiments of the present invention (e.g., those involving a 3 to 4 hours of milling time) the milling results in a bimodal distribution of $LiMO_2$ ($LiCoO_2$). Although bimodal distributions can dissipate with longer milling times, embodiments of the invention avoid such prolonged milling times (despite the potential for a more consistent mean particle size generation in the output of the milling process).

c) Binder Addition

Preferably at a time following sufficient milling and dispersing, there is carried out a binder addition stage for use in the below described CIP-based densification. Preferably the binder addition stage comes after completion of the milling and dispersing stage with the binder added to the dispersed ceramic $LiMO_2$ powder particles in the slurry in a suitably-designed mixing tank system with conditions which avoid material segregation. For example, following suitable dispersion and milling of the raw powder, there is introduced a binder (or binders) into the aqueous slip, preferably while in a mixing tank, with the combination subject to mixing for a period of time. In a preferred embodiment, the completed mixed and dispersed slip is retained in a mixing tank whereupon the desired binder material is added and the resultant combination mixed for 2 to 16 hours yielding a homogeneous slip.

An example of the step of introducing binder(s) to the slip includes the introduction of, for example, a polyvinyl alcohol binder or an acrylate-based binder material, which is preferably introduced in a quantity represented by 0.25 to 3 wt % of the $LiMO_2$ solid content of the slip, and more preferably 2 wt %.

The molecules of each specific binder decompose or pyrolize at characteristic temperatures and rates which means that the debinding soak temperature(s) is selected in accordance with the type and amount of binder, with values such as those presented in the FIG. 1 temperature profile for debinding and sintering, being illustrative for good debinding performance (and obtainment of higher density values results) for the noted binder material.

Parameters related to milling, raw material, and binder are summarized below in TABLE B, along with associated physical characterization of the slip by mean particle size (CPS Disc Centrifuge (Model 12000)), viscosity (as measured with Anton Paar RheolabQC viscometer), pH (measured by conventional method such as pH meter), and zeta potential (as determined with Colloidal Dynamics ZetaProbe). Examples 1 to 3 feature a polyvinyl alcohol binder, while Example 4 features acrylate-based binder, each in the noted 2 wt % amount.

TABLE B

| | | Mill | | | Initial | | Final | | |
|---|---|---|---|---|---|---|---|---|---|
| Example | $LiCoO_2$ | Type | Time (min) | d50 (micron) | Viscosity cP | Binder wt % | Viscosity cP | pH | Zeta Potential |
| 1 | D5 | Buehler | 240 | 0.76 | 45 | 2% | 96 | 11.6 | −28.3 |
| 2 | D20 | Buehler | 180 | 0.69 | 50 | 2% | 50 | 13.3 | −29.6 |
| 3 | D5 | 1-S | 180 | 0.19-0.35 | 60 | 2% | 96 | 13.1 | −25.2 |
| 4 | D5 | 1-S | 180 | 0.25-0.29 | 35 | 2% | 38 | 12.9 | −29.5 |

As seen from the above TABLE B, some illustrative ranges for the various attributes includes usage of an $LiMO_2$ (e.g., $LiCoO_2$) that is generated or sourced as to have a D5 to D20 range (with the designation "D5" and "D20" being in reference to sizing with D5 being a finer particle size than D20 as seen from the source TABLE A above). In addition, as seen from TABLE B, there are utilized sub-ranges within the median particle size of 0.15 to 1.0 µm for the wet milled material, with some examples being 0.15 to 0.5 microns and 0.5 to 0.8 microns. Further, there is seen more specific examples of wet milling time ranges of 3 and 4 hours within a preferred general milling time range of 1 to 6 hours, and more preferably 2 to 5 hours.

FIG. 3 below provides an illustration of the particle size distribution following wet milling for the Examples 1 to 4 set out in TABLE B above, with each showing a bi-modal pattern featuring a first set of peaks within the range of about 0.1 to 0.3 micron (with 0.15 to 0.25 micron being preferred in some embodiments) and a second set of peaks in the 1.0 to 7.0 micron range (with a 2.0 to 5.0 micron range being preferred for some embodiments).

Further, the initial viscosity range is from 25 to 125 cP with some noted examples within that range featured in the table above. Final viscosity as when 2% wt binder amounts are utilized includes 30 to 100 cP. The final wet milling product to be sent for granulation formation as described below also preferably has a pH of 9.5 to 13.5 (with the above TABLE B showing a pH range of generally 11.5 to 13.5). Also, the Zeta potential or electrokinetic potential in a colloidal dispersion is preferably −25 to −30.

d) Granulate Formation

Upon completion of (slip-with-binder) formation, the same is formed into a granulate by drying, with a preferred technique for drying being spray drying. Presented in TABLE C below are some examples of some desirable characteristics in spray dried granulate:

TABLE C

| Granulate | Size Distribution | Angle of Repose (flowability) | Tap Density | Residual Moisture | Losses to Cyclone |
|---|---|---|---|---|---|
| LiMO$_2$ with LiCoO$_2$ being representative | 40 to 120 micron | 0.3-0.5; PTL V36.61; ISO 4324 | 1.3-2.0 g/cm$^3$; Erweka SVM-202 | <4%; OHaus MB45 Moisture Analyzer | <30% |

Embodiments of the present invention feature granulated particles for use in a CIP densification process derived from a spay dryer such as a tower type spray dryer which is well suited for the formation of desirable granulated particles utilized in the CIP densification process under the present invention. An example of a suitable tower type spray dryer for drying the resultant LiMO$_2$ slip is a GEA Production Minor spray tower available from GEA Process Engineering NS of Denmark.

Spraying is preferably carried out with a suitable pump and with a suitable spray nozzle such as a fountain spray nozzle. Suitability here also being associated with a function of the spray tower design with the goal directed at reaching similar characteristics in the resultant dried granulate as set out in the present application. For example, spraying in the GEA Production Minor spray tower is carried out at a pump rate that can achieve a throughput of 10-12 kg/hr (noting as well the desirable final viscosity range of the originally introduced slurry to be subjected to spray drying granulation as per the table above), with the latter rate available with a fountain style spray nozzle and a pump rate of 25 rpm (e.g., a Watson Marlow 520U Pump). Inlet and outlet temperatures of the spay preferably are maintained in a range of 215 to 235° C. and 115 to 125° C., respectively, and more preferably are controlled to achieve 225° C. inlet and 120° C. outlet. These conditions help minimize losses to the cyclone to a level less than 30% which is preferred under the present invention, particularly relative to providing the desired material for the below described CIP-densification processing. These spraying conditions, in conjunction with the preferred binders, help minimize losses attributable to adhesion to the internals of the spray tower as well.

Granulate generated under preferred spray drying techniques results in granulate with a particle size (d50) within a range of 40 to 120 microns, more preferably in a range of 60-100 micron, as determined by conventional sieve analysis.

According sieve analysis, at least 50% of the granulate particles have a size of between of 40 to 120 microns, more preferably in a range of 60-100 micron.

Also, residual moisture levels are preferably maintained below 4% and more preferably below 2%, as determined using an OHaus MB45 Moisture Analyzer.

The time of spray-drying is adapted easily by the skilled person so to achieve the desired result.

e) Molding of Target—Cold Isostatic Pressing (CIP)

Following the formation of the granulate, the main granulate fraction and fines are combined and blended using traditional techniques before being loaded into suitable CIP particle containers such as rubber bags conforming to the cylindrical shaped CIP mold equipped with centrally-positioned cylindrical core (e.g., a cylindrical aluminum core, optionally with or without surface treatment such as fine polishing or other non-stick coating) with suitable top and bottom retainers (e.g., polyurethane top and bottom retainers), and preferably with a polymer cap with associated clamping devices or other means for providing a water-tight seal. Thus, under an embodiment of the present invention LiMO$_2$ (e.g., LiCoO$_2$) granulate produced via the granulation formation technique described above is molded in a Cold Isostatic Pressing (CIP) using the aforementioned cylinder target body forming CIP mold. The CIP densification process of the noted supplied granulate includes an isostatic pressing performed at a predetermined molding pressure (after the granulated powder is filled into the above described mold and the mold is sealed). The molding pressure is preferably set to be at least 2000 Bar. In a preferred embodiment the CIP molding pressure is set to be within 5% of 4,000 bar (1 Bar=1.02 Kilogram-force/Square Centimeter (kg/cm$^2$ so 5% of 4080 kg/cm$^2$)) or more generally within 3,000 to 4,500 Bar (as in 3,500 to 4,000 Bar), and still more generally a pressure range of 2000 to 4200 bar is suited for LiMO$_2$ (e.g., LiCoO$_2$) CIP densification under the present invention. In conformance with the referenced "cold" in CIP, the temperature is preferably room temperature (e.g., an indoor temperature generally around 20 or 22° C. (68 to 72° F.)).

The aforementioned CIP cylinder body generating mold, which is suited for the formation of a densified LiMO$_2$ (e.g., LiCoO$_2$) cylindrical target, is one example of a CIP mold design featured under the present invention. For instance, other CIP mold designs can be utilized in a target body densification process featured under the present invention. For example, the resultant dried LiMO$_2$ (e.g., LiCoO$_2$) based granulate, formed in the above described wet milled (ceramic and binder combination) slurry is also a source for forming other CIP densified target bodies such as planar elongated rectangular sheet, or planar disc shaped target bodies.

Following CIP molding, the molded cylindrical green body of LiMO$_2$ (e.g., LiCoO$_2$) is removed from the bag, and the core extracted from the cylindrical green body. Under the present invention green body machining of the like can be featured or excluded depending on whether or not the added step of green machining is considered sufficiently warranted in the effort to seek the desired net-shape following heating (e.g., debinding and sintering) and, if utilized, any sintered body machining.

That is, for some intended uses, the green body samples, can be green machined on a lathe to true up the outer peripheral surface dimensions and square the end faces. This treatment may enhance the homogeneity of the resultant material after sintering, and minimize subsequent machining time and cost. In the absence of green machining, sharp edges and burrs are preferably carefully removed with a blade tool to minimize stress tensors which might induce cracks during sintering.

Once a desirable green body state is achieved, the green body is then subjected to a heating stage process as described below.

The time of CIP-molding is adapted easily by the skilled person so to achieve the desired result.

f) Heating Process [Debinding (Burn Off of the Organic Binders) and Sintering Performed in Multi-Step Sequence]

Under an embodiment of the present invention there is carried out a continuous heating sequence preferably involving multiple levels (stepped sequence involving step ups and constant periods during the heating sequence). An example of a heating stage involving a continuous heating sequence with multiple levels is presented in the TABLE D below and illustrated in the profile in FIG. 1. This heating sequence provides for not only a debinding of the "green" product produced under the CIP process, but also a sintering into a densified "sintered" body.

As an example of a suitable heating process sequence, the green bodies are placed in a sintering furnace equipped with a blower and damper. Debinding and sintering are preferably carried out in a single cycle under air at atmospheric pressure in a suitable furnace (e.g., a Rhode furnace KE 480 SH), with the blower on and damper open only during the debinding stage (T≤500° C.) and final cool down (T≤600° C.). An illustrative example of a suitable temperature profile (48.5 hr duration) for the entire firing process of, for example, an $LiMO_2$ ceramic of $LiCoO_2$ having a hollow cylindrical target body configuration is shown in FIG. 1 and exemplified in TABLE D below.

In Table D, steps A to D correspond to the debinding step; steps E to H to the sintering steps; and step I to the cooling step.

TABLE D

|   | Initial T | Final T | Ramp Rate or Soak Duration | Damper | Blower |
|---|---|---|---|---|---|
| A | 25 | 250 | 60° C./hr | on | on |
| B | 250 | 250 | 3 hr | on | on |
| C | 250 | 500 | 30° C./hr | on | on |
| D | 500 | 500 | 3 hr | on | on |
| E | 500 | 750 | 120° C./hr | off | off |
| F | 750 | 1025 | 30° C./hr | off | off |
| G | 1025 | 1025 | 15 hr | off | off |
| H | 1025 | 600 | 240° C./hr | off | off |
| I | 600 | 25 | 240° C./hr | on | on |

During the sintering process the green products resulting from the CIP process are heated in the above described manner with embodiments including the standard placement of the green body on a suitable material (e.g., alumina) setter during heat treatment (e.g., an alumina setter covered with alumina powder) to avoid sintering generated excessive deviations in the fired target (e.g., avoid excessive "elephant foot" formation in a hollow cylinder target).

g) Machining or Otherwise Refining (Such as Grinding) the Sintered Shape to a Desired Dimension and Roughness (Unless Already in a Suitable Configuration after Sintering).

Also embodiments of the present invention include further processing as in machining to a desired final configuration (for instance, in terms of dimensions and roughness), if needed, (e.g., see the disclosure of U.S. Pat. No. 6,787,011 describing the usage of a carbon felt intermediary as a cylindrical target attachment means upon compression between the outer surface of the support and the inner surface of the cylindrical target which avoids interior target surface machining). In preferred embodiments, however, the attachment (e.g., bonding) is carried out using alternative techniques such as described in further detail below. If machining is carried out on the fired ceramic target body to achieve a desired final dimension on the exposed surface(s) and/or the surfaces of the target body subject to being bound, such machining can be carried out using standard machining techniques such as that carried out on standard grinder and lathe machining equipment to the desired dimension(s).

Resultant Sputtering Target (Sintered, Ceramic Target Bodies Produced Under the Present CIP Method)

Through use of, for instance, the wet milling, granulating and CIP based densification and sintering process under the present invention advantageous target bodies, particularly those that are based on $LiMO_2$ (e.g., $LiCoO_2$) ceramic material, can be produced, and are suited for use in the formation of target sputtering assemblies that comprise a single target body produced under the present invention or multiple target bodies preferably on a common support backing. For example, the CIP densified and sintered products of the present invention can be formed as a cylindrical sputtering target for use in a rotary sputtering target assembly. In the present invention reference is made in some instances to "target" interchangeably with "target body" on the basis that a target body is representative of a target for use in sputtering—with some target embodiments being comprised of a single or a monolithic target body and others (particularly those designed for longer axial length sputtering target assemblies) being formed of a plurality of target bodies used together to provide a desired sputtering target. A sputtering target can thus be represented by a plurality of target bodies arranged on a backing support arrangement such as a common backing tube or plate or a single, monolithic target body on a support member.

As seen from the above, the reference to $LiMO_2$ is inclusive of M being singular or of a multiple metal constitution as in (Li-Me1-O) or (Li-Me1-Me2-O), etc., (with M preferably being, as noted above, a metal (or metals) selected from the group consisting of Ni, Co, Mn, Ti, Al, V, Cr, Y, Sr, Ca, Zr, Zn, Si, Mg, Ga, W, Fe, Cu, La, or combinations thereof). Further, the reference to $LiMO_2$ relative to the sintered target body is intended to designate a variety of lithium metal oxide materials inclusive of those having stoichiometries that may deviate (typically slightly) from the theoretical. For example, the present invention includes target bodies of $LiMO_2$ materials such as those having an Li/metal(s) atomic ratios of 0.90 to 1.25 (e.g., 0.98 to 1.05). As a further example, a lithium cobalt oxide target body with Mg as a doping element is featured, and which has an Mg to Co atomic ratio between 0.001 to 0.05. In this case, it is the atomic ratio of Li to the sum of Co and Mg (instead of two Co alone) that is between, for instance, 0.98 to about 1.05. The above noted Li-transition metal composite target bodies (e.g., $LiCoO_2$) are varied in Li/M(s) (e.g., Li/Co) atomic ratio composition to suit the thin film attributes of the desired final product, as in a thin film solid lithium based battery. That is, the target body composition following CIP compression and sintering is designed to satisfy the above noted criteria of supplying to the substrate the composition intended in the final product while taking into consideration the attributes of the sputtering apparatus in which the sputtering target is being utilized (e.g., sputtering under Argon, or in an Argon/oxygen mixture, etc.). This tuning of the Li-transition metal composite Li/metal(s) atomic ratio thus can entail, in some situations, a deviation from the theoretical stoichiometric to achieve an enhanced thin film result. It is further noted that the Li/Co ratio for the referenced $LiCoO_2$ source material of Cellcore® D5 ranges from 0.98-1.05 at % (0.116-0.124 wt %); noting that Li/Co=1 corresponds to 0.1187 wt % (with measurements made using LA-ICP-MS (laser ablation—inductively coupled plasma—mass spectrometry)).

Illustrative Target Bodies Produced Under the Present Invention

The present invention is inclusive of forming an $LiMO_2$ (e.g., $LiCoO_2$) hollow cylindrical body having characteristics that enable it to serve as a rotary sputtering target and that has any one or more of a) to h) below (with "more" being any available subset from a) to h) or all of a) to h)):

a) a relative density range of ≥90%, more preferably 91.0 to 99.8% (as determined by an "Archimedes' techniques such as described in ASTM C693: Standard Test Method for Density of Glass by Buoyancy");

b) a resistivity value of ≤5 kΩ-cm, more preferably ≤3 kΩ-cm, and even more preferably 52 kΩ-cm (values consistent with requirements for DC pulse sputtering);

c) a mean grain diameter of 5 to 40 microns, inclusive of a bimodal grain size distribution (and more preferably 5 to 20 microns, also inclusive of a bimodal distribution of grain sizes);

d) a surface roughness (Ra) of 0.2 to 3.0 microns;

e) an axial length range (per cylinder body) of 150 to 500 mm or more (which can form a section in a multi-cylinder target assembly or represent a monolithic target in a target assembly)

f) an OD range of 75 to 175 mm (or more);

g) an ID range of 50 to 160 mm (or more); and/or h) a contaminate percentage in the sintered body of less than 1500 ppm, more preferably less than 500 ppm, most preferably less than 100 ppm.

Density Values:

Sintered target embodiments of the present invention such as the aforementioned cylindrical $LiMO_2$ (e.g., $LiCoO_2$) sintered target bodies (i.e., target bodies in their final state ready for assembly) preferably have a relative density value of 90% to a value just less than 100%, where relative density is defined as the ratio of the value determined by Archimedes' technique to the theoretical density of the $LiMO_2$ material expressed as a percentage (e.g., values of from 4.65-4.70 g/cm³ for $LiCoO_2$ correspond to relative densities of 90.1-91.1% based on a theoretical density for $LiCoO_2$ of 5.16 g/cm³ are illustrative of densities produced under the present invention's wet milled, spray dried granulate, CIP compression-sintered combination). Thus, embodiments of the invention are inclusive of density values of 90 to 99.8% (more preferably 91 to 99.8%, and more preferably for some embodiments 95 to 99.8%), which, in conjunction with the benefits of CIP processing (as compared to a higher temperature process such as HP), is considered to illustrate an advantageous combination of characteristics in sputtering target (and assembly) production.

Resistivity Values:

A resistivity value range of ≤5 kΩ-cm, and more preferably ≤2 kΩ-cm (values consistent with requirements for pulsed DC sputtering) is featured in embodiments of the present invention, with such a range of values being considered well suited for rotary target sputtering of thin films such as those used in thin film batteries.

4-point probe measurements are done for measuring the resistivity.

Mean Grain Diameters Values:

Through use of the above described wet milling, dried product granulation and CIP based densification and sintering processes, grain size attributes for preferred $LiMO_2$ (e.g., $LiCoO_2$) hollow cylindrical targets under the present invention can be adjusted to a desired preference. For example, featured under the present invention is a mean grain size of 5 to 40 microns, and more preferably 5 to 20 microns, with illustrative specific values being as determined following thermal etching of polished sintered samples. Images obtained with a VWR optical microscope and Leica camera were processed using the 'Grain Expert' module in the Leica Application Suite (LAS) software (v4.4.0). The analysis with the LAS software and images in FIGS. 5A to 5D (for the below described Example 1 $LiCoO_2$ sintered target) indicate a bimodal distribution with modes centered around 8 and 19 microns, yielding a mean value of 16.5 microns.

FIGS. 5 E and F provides the grain size distribution of another section of the sintered CIP-molded body.

Surface Roughness Values:

For purposes such as avoiding arcing and nodule formation due to deposit generation during sputtering because of poor surface roughness, the surface roughness value (Ra—based on surface roughness (JIS B 0601-2001)) for either or both of the ID and OD of the formed hollow cylinder final target body is preferably set to be at or below 5 microns, and, again for either or both of the ID and OD, less than 3.2 microns, as in 2.5±0.25 micron (Ra) for one or both of the ID and OD. Also, in embodiments of the invention, the OD is of a lower value than the ID for certain situations, as where the ID is to be surface wetted, as with the OD being a value of 1 micron or less (Ra), and the ID being at a higher value such as the noted 2.5±0.25 micron (Ra) for improved wetting performance.

Thus as seen from the below (JIS B 0601-2001) sourced table, the Ra value for the ID is preferably within the two to four triangle symbol range with the OD preferably being in the three and more preferably four triangle range per the noted standards.

| Relationship with Triangle Symbol | | | |
|---|---|---|---|
| Arithmetical Mean Roughness Ra(μm) | Max. Height Roughness Rz(μm) | Ten Points Mean Roughness $Rz_{JIS}$(μm) | Note: (Relationship with Triangle) |
| 0.025 | 0.1 | 0.1 | ▽▽▽▽ |
| 0.05 | 0.2 | 0.2 | |
| 0.1 | 0.4 | 0.4 | |
| 0.2 | 0.8 | 0.8 | |
| 0.4 | 1.6 | 1.6 | ▽▽▽ |
| 0.8 | 3.2 | 3.2 | |
| 1.6 | 6.3 | 6.3 | |
| 3.2 | 12.5 | 12.5 | ▽▽ |
| 6.3 | 25 | 25 | |
| 12.5 | 50 | 50 | ▽ |
| 25 | 100 | 100 | |

Note:
Finishing symbol (Triangle ▽ and wave~) was abolished from JIS standard from 1994 Revision.

Following machining (if needed) of the fired ceramic on a machining device to the desired configuration dictated by the sputtering apparatus (e.g., the OD and ID values and axial length values for sputtering target bodies noted above), and any desired cleaning (e.g., acetone oil removal), there is carried out, in an embodiment of the present invention, a wetting (preferably) and a backing support-to-target body gap filling bonding sequence.

However, prior to providing a discussion of embodiments of attaching one or more target bodies to a backing support, a discussion of some illustrative arrangements for both sputtering target assemblies and a sputtering apparatus comprising a sputtering target assembly are described below.

Sputtering Target Assembly

Figure 6:
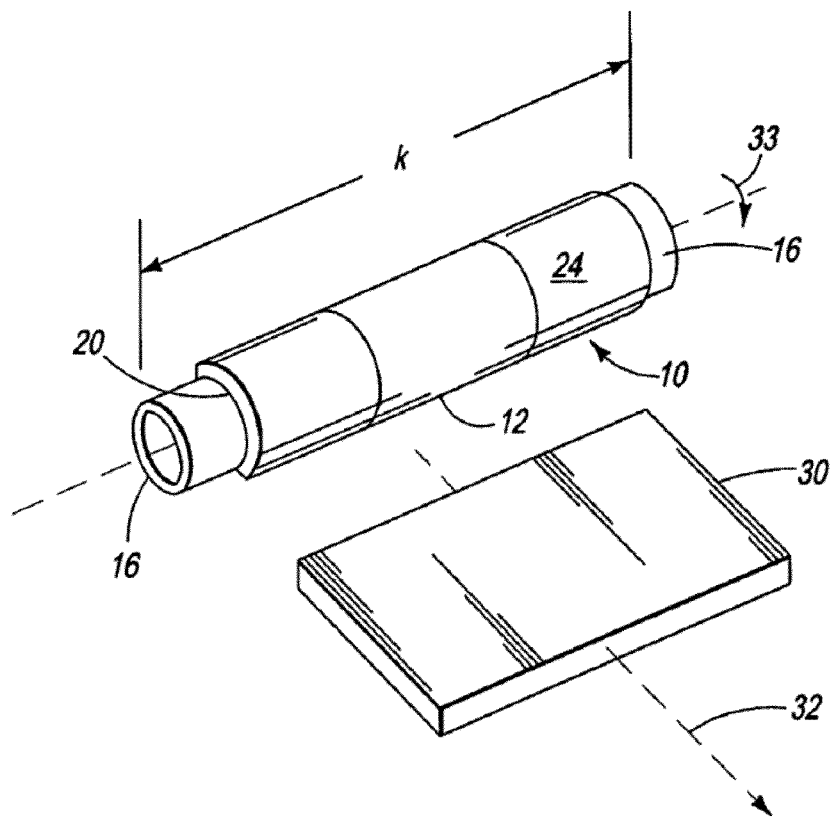
FIG. 6 is an isometric view of a cylindrical sputtering target assembly.

That is, FIG. 6 shows a rotary, cylindrical sputtering target assembly 10 under the present invention (an assembly resulting from a sputtering target body formation and a sputtering target assembly methodology featured in the present invention) in position for thin film formation on the illustrated receiving substrate 30. Sputtering target assembly 10 is shown as comprising a cylindrical sputtering target 12, a cylindrical backing tube 16 and cylindrical gap attachment means or attaching layer (e.g., solder bonding) 20. The sputtering target 12 includes the sputtering surface 24 which is a surface from which the material to be sputtered from the substrate can be ejected when the sputtering process begins. In the present invention, the length "h" of the cylindrical sputtering target 12 (shown in FIG. 7) is of sufficient length to provide the desired width of film coverage under the sputtering process (e.g., a range of about 0.5 meter to 4 meters or greater). Additionally, the cylindrical sputtering target 12 has an outer diameter "D", and a length "h" for some typical sputtering apparatus uses under the present invention the outer diameter "D" is usually greater than about 50 mm and more preferably is in the range of 75 to 175 mm, while the ID of the target body is preferably of a diameter range of 50 to 160 mm.

Figure 7:
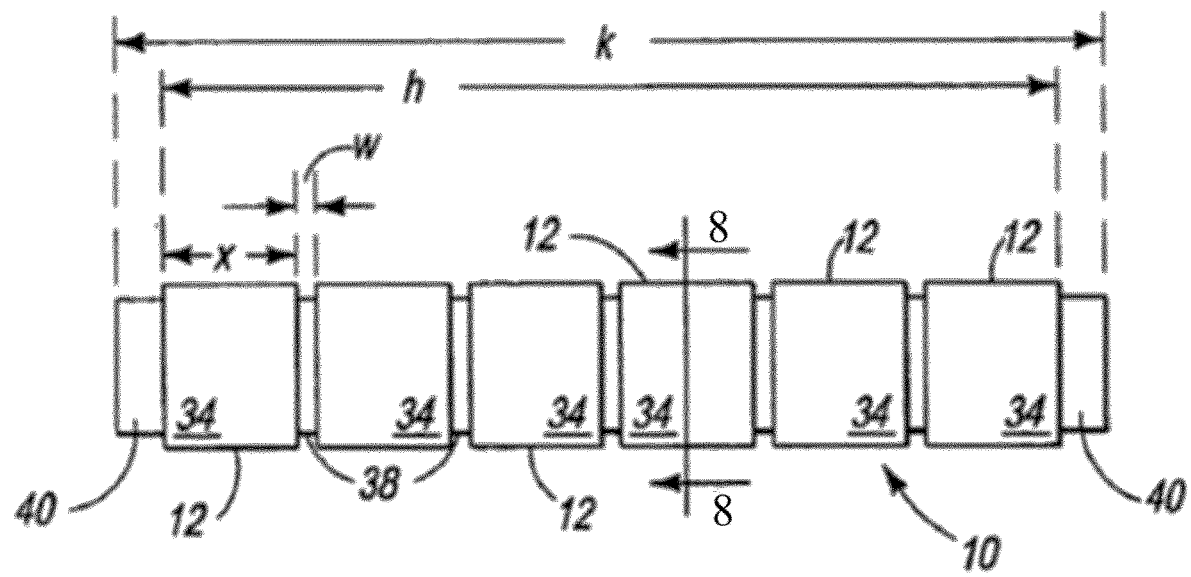
FIG. 7 is a side view of a cylindrical sputtering target assembly.

FIG. 7 illustrates that the sputtering surface 24 of the cylindrical sputtering target 12 is comprised of a plurality of individual cylindrical targets bodies or target segments 34. An axial gap 38 is shown in this embodiment as existing between each pair of adjacent targets 34. The axial gap 38 has a width "w" which is on the order of 0.15 to 0.4 mm. During manufacture of the sputtering target assembly the axial gap between respective, adjacent target bodies that are arranged in series along the backing support can be retained by way of fill members as in silicone gaskets (e.g., gaskets of silicone elastomer) which are suited for removal after attachment material setting.

As used herein, the length "h" for the cylindrical sputtering target 12 refers to the total length of the sputtering surface 24 in a single cylindrical sputtering assembly 10, regardless of whether the sputtering target is comprised of one piece of material or more than one piece. In other words, the length "h" includes the total of all of the lengths "x" of the individual cylindrical targets 34. In view of the potential for the entire sputtering target surface to be based upon a monolithic target body or a plurality of target bodies, reference to "target" in the sputtering target assembly is inclusive of either scenario.

In FIG. 7, the length "h" is shown as including the widths "w" of the gaps 38. Since the sum of the widths "w" is very small, this approximation is acceptable. Notwithstanding this acceptable approximation, the length "h" of the cylindrical sputtering target 12 refers to the total length of the sputtering surface 24. The length "h" is less than the length "k" of the assembly 10 because an exposed section 40 of the backing tube 16 preferably extends beyond the last cylindrical target segments 34 on each end of the cylindrical sputtering assembly 10.

Figure 8:
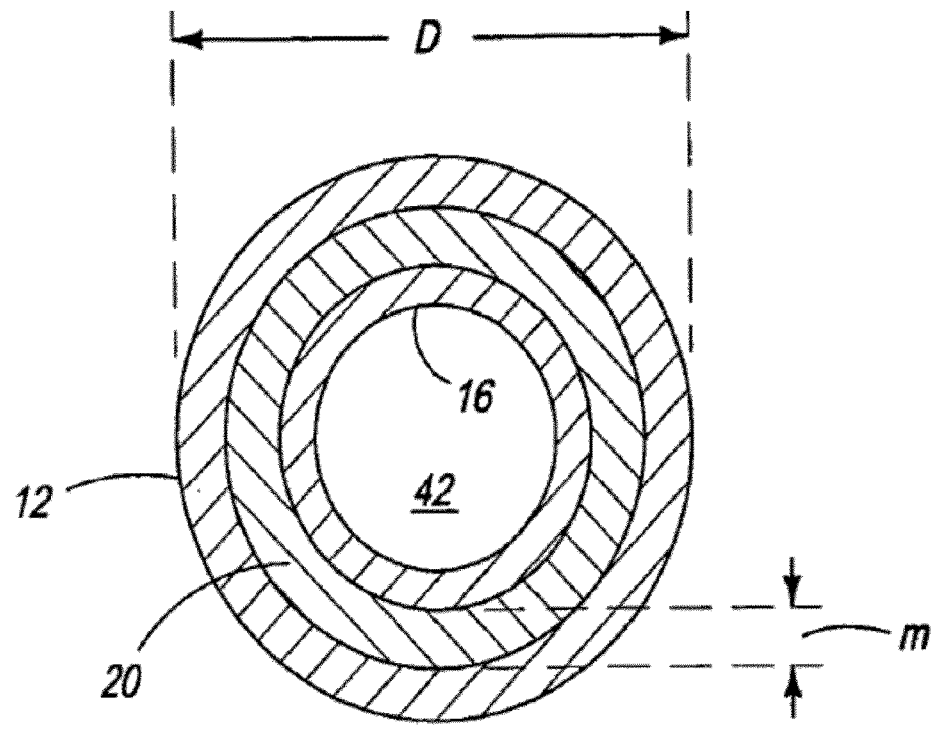
FIG. 8 is a cross-sectional view taken along the line 8-8 in FIG. 7.

Each of the individual cylindrical target segments 34 (also called cylindrical sputtering target sections or bodies 34) is a cylindrical piece of material comprised of a sputtering target material such as that formed under the present invention techniques. The individual cylindrical target segments 34 shown are hollow in the middle so as to accommodate the backing tube 16 and attachment layer 20 (shown in FIG. 8). The length "x" of the individual cylindrical target segments 34 can be of a variety of lengths suited for the intended sputtering application. As a representative example the length "x" is 200 mm (or greater) as in 200 mm to 500 mm (or greater). Additionally, the length "x" can be different for individual cylindrical target segments 34 within a given cylindrical sputtering target 12 with the sum preferably resulting in the sputtering target length "h" as in the noted 0.5 to 4 meters (or more) for "h".

By using a plurality of individual cylindrical target segments 34 having relatively short lengths "x", it is easier to build a longer cylindrical sputtering target 12 having the length "h" greater than, for example, the noted 0.6 meters. This is particularly true for certain sputtering materials like ceramic materials, where it is difficult (or not possible) to make a single cylindrical ring target body 34 where the length "x" is greater than, for example, 500 mm or 1 meter depending on the material. In this way, there can be formed an elongated sputtering target assembly suited for use in a sputtering apparatus.

A description of well-known techniques for wetting sputtering targets and/or supports, and assembling target assemblies inclusive of those comprising cylindrical sputtering targets arranged in a stacked sequence on a common tubular support is provided in US20070074969 (A1) assigned to Thermal Conductive Bonding, which published on Apr. 5, 2007 and which is incorporated here by reference. Such techniques can be used for assembling the cylindrical target segments to the backing tube.

These techniques are suitable for assembling the sputtering targets of the present invention such as the aforementioned $LiMO_2$ (e.g., $LiCoO_2$) hollow cylindrical sputtering targets (although, for reasons such as those set out below, other present invention bonding techniques are particularly well suited for handling relatively lower conductivity material such as the $LiMO_2$ (e.g., $LiCoO_2$) target bodies formed under the present invention).

Under embodiments of the present invention, the step of preparing an outside surface of the cylindrical backing tube and/or an inside surface of one or more cylindrical sputtering target sections for bonding can mean wetting the surfaces with a bonding material, such as a material comprised of indium; or it can mean a pre-wetting step of cleaning the surface such as by sandblasting and/or wiping the surface with a solvent. An ultrasonic horn can be used to spread the indium as well as to transmit ultrasonic energy into the indium while it is being spread. Most preferably, the indium is 99.99% pure or better. However, other materials can be used as the attachment layer such as indium alloys (including indium/tin alloys), tin or an elastomer. Suitable elastomers can be used as the attachment layer such as polymers compatible with a vacuum environment that can withstand temperatures above 50° C., while maintaining a suitably strong bond between the sputtering target and the backing plate and adequately transferring heat from the sputtering target to the backing plate. If an elastomer or other material that bonds adequately to both of these surfaces is used as the attachment layer, then the preparation typically would not involve wetting.

Preferably, ultrasonic energy is used in the steps of wetting the outside surface of the backing tube and the inside surface of the cylindrical sputtering target body with indium, such as ultrasonic energy at a frequency of 20 kHz and a power of 700 watts. However, other energies and/or powers (e.g. 40-45 kHz and a power of 300 watts), and other wetting techniques can be used, such as metalizing the outside surface of the backing tube and the inside surface of the cylindrical sputtering target, using a sputtering or other deposition technique; or by plating a metal layer onto these surfaces (e.g., a chromium-nickel-silver layer) or a combination of the above. The purpose of wetting is to create a surface that the attachment layer can adhere or bond to. It is thought that using ultrasonic energy when wetting the outside surface of the backing tube and the inside surface of the cylindrical sputtering target with indium drives indium atoms into the surface thereby creating a wetting layer of indium that is bonded to the relevant surface of the backing tube or the cylindrical sputtering target. The attachment layer can then adhere to the wetting layer more easily than if it had to adhere directly to the outside surface of the backing tube and the inside surface of the cylindrical sputtering target.

Once the backing tube and the target assemblies have reached a desired temperature as in 177° C. to 200° C., and with the backing tube properly positioned relative to the target segments, individual target segments can be slid over the backing tube. The cylindrical target segments are preferably not placed over the backing tube when they are cool because of indium's tendency to cold weld to itself. Therefore, the indium is preferably molten so that the components slide over each other during assembly. Typically, the hot target segments are slid over the backing tube by hand, with thermal gloves protecting the hands.

Thereafter there can be filled in the slot (space) between the cylindrical target bodies and the backing tube with indium and gently tap the target to remove any air bubbles. Generally, this is done by spooning molten indium into the slot while the indium is at its melting point.

US Publication No. 2013/0118898 (A1), which published on May 15, 2013, to the Applicant of the present application is incorporated herein by reference and describes additional techniques for bonding sputtering targets and/or supports, and assembling target assemblies comprising cylindrical sputtering targets arranged in a stacked sequence on a common tubular support. These techniques under US '898 are suitable for assembling the sputtering targets of the present invention such as the aforementioned $LiMO_2$ (e.g., $LiCoO_2$) hollow cylindrical sputtering targets, although the below described induction bonding technique (e.g., induction plus induction wrap), for reasons set out below, is particularly advantageous in bonding such target bodies.

Viewed from a first aspect, the present invention, when utilizing the noted US '898 Publication bonding technique, features a target assembly comprising a backing or support body having a carrying surface, and a sputtering target produced under the present invention having a back surface or attaching surface, said carrying surface facing said back surface, thereby defining an intermediate space carrying a bonding material binding said back surface to said carrying surface, characterized in that distinct areas of either one or both of said back surface and said carrying surface are selectively, superficially treated so as to enhance the bonding strength of said bonding material in said distinct areas.

In another aspect of the invention, using the noted US '898 bonding technique, a target assembly comprises a support body having a carrying surface; a sputtering target having an attaching surface, said carrying surface and said attaching surface being arranged in opposing facing relation to one another, thereby defining an intermediate space between said carrying surface and said attaching surface; and a bonding material disposed in the intermediate space for binding said attaching surface to said carrying surface, wherein distinct areas of one or both of said attaching surface and said carrying surface are selectively, superficially treated to enhance the bonding strength of said bonding material in said distinct areas. In an embodiment of this aspect, said bonding material is introduced into said intermediate space in liquid form. In another embodiment, treating the distinct areas comprises enhancing the wetting characteristics of said distinct areas such that the bonding material adheres strongly thereto. In an additional embodiment, the support body and the sputtering target are cylindrical in shape and are concentrically arranged with respect to one another.

In a further embodiment, using the noted US '898 bonding technique, the support body has an external diameter D1 and the sputtering target has an internal diameter D2 such that the intermediate space has a thickness $D=(D2-D1)/2$, where by specification D is always greater than zero so bonding material may be introduced into the intermediate space. The bonding material may comprise a low melting point solder. The low melting point solder may be indium.

In an additional embodiment, using the noted US '898 bonding technique, treatment of the distinct areas comprises atmospheric or low pressure vacuum plasma treatment, Corona treatment, grinding, sand-blasting, or $CO_2$ ice-blasting. In another embodiment, treatment of the distinct areas comprises applying a metal layer by plasma spraying, sputtering through a mask or high energy assisted soldering. In a particular embodiment, said metal layer comprises said low melting point solder described above. High energy assisted soldering may comprise ultrasonic soldering. In another embodiment, treatment of the distinct areas comprises exerting mechanical friction such as brushing or rubbing.

In another aspect of the invention, using the noted US '898 bonding technique, a method for controlling thermal stresses in a target assembly, the target assembly comprising a support body having a carrying surface, a sputtering target as produced under the present invention having an attaching surface, said carrying surface and said attaching surface arranged in opposing facing relation to one another, thereby defining an intermediate space between said carrying surface and said attaching surface, the bonding material for binding said attaching surface to said carrying surface being disposed in the intermediate space, the method comprises selectively, superficially treating distinct areas of one or both of said attaching surface and said carrying surface to enhance the bonding strength of the bonding material in said distinct areas thereby controlling thermal stresses in the interfaces between the sputtering target and the bonding material and the support body and the bonding material.

The target assembly produced using the noted US '898 bonding technique with target bodies of the present invention, prevents delamination of the bonding material over large areas by controlling the stresses described above and by building in well chosen voids in the bonding layer during the final cooling down and the resulting bonding of the target/bonding layer/backing body assembly, using selective treatment of either the carrying surface of the support and/or the backside material of the target (segments). The selective treatment comprises a wetting or energizing process used to make the solder or bonding materials stick to the support materials and/or the target materials by changing the surface energy of one or both of those materials. One of ordinary skilled in the art will recognize that there are several ways to change the surface energy of the surface materials. Examples include, but are not limited to, atmospheric or low pressure vacuum plasma treatment (using an inert gas or a reactive gas), Corona treatment, mechanical pre-treatment of the surface by grinding, brushing, rubbing, sand-blasting or $CO_2$ ice-blasting, electrochemical deposition of a thin metal layer, depositing a thin metal layer by plasma spraying, sputtering through a mask, or a high energy assisted soldering technique, e.g., ultrasonic soldering. By selectively controlling the wetting process, distinct areas of good (strong) solder adherence can be defined, and consequently, also areas of bad (weak) solder adherence can be defined. The distinct areas may comprise between 33 and 95% of the total surface of either one or both of the back surface and the carrying surface.

In an example embodiment, using the noted US '898 bonding technique, the target assembly comprises a support body having a carrying surface and a sputtering target formed in accordance with the present invention and having an attaching surface. The carrying surface and the attaching surface are arranged in opposing facing relation to one another, thereby defining an intermediate space between the two surfaces. A bonding or solder material is introduced into the intermediate space for binding the attaching surface to the carrying surface. Before this however, distinct areas of one or both of the attaching surface and the carrying surface are selectively, superficially treated to enhance the bonding strength of the bonding material in the distinct areas. It is believed that the wetting characteristic of the bonding material is enhanced in the distinct areas. In an embodiment, the distinct areas of the attaching surface may not be facing or aligned with (i.e., may be offset from) the distinct areas of the carrying surface. Where the distinct areas are provided only on one of the attaching surface and the carrying surface, the other surface can be treated in the same way over its complete surface (non-selective), so as to yield a full (continuous) wetting layer and an overall good wetting of the bonding material on that surface.

The bonding strength of the solder or bonding material is enhanced in the areas that are wetted or energized. The selective wetting process results in a controlled delamination of the bonding material from the non-wetted surfaces during bonding, thus reducing and potentially alleviating thermal stresses created during the bonding process in a controlled manner. Controlled delamination during bonding reduces and potentially avoids uncontrolled delamination in the future. By controlling delamination, voids are purposely, selectively created in the bonding layer. Thus, alternate areas of good and bad adhesion are formed, resulting in an even distribution of heat transfer over the whole area of the target segment by means of thermally conductive solders or other bonding materials. As such, detrimental, local hot spots, which can result in excessively high stress and eventually cracking of the sputter target during the sputtering process, are avoided. By using the method of controlled wetting or delamination, one is able to bond the target segment material and the support material with minimal built-in stress, resulting in a bonded sputtering target that can withstand higher thermal loads compared to a sputtering target with an inhomogeneous and uncontrolled distribution of delaminated zones. The target assembly described above is for example useful with rotary targets comprised of a backing tube and one or more cylindrical target segments produced under the present invention; and for example for situations wherein the backing tube has a higher coefficient of thermal expansion (CTE) than the target segment. Such difference in CTE (or delta CTE) between the backing tube and the target segment may cause enough thermal stress in the system when cooling down from the temperature at which bonding is performed that uncontrolled delamination at any interface in the bonding system can arise.

Figure 9A:
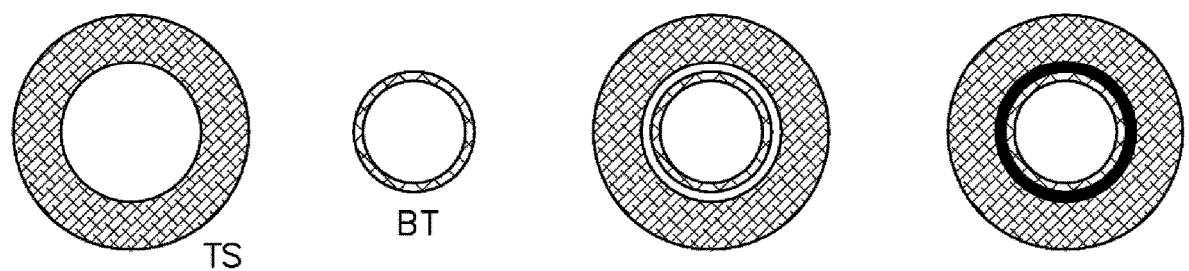
FIGS. 9A and 9B illustrate a conventional sequence for binding a hollow ceramic cylinder sputtering target segment to its backing tube in front elevation and top plan respective orientations.
Figure 9B:
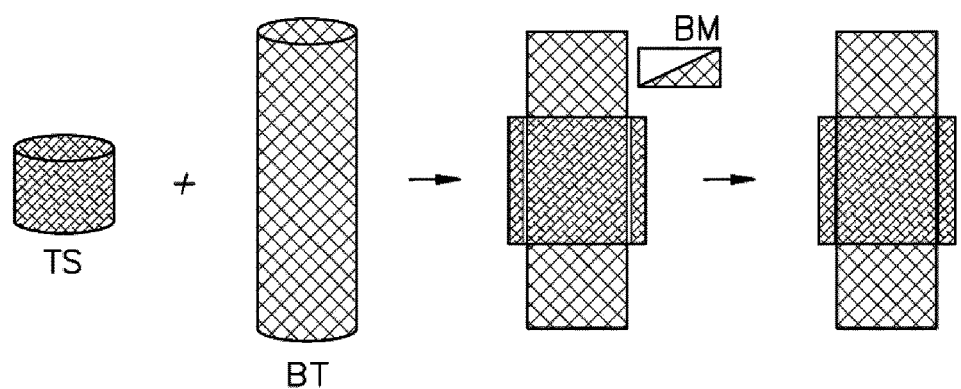

For additional background, reference is made to FIGS. 9A and 9B of the present invention which illustrate a conventional bonding technique based on the discussion in US Publication No. 2013/0118898 (US '898). This conventional bonding technique represents one way for bonding the present invention's CIP densified target bodies to a tubular backing support. That is, FIGS. 9A & 9B illustrate the bonding a rotary target wherein a target segment (TS) is inserted over the backing tube (BT), and thereafter solder or other gap filling bonding material (BM) (molten indium or another low melting temperature alloy) is poured in the intermediate space between both tubes that are heated to (and possibly above) the bonding material's melting point. Thereafter, the target assembly is cooled down to room temperature.

As noted above, in addition to describing a conventional bonding technique as represented in FIGS. 9A and 9B, US '898 describes a bonding enhancement technique that can also be incorporated into the binding process of the present invention (optionally, since embodiments of the invention also feature methods and resultant target assemblies without the noted bonding enhancement technique explained in the incorporated '898 U.S. Publication).

Figure 19:
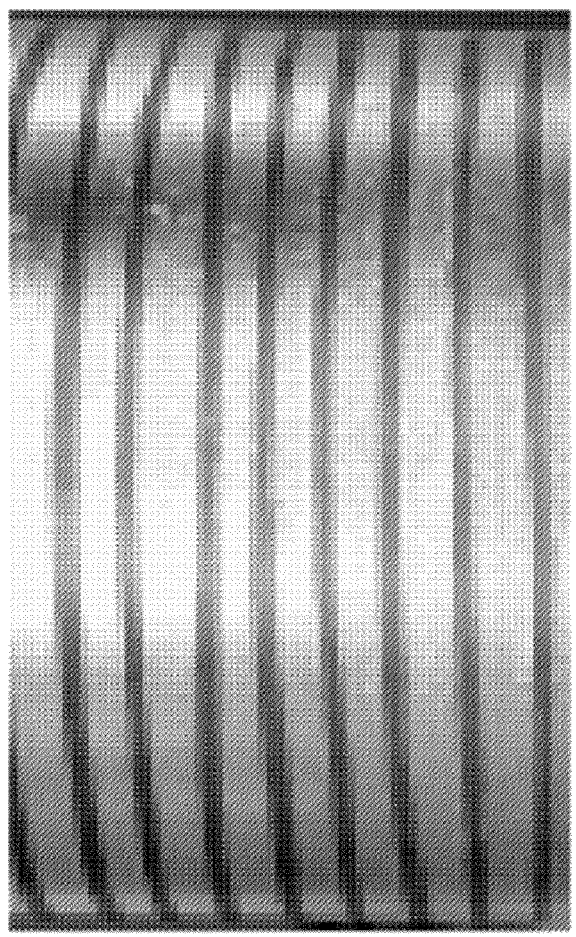
FIG. 19 illustrates a front view schematic representation illustrating an arrangement of backing tube with wetting layer pattern.
Figure 20:
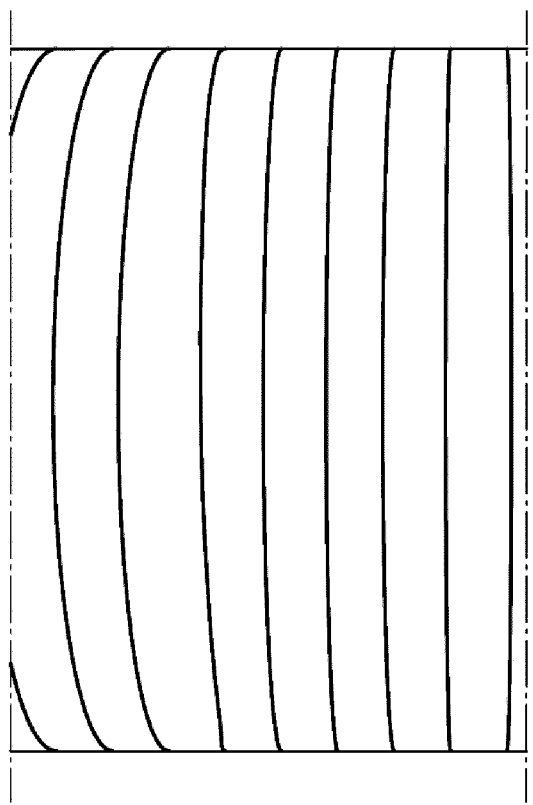
FIG. 20 illustrates another front view schematic representation illustrating an arrangement of backing tube with wetting layer pattern.
Figure 21:
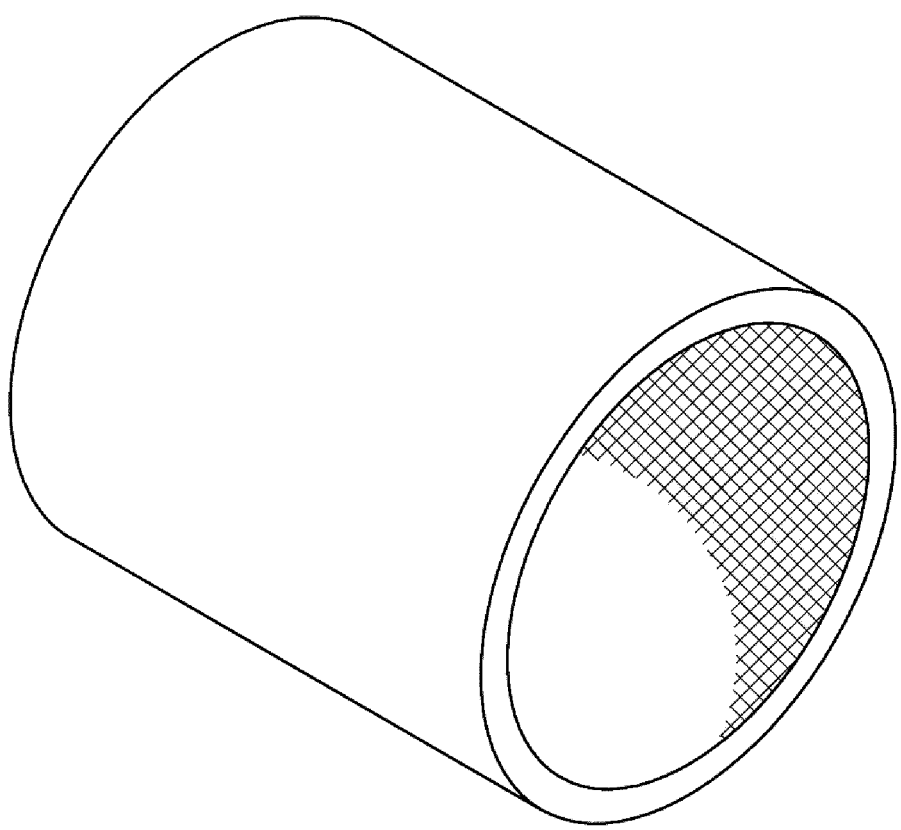
FIG. 21 illustrates a schematic view of FIG. 11.
Figure 22:
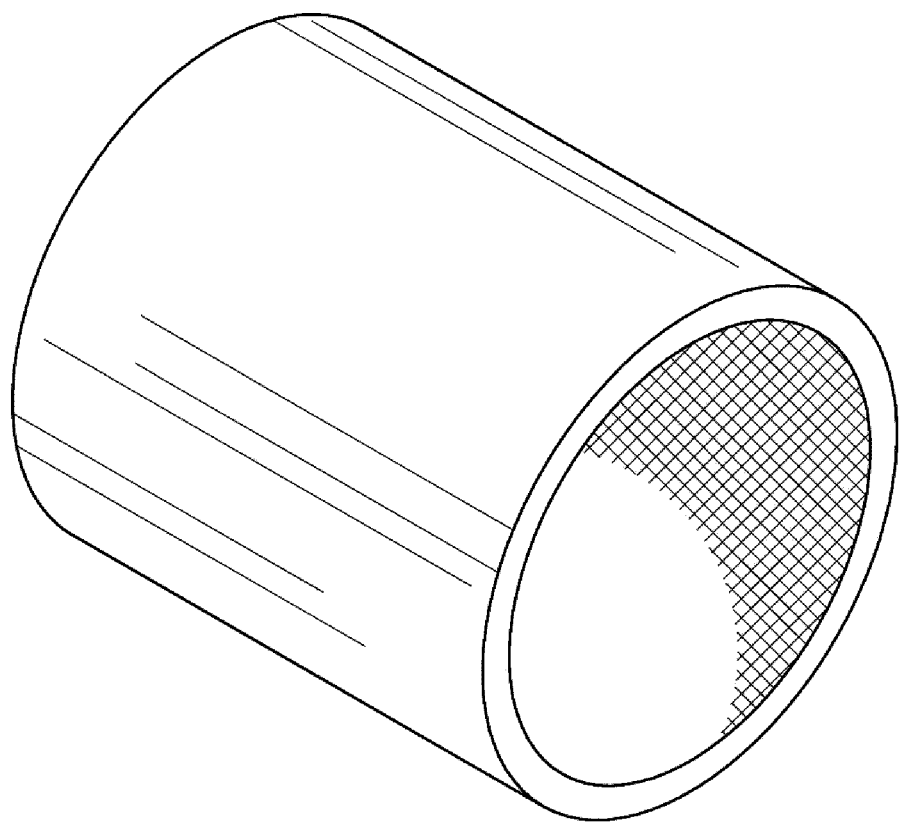
FIG. 22 illustrates a schematic view of FIG. 12A.
Figure 23:
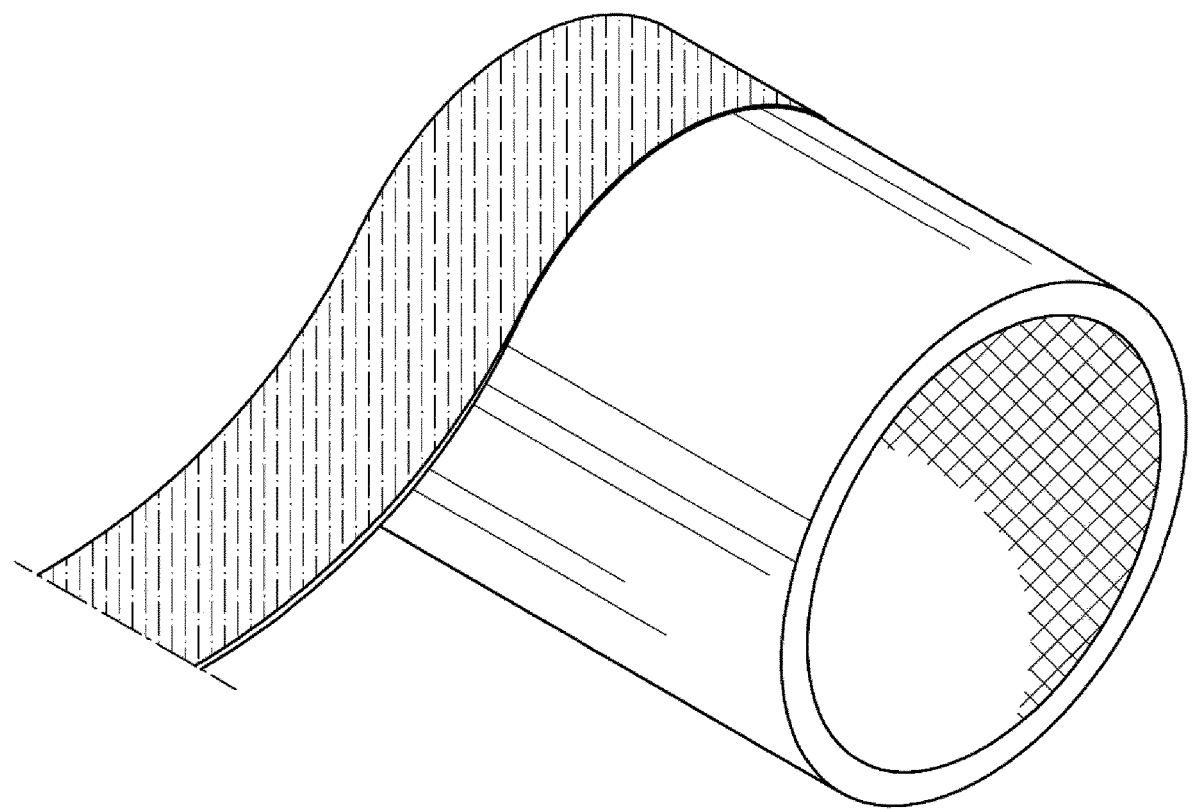
FIG. 23 illustrates a schematic view of FIG. 13A.
Figure 24:
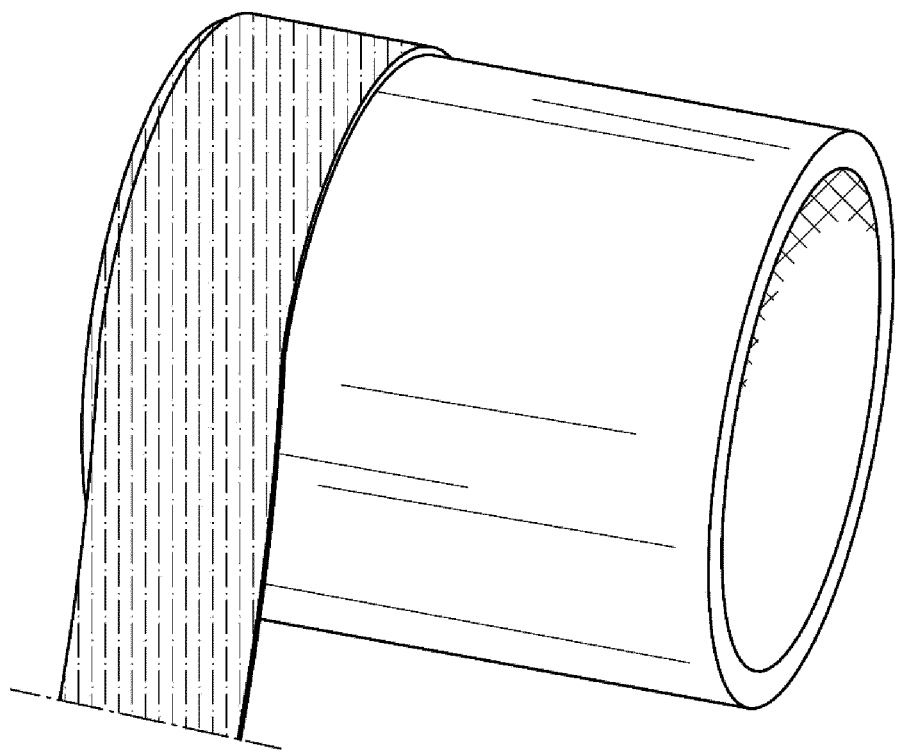
FIG. 24 illustrates a schematic view of FIG. 14.

As also noted above, under the bonding technique in US '898, there is carried out a bonding enhancement treatment wherein the attaching surface and/or the carrying surface of the target segment and backing tube are selectively, superficially treated to enhance the bonding strength of said bonding material in distinct areas. An example of a superficially treated enhancement on a backing tube is featured in FIG. 19 which shows the carrying surface of the backing tube partially wetted so as to obtain a spiral pattern as illustrated in FIG. 19 (FIG. 20) (with ring shaped selective wetting layers), where between 60 and 80% of the carrying surface is selectively wetted with an indium layer using the sonotrode method. The width of each wetting ring is between 6 and 20 mm, the width of each non-treated surface ring is between 2 and 6 mm.

Again, the present invention is inclusive of bonding with such additional treatment steps as well as without, as the present invention is suited for generation of high quality sputtering target assemblies in many instances without an enhancement step such as featured in US '898.

Figure 10A:
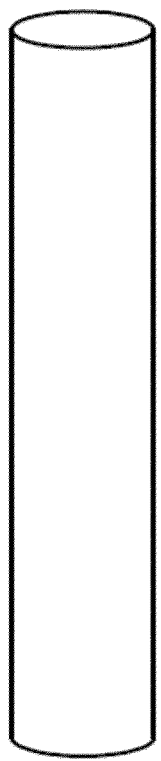
FIGS. 10A, 10B and 10C illustrate some of the steps featured under the present invention's bonding technique.

Provided below are some additional examples of techniques of the present invention that are particularly suited for bonding the CIP densified hollow cylindrical target bodies featured in the present invention such as target body(ies) of material such as ceramic $LiMO_2(LiCoO_2)$ Unlike the radiative heating systems such as illustrated in FIGS. 5 and 6 from the aforementioned US Publication No. 2007/0074969, the present invention is inclusive of different techniques to join the target body(ies) of the present invention to the backing support as illustrated in FIGS. 10A to 18. FIGS. 10A, 10B and 100 illustrate some of the steps featured under the present invention's bonding technique. FIG. 10A shows a backing tube (e.g., a titanium cylindrical tube) designed for providing sputtering target assembly support to the target bodies produced under the present invention.

Figure 10B:
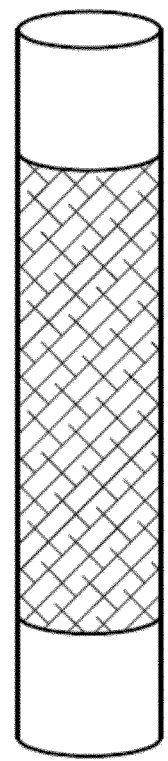

FIG. 10B shows the backing tube BT, which is designed for use with the aforementioned target segment TS, following wetting in a manner such as described above in the "wetting" section. There can be seen in FIG. 10B the non-wetted, end regions which are suited for mounting within, for example, appropriate sealed bearings of the rotating region of a chambered sputtering device.

Figure 10C:
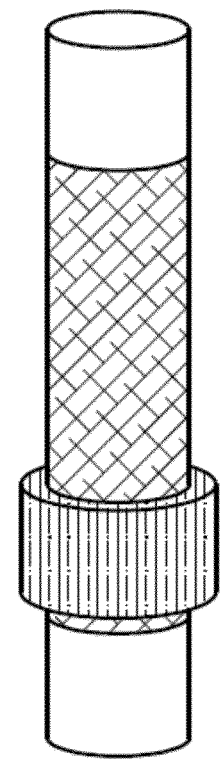

FIG. 10C further illustrates the positioning of a first, in this case lowermost, wetted cylindrical target body TB or segment TS (that has been preliminary wrapped with a conductive wrap CW) relative to the wetted backing tube BT. The target segment in 10C is retained in the desired position by any suitable means as in a connection support structure positioned below it and temporarily attached to the backing tube (inclusive of support brackets such as shown the aforementioned US '969 Publication).

Figure 11:
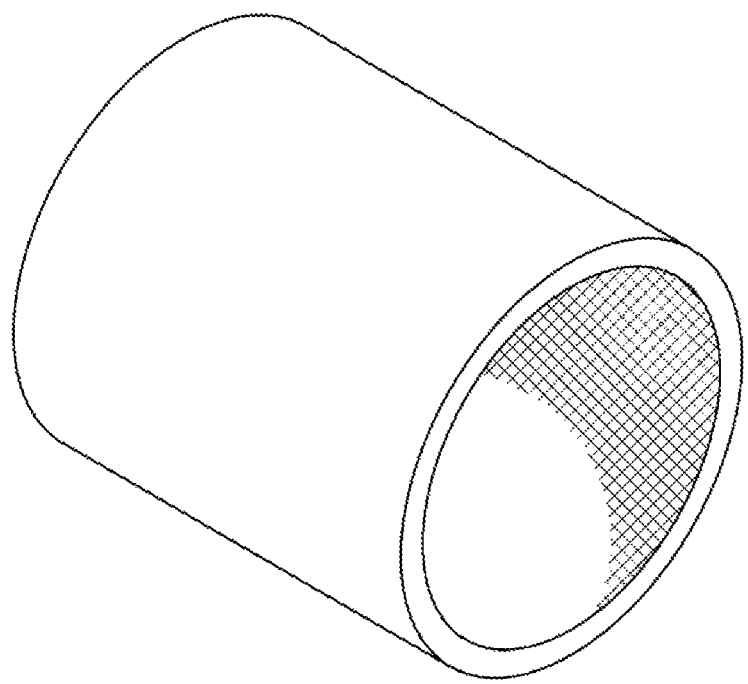
FIG. 11 illustrates a representative hollow cylindrical LiMO$_2$ target body following formation into a ready to be assembled state on a sputtering target with exposed exterior surface.

FIG. 11 illustrates a representative hollow cylindrical target body of the present invention (e.g., following CIP densification and sintering formation steps and machining into a ready to be wetted (and subsequently assembled) state on a sputtering target assembly backing support) with an exposed ceramic exterior surface (preferably after acetone wiping and prior to the below described protective wrapping). For example, the FIG. 11 target segment is in a un-wetted state but otherwise ready for assembly (either directly or with the addition of a protective wrapping as described herein). The FIG. 11 cylinder is representative of a target body produced in accordance with the present invention, and which has a CIP-densified and sintered $LiCoO_2$ cylindrical target body (derived from $LiCoO_2$ raw powder sourcing) with a CIP densification based grain arrangement in the final molded cylindrical target body. The cylindrical sintered molding can also be machined in standard fashion to a desired configuration and surface roughness (e.g., less than 3 micron (Ra)).

Figure 12A:
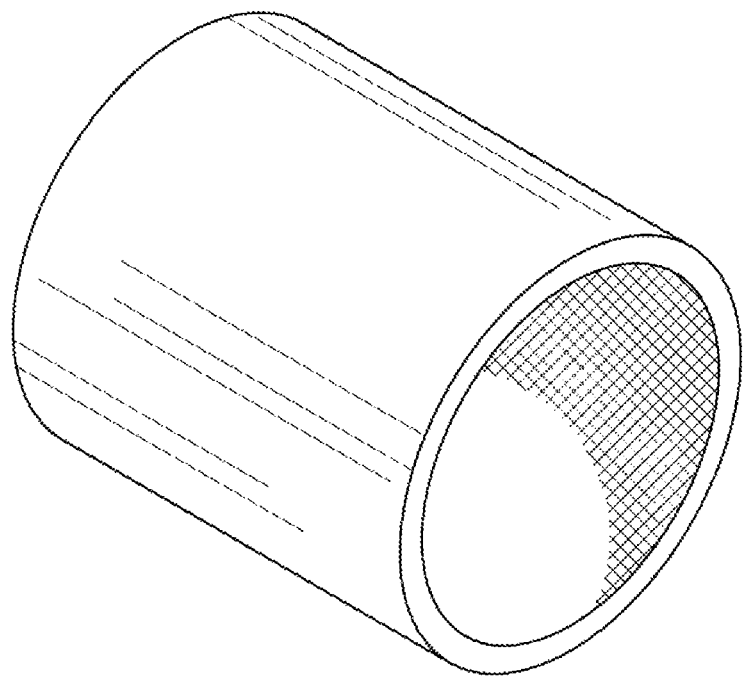
FIG. 12A illustrates the target body of FIG. 11 following addition of a protective wrap which in this embodiment is a translucent protective wrap about the exposed outer diameter surface of the target body.

FIG. 12A illustrates the target body or segment TS of FIG. 11 following addition of a protective wrap (PW) which in this embodiment is shown as a translucent protective wrap about the exposed outer diameter surface (e.g., a wrap of a minimal thickness as in of 50 to 100 μm, and more preferably about 75 μ). In the embodiment shown in FIG. 12A there is featured a ribbon film (e.g., 2 to 24 inch width as in 2 to 20 inch and more preferably 2 to 12 inch width ribbon) such as of Kapton™ protective film (not tape and thus free of adhesive material that might be received by the target body) that is wrapped (as in a spiral overlap fashion) so as to cover over the entire exposed surface (OD) of the target body. That is, from end edge to end edge along the entire axial length of the target body. The ribbon material can be, for example, rolled off from a larger source roll, and cut after a desired wrapping end length is reached which covers the entire target body outside diameter surface with one or more circumferential wrap applications or laminate layers. A translucent or transparent material is preferred as it facilitates a visual inspection of the underlying target at least to some degree.

Figure 12B:
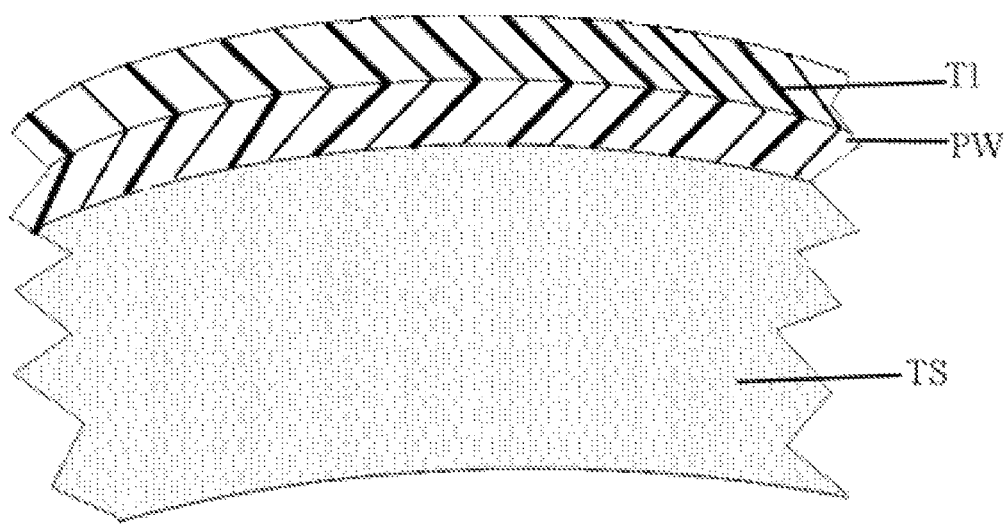
FIG. 12B illustrates a schematic depiction of a portion of the target body in FIG. 12A with protective wrap covering and tape retention lamination.

FIG. 12B illustrates the same protective film covering in cross section together with added PW retention means which in this embodiment is in the form of an adhesive tape T1 helping to retain the PW in direct contact with the target segment TS (the tape T1 in this embodiment preferably has its adhesive surface in direct contact with the PW as shown in FIG. 12B). As the tape T1 is subjected to the below described induction heating process, it should be formed of a material suited for such an environment as in a polyamide film with adhesive such as silicone (i.e., a tape formed of a polyamide layer and silicone adhesive coating such as that featured in Kapton™ Tape). The tape T1 application also facilitates the avoidance of air pockets between the PW wrap and underlying target segment TS.

Figure 13A:
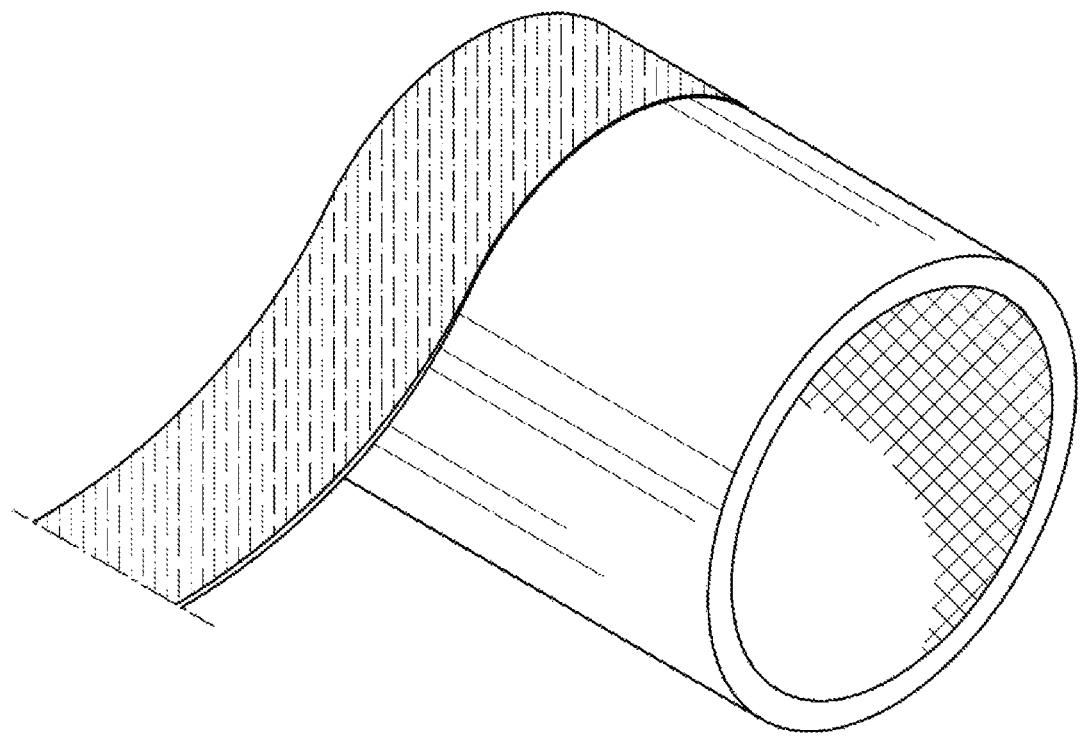
FIG. 13A illustrates a first view of initiation of application of a conductive wrap about the previously protectively wrapped cylinder of FIG. 12A.
Figure 14:
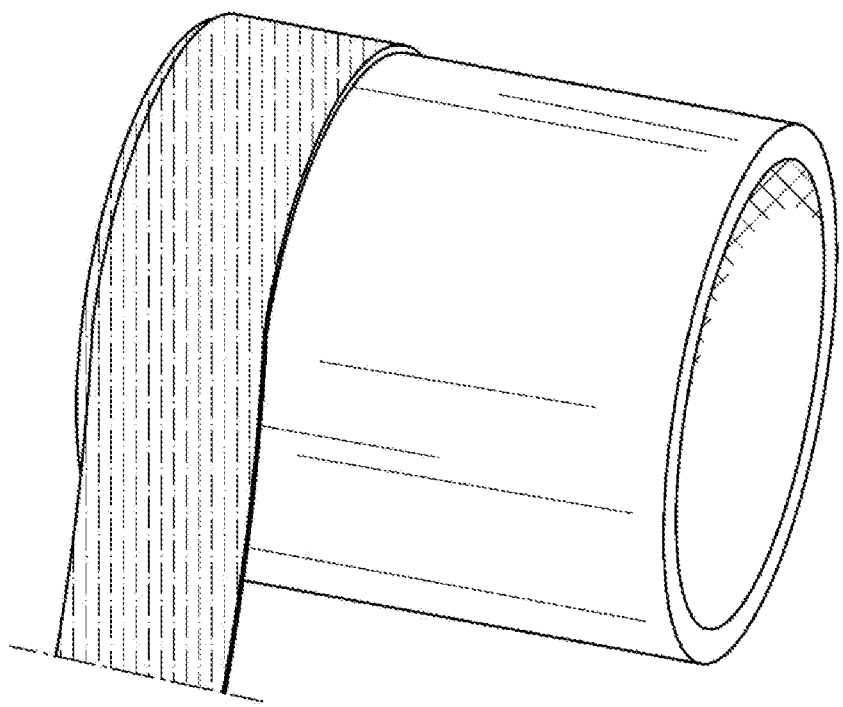
FIG. 14 illustrates that which is shown in FIG. 13A from an alternate viewpoint with the conductive wrap being wound in helical fashion around the protected cylindrical target body of FIG. 12A.

FIG. 13A and 14 illustrate views of the initiation of application of a conductive wrap CW application about the previously protectively wrapped cylinder of FIG. 12A, although in alternate embodiments the protective wrap can be dispensed with and the CW layer directly applied to the target body surface. In alternate embodiments of the invention, both the CW and PW wraps are not utilized and the target body produced under the present invention is assembled without either wrap. As seen from the discussion herein, however, there are benefits in using the PW and/or CW wraps under embodiments of the present invention.

The CW wrap, when utilized, is preferably of a material that is sufficiently flexible as to provide for a minimization of air pocket formation relative to the underlying surface of the protective wrap or the target body OD surface. For example, the CW layer should be flexible enough as to achieve, for example, 90% full contact with the underlying laminate surface and more preferably 99% full contact coverage. Further, the thickness of the CW wrap is preferably relatively low (e.g., 0.3 to 0.5 mm) as to facilitate wrapping without too much of an increase in (OD) of the combination even if there is multiple laminate wrapping as in 1-5 wraps or (1 to 5 times the CW thickness potentially).

In a preferred embodiment the conductive material is a ribbon wrap conductive fabric material as in one having a ribbon width of about 40 to 80 mm (e.g., 60 mm).

The use of a protective wrap PW is particularly desirable in some circumstances such as when there would be the potential for staining, or undesirable chemical reactions, between the material in the conductive wrap and the cylinder body (e.g., carbon staining of $LiCoO_2$ when utilizing a carbon based conductive wrap without a protective wrapper layer). The conductive wrap in this embodiment has the above attributes and is also preferably in ribbon format (e.g., the aforementioned conductive carbon fiber fabric sheeting with widths such as those described above for the CW wrap that preferably has sealed fabric edges). For example, if a ribbon wrap CW is utilized, it can be overlapped in helical fashion. The ("applied radial") thickness of the CW wrap is preferably sufficient to maintain the noted flexibility while attaining the noted induction sourced heating utilized to achieve the desired temperature in the bonding process.

One advantage associated with a ribbon conductive wrap CW is that it provides greater flexibility in an axial temperature gradient adjustment to retain, for example, a gradual hotter-on-top/cooler-on-bottom bond set relationship following target body/backing support gap filling with attachment material such as bonding metal solder (e.g., indium and indium alloys). For example, an increased degree of overlap percent in the CW material travelling up the target body or an increased circumferential wrapping amount as the ribbon is supplied to the target body can provide for CW driven imposed axial temperature gradients well suited for the bonding situation. The wrap itself can have a varying degree of conductivity along its length such as by varying the amount of conductive material it contains along the length (as in different carbon filaments or powder percentage amounts).

Also, a similar different axial temperature gradient theme (e.g., gradual hotter on top-cooler on bottom) can be implemented by providing more wrap material from one target segment to the next in a multi-segment embodiment like that described below, as in an induction heating set up featuring a lower-one CW wrap thickness/an intermediate-double CW wrap/and a top-triple CW wrap sequence). The same axial variation can also be carried out by using, for example, different weights in the conductivity of material amount of the wrap material from one wrap to the next. The conductive wrap is also preferably wrapped about the entire OD of the target segment and retained in position with retaining means as in a tape T2 (e.g., a tape that is similar to tape T1 used for the protective wrap PW) and which retaining means is positioned to help retain the relative position of the conductive wrap to the target segment TS (and PW if present) and to help avoid air pocket separation between the conductive wrap CW and the surface to which the CW is in contact.

Figure 13B:
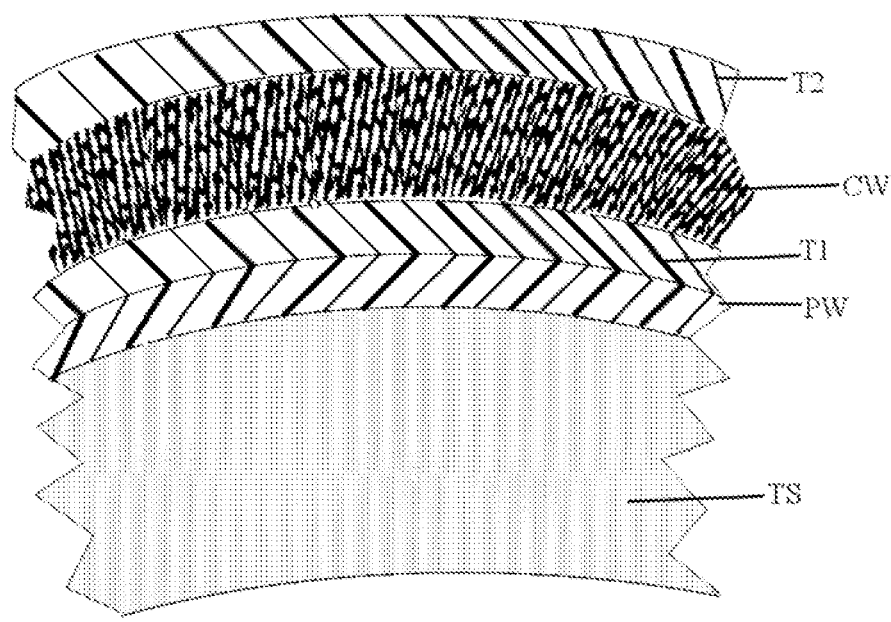
FIG. 13B illustrates a schematic depiction of a portion of the target body in FIG. 13A with an intermediate protective wrap covering and exterior conductive wrap covering over that portion of the target body, each with tape retention means.

FIG. 13B illustrates the target body, protective wrap, first tape, conductive wrap, second tape layering or laminate arrangement featured in an embodiment of the invention. With each added layer over the target body OD being relatively thin, the combination is sufficiently thin as to provide for the desired circumferential spacing between the interior of the induction heater and the OD of the entire combination. For example, starting with the OD of the target body as the foundation, there can be present a thin layer of protective wrap (e.g., one that is at or less than 100μ), a thin layer of tape (e.g., less than or equal to 75 μm), a thin conductive wrap layer or layer set (e.g., a single layer less than or equal to 2 mm (as in 0.25 to 1 mm per layer and more preferably 0.3 to 0.5 mm per CW layer) such that, even with a multi-wrap arrangement in the conductive wrap, for example a 5 wrap embodiment, a total CW wrap thickness range of 1.25 mm to 10 mm is presented for a 0.25 to 2 mm one CW layer thickness range). As an additional example, a CW is utilized that has about a 0.4 mm thickness (such that a 3 wrap embodiment results in a 1.2 mm addition).

A conductive wrap retainer means such as additional tape T2 like that described above can also be added such as one formed of the same tape T1 material noted above (e.g., an additional 75µ or less). Thus, in the embodiment described above, a summed total of the values for a 2 mm thick CW wrap features a range of 2.25 mm (1 CW wrap) to 10.25 mm (5 CW wrap) for the various (up to 5 wrap) arrangement. Thus, in the alternate embodiment described featuring about 0.4 mm thick CW, there is a range of 0.65 mm (1 CW wrap) to 1.45 mm (3 CW wrap) in overall thickness. Embodiments of the invention preferably feature an overall combination thickness out from the target body external surface (inclusive of 3 wrap embodiments) of 0.5 to 3.5 mm combination radial thickness.

FIG. 10C shows this protective wrap and conductive wrap (previously wetted) target segment positioned on the previously wetted target tube and ready for induction heating initiation.

Figure 15:
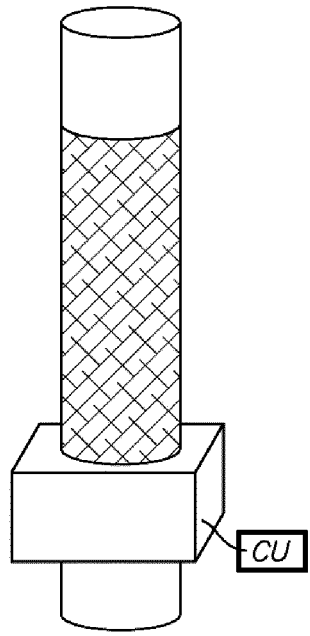
FIG. 15 illustrates an induction heating initial stage under the present invention with an induction heater positioned over the protective and conductive material wrapped target body shown in FIG. 100.

FIG. 15 illustrates an induction heating initial stage with an induction heater positioned over (e.g., circumferentially encompassing) the protective and conductive material wrapped lowermost target body shown in FIG. 10C. Once the wrapped target segment TS is properly situated on the backing tube BT and the induction heater IH in the desired relationship (e.g. circumferentially surrounding the target body's lower region as a start off location to facilitate obtainment of a desired axial temperature gradient schedule), there can be carried out a bonding of that lowermost target segment or body TS to the backing tube BT through use of an induction heating process and providing bonding material sufficient to fill in the attachment gap.

That is, as shown in FIG. 15, induction heater IH with control unit CU (with frequency and energy setting means (e.g., dials or touch screen setting options)) placed at a desired setting relative to the featured materials for the target body, backing tube and binding material (e.g., metal solder such as Indium) is properly set. Also, as shown in FIG. 15 the size of the induction heater can be made to have a height generally conforming to the target body (e.g., about the same (100%) or less than (40% to 80%) to facilitate visual and physical access if needed). However, in view of the potential for different axial length target bodies, the induction heater should not be made too small in axial length (e.g., too much heat adjustment time) or too long in axial length (loss of accessibility or precision axial gradient control). Also, the interior apertured access region of the induction heater is sized such that it can be slid down over the outer circumference of the mounted target body shown in FIG. 12 with suitable clearance (as the induction heating is a non-contact heating process, at least relative to conductive material positioned within the induction heater's aperture), but not too great a clearance as to degrade induction heating capability or efficiency. This circumferential spacing also provides for relative adjustment when it is the target body (target assembly) being moved relative to the induction heater. Under either scenario, the above described potential multi-wrap embodiments (e.g., FIG. 13B) are taken in consideration relative to maintaining the non-contact induction heating properly.

Once the induction heater is properly circumferentially positioned (e.g., sharing a common same horizontal cross section height as the to-be-heated target body) about the target body, the induction heater can be energized to a desired level, and when the desired temperature is reached (e.g., 165 to 220° C.), and there is a suitable heated environment in the circumferential gap region (and the wetting material, if present, is in the desired (e.g., softened state), the "gap filler" bonding material as in a "gap filler" metal solder can be introduced. The introduction is carried out in a desired fashion as by way of a pouring as depicted in FIG. 9A, and preferably coupled with agitation for bubble removal. For example, a metal solder as in indium can be spooned (or otherwise poured) into the gap and agitation can be used to help free oxide and bubbles from the bonding surface.

Once the desired heat level in the gap region is generated by the induction heater (and CW if present) and the wetting material (if present) is sufficiently softened, the pouring in of the gap filling bonding material BM can be completed. Upon adjusting in position the heat supply relationship or shutting down of the heat supply, the target body and backing tube begin or become bonded or attached together following sufficient cooling in the pertinent gap region.

Figure 16:
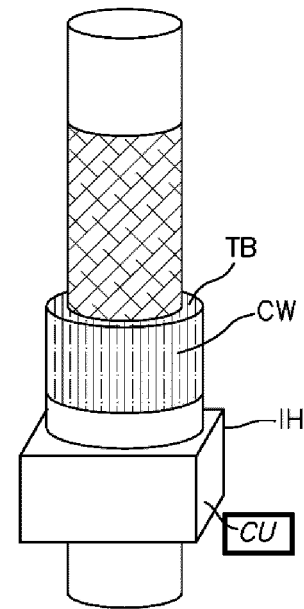
FIG. 16 illustrates the addition of a second target body cylinder or target segment on the backing tube above the lower, first positioned target body prior to induction heater repositioning away from the first target segment with the second target segment also having the wrapping shown in FIG. 100.
Figure 17:
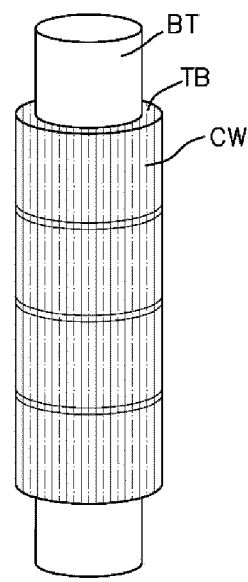
FIG. 17 illustrates the arrangement of FIG. 16, but with the induction heater having been repositioned to the second target body for the controlled axial gradient induction heating of the first and second target bodies.

In the embodiment illustrated in FIGS. 15 to 17 there is seen that the induction heater is axially adjusted in position relative to a stationary backing tube (e.g., a backing tube telescopically and fixedly received by an upstanding base support inserted stub extension) in a manner that allows for precision control of the axial cooling/heating temperature gradient along the length of the target body. In this way, the prior treated target body can be at a desirable state of cooling prior to the next target segment positioning on the backing tube (preferably with an intermediate axial spacer such as the aforementioned silicon spacing ring). In this way, an operator also has an access opportunity, before initiation of the bonding procedure for the next in line target body, to visually confirm, for example, that there has been no cracking of the treated target segment (as in following removal of the conductive wrap on that target body, but typically without a need to remove the protective wrap, if present, due to its thinness and/or translucent or generally transparent characteristic of the PW even after heating), and no issues with bonding material leakage, etc. Also, following that step, the relative position of the induction heater, the first target body (or target body assembly in its present state) or both, can be adjusted so that the induction heater initiates heating of the second stacked target body (e.g., noting also that in embodiments of the present invention the induction heater can straddle the two target bodies initially). Also, rather than adjusting the induction heater along the axial direction (or heaters if multiple IH's are utilized), the target body(ies) can be adjusted relative to the IH (in this way a fixed bonding material supply location can be provided in that the induction heater can be retained stationary at a certain horizontal plane and the upper region of the circumferential gap to be filled can be adjusted to a desired plane based on that fixed positioning of the induction heater and the gap filling bonding application can be provided at a suitably accessible single location—visually and physically—as when monitoring the gap filling to confirm proper molten solder gap travel and bubble removal.

In an alternate embodiment, there are a plurality of stacked induction heaters IH that are fixed in position and an inserted target assembly also fixed in position at the time of bonding, and the series of induction heaters are triggered in controlled fashion in a vertical direction in coordination with the stacking and height current height level of the stacked target segments TS.

FIG. 16 (which represents an induction heater adjustment embodiment) illustrates the addition of a second target body cylinder or target segment on the backing tube above the lower, first positioned target body, prior to induction heater repositioning away from the first target segment. Under embodiments of the present invention, there can be provided an axial gap spacing ring between respective stacked targets to provide a desired degree of separation to accommodate expansion during sputtering usage, which spacing ring is put in position prior to final positioning of the second target body stacking on the first.

FIG. 17 illustrates the arrangement of FIG. 16 but with the induction heater having been repositioned for focused induction heating of the second target body.

Figure 18:
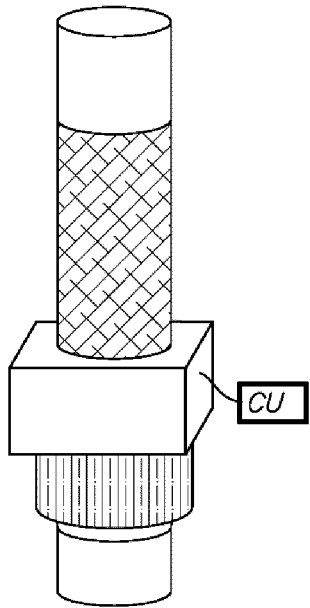
FIG. 18 illustrates a completed target body assembly having multiple bonded target bodies on a common backing tube and with the induction heater having been removed and with the conductive wraps and protective wraps still in place.

The position and bond setting by way of (preferably individualized target body) induction heating is completed in series until the desired number of target bodies are bonded to the target tube whereupon a completed target assembly such as that illustrated in FIG. 18 is attained. That is, FIG. 18 illustrates multiple bonded target bodies on a common backing tube to provide a sputtering target assembly, and with the target assembly having been separated from the induction heater. Also, under the present invention, there is little post bonding requirements as in only having to clean the axial gaps (if needed) and removal of any removable axial spacers (unless no (or permanent) target segment spacers are utilized). Further, there need only be removed the CW wrap and retainer means T2 if used (if each was not earlier removed in a target body inspection process) prior to sending the manufactured sputtering target assembly to the next location, without concern for additional contamination in situations where the protective (bonding stage) wrap PW is not removed and retained as a packaging protective material. That is, the protective wrap and any tape T1 utilized are designed to withstand the heat associated with the heated attachment process and be suitable for continued protective use following completion of the bonding process.

Examples 1 to 5C

Provided below are some illustrative Examples 1 to 5C directed at the formation of CIP densified cylindrical sputtering target bodies with TABLE E (which encompasses the LiCoO$_2$, the Mill, the d50, and the Binder data from TABLE A) below summarizing some of the attributes of the Examples 1 to 5C. Further, Example 1 is inclusive of a description of the formation of a sputtering target assembly using a version of the above described induction heating bonding technique of the present invention.

Example 1

14 liters of deionized water are introduced into a polyethylene batch tank. 1.2 kg of a synthetic polyelectrolyte commonly used as a dispersing agent is added to the water and mixed. The pH of the mixture is adjusted to 10+/−0.5 by dropwise addition of concentrated NH$_4$OH solution (~25 wt %).

60 kg of Cellcore® D5 lithium cobalt oxide powder (supplied by RBM, Rechargeable Battery Materials, a business unit of the Applicant Umicore) is slowly added to the aqueous solution with mixing.

The mixing tank is attached to the inlet and outlet tubing of a Buehler Mill and the mixture wet milled for approximately 4 hours (equipment settings). Samples are collected every hour with a target d50 value of 0.5 micron, as determined by a CPS Disc Centrifuge (Model DC 12000). During the milling process, n-octanol is added as an antifoam agent.

The above described milling of Cellcore® D5 lithium cobalt oxide powder gives rise to a bimodal particle size distribution, as shown in FIG. 3.

When the milling is complete, the resulting slip is transferred to a mixing tank where 927 g (2 wt %) of a polyvinylalcohol based binder. This mixture is stirred overnight (~14 hours).

Granulate is prepared by spray drying the resultant slip in a GEA Production Minor spray tower. The spraying was carried out at a pump rate of 25 rpm (Watson Marlow 520U Pump) yielding a throughput of 10-12 kg/hr using a fountain style spray nozzle. Inlet and outlet temperatures are controlled at 225 and 120° C. These conditions minimized losses to the cyclone to less than 30%. The granulate was characterized by particle size (d50=60-100 micron as determined by sieve analysis), angle of repose (0.3-0.5; PTL V36.61; ISO 4324), tap density (1.3-2.0 g/cm$^3$; Erweka SVM-202); JEL Stampfvolumeter STAV 2003), and residual moisture (<2%; OHaus MB45 Moisture Analyzer).

The main granulate fraction and fines were combined and blended before loading into the rubber bags of cylindrical CIP molds equipped with centrally-positioned cylindrical aluminum cores and top and bottom polyurethane retainers. Following sealing with a rubber cap and evacuation, the molds were exposed to 4000 bar of hydrostatic force.

Following removal from the rubber bag and extraction of the core, hollow cylindrical green bodies of LiCoO$_2$ were obtained with dimensions of approximately 181 to 184 mm OD, 143 to 145 mm ID, and 315 to 320 mm length.

For these samples, green machining to true up the outer peripheral surface dimensions and square the end faces was not performed. Instead, any sharp edges were removed with a blade. The green bodies were then placed in a sintering furnace equipped with a blower and damper. Debinding and sintering was carried out in a single cycle at atmospheric pressure in a (box) furnace, with the blower on and damper open only during the debinding stage (T≤500° C.) and final cool down (T≤600° C.). The temperature profile for the entire firing process is shown in FIG. 1.

Following sintering, the density of the cylinders was determined by an Archimedes' method, however, because of the porosity of the LiCoO$_2$ surface, the exterior surfaces were first coated with a polymer coating of known mass and density (PlastiDip rubber spray). Densities ranged from 4.65 to 4.70 g/cm$^3$ (Theoretical density=5.16 g/cm$^3$)

Sintered dimensions ranged from 165 to 173 mm in OD, 130 to 136 mm in ID, and 285 to 295 mm in length.

The sintered cylinders were machined to final dimensions (with roughness Ra tested to confirm the roughness value for the ID and OD was below 3.0 Ra).

The resistivity of the machined target has been measured according the standard 4 points probe measurement based on four samples of the same target material. Results for samples 1-P-3-1 to 1-P-3-1 are provided below in TABLE 1:

TABLE 1

| LiCoO2 | Cross Section | | | R measured | Calculated r (specific Resistivity) | Average (1-P-3-1:1-P-3-4) | | |
|---|---|---|---|---|---|---|---|---|
| | Length L (mm) | Width a [mm] | Width b [mm] | [Ohm] | ($\Omega$cm) | $\mu\Omega$cm | m$\Omega$cm | $\Omega$cm |
| 1-P-3-1 | 39.4 | 5.1 | 5.3 | 14500 | 994.7588832 | 2.71E+09 | 2708246 | 2708.246 |
| 1-P-3-2 | 39.3 | 4.6 | 5.2 | 71000 | 4321.424936 | | | |
| 1-P-3-5 | 39.4 | 5.1 | 5 | 42000 | 2718.274112 | | | |
| 1-P-3-4 | 39.4 | 4.6 | 5.1 | 47000 | 2798.527919 | | | |

Results gathered in Table 1 are obtained via the ISO 16525-2:2014 method for 4 points probe tests. Length, widths a & b are geometrical parameters of each of the samples.

Table 1 results of resistivity are related to a relative density value of 91.0% (4.70 g/cm$^3$) for each of the sample.

The machined LiCoO$_2$ cylinder was bonded to a Ti backing tube following the induction heating technique described herein, with some of the features of that technique being utilized for this Example described below:

Sputtering target assembly: use of an induction heater in the bonding process of the LiCoO$_2$ target of Example 1 on a titanium backing tube.
1) Protection of the outside surface of LiCoO$_2$ cylinders with Kapton™ (polyimide) tape is not used because residue from the adhesive stains the surface. Instead, a Kapton film is applied to the surface and the wrapping taped in position;
2) The ID of the LiCoO$_2$ cylinder was cleaned with acetone prior to wetting;
3) The target was heated in a box furnace for wetting at 200° C.;
4) The ID of the LiCoO$_2$ was not sandblasted and there was not a plasma treatment carried out to activate the surface, as this was not required for the surface of the target segment was suitable for achieving excellent wetting without such activation;
5) The backing tube was wetted with indium using a plasma pretreatment;
6) Indium was spread on the segment ID with a brush and then treated with an ultrasonic horn.
7) Indium wetting adhesion was verified with an In-to-In stick test, where failure of the ceramic occurred prior to failure of the In-to-In bond;
8) The targets were assembled one segment at a time relative to a common backing tube;
9) There was established an axial gap width of 0.15 to 0.55 mm using silicone elastomer gaskets;
10) The protective wrapped ceramic target body was wrapped with a conductive blanket to facilitate inductive heating of LiCoO$_2$ and backing tube, the conductive wrap utilized is a commercially available carbon based conductive fabric with longitudinal carbon fiber, glass/polyester cross-fibers, and fixed self-edging. Such a fabric is available from Suter Kunststoffe AG or "Suter Swiss" of Switzerland and was in the form of an overlapping helical ribbon wrap as illustrated in FIGS. 13A and 14;
11) There was used 3 short wires to align the cylinder around the backing tube leaving a gap of ~1 mm;
12) The providing of indium as a gap filler bonding material included spooning in indium into the gap and freeing oxide and bubbles from the bonding surfaces with agitation;
13) The target bodies were bonded vertically;
14) The use of the Kapton wrap minimized the need for any clean-up of the LiCoO$_2$ surface following bonding. Only the segment gaps were cleaned. This is particularly advantageous since surface treatments such as polishing generate dust which is hazardous, but also difficult to remove from the target surface. This protection also prevents surface discoloration caused by reaction of the LiCoO$_2$ with the carbon-based conductive wrap.

In Example 1, The LiCoO$_2$ target is bonded following the induction heating technique described herein using workable frequencies comprised between 1 to 100 kHz, and preferably 1 to 20 KHz, including said values.

More preferably, the frequencies range is between 6 to 12 kHz, including said values.

In Example 1, the induction generator used in the induction bonding method is arranged to work under a power level comprised between 1 to 20 kW, and preferably 1 to 10 kW, including said values.

More preferably, the power range is between 1 to 3 kW, including said values.

The range selection of frequency and power is dependent on the geometrical (for instance, length and width of the target, length and width of the backing tube, etc.) and material properties (for instance backing tube material, target material, conductive wrap material, etc.) of the assembly target+backing tube and are modulated in such a way that bonding described herein is effective.

Table E below provides characteristics as to the process utilized in the formation of Example 1 and the resultant target body.

Example 2

Cylindrical target body processing was equivalent to that of Example 1 except an alternative source of LiCoO$_2$, Cellcore® D20 (also supplied by RBM), was utilized. Table E below provides characteristics as to the process utilized in the formation of Example 2 and the resultant target body.

Example 3

Processing was equivalent to Example 1 except on smaller scale, 2.85 kg of Cellcore® D5 and 2 wt % polyvinyl alcohol binder, which required milling in a Union Process attritor (Model 1-S). Table E below provides characteristics as to the process utilized in the formation of Example 3 and the resultant target body Example 4

Processing was equivalent to that of Example 3 except an alternative binder, an acrylate-based binder was utilized. Table E below provides characteristics as to the process utilized in the formation of Example 4 and the resultant target body Example 5

Processing was equivalent to Example 4 except the temperature of the high temperature soak during the sintering was carried out at different temperatures T (5A: 950° C.; 5B: 1000° C.; and 5C: 1050° C.).

TABLE E

| Example | LiCoO2 | Mill | d50 of the powder (micron) | Binder wt % | Green Density (q/cm3) | T (C.) | Sintered Density (q/cm3) |
|---------|--------|---------|-----------|-----|-----------|------|-----------|
| 1  | D5  | Buehler | 0.76      | 2%  | 3.68-3.75 | 1025 | 4.68-4.74 |
| 2  | D20 | Buehler | 0.69      | 2%  | 3.81-3.82 | 1025 | 4.46      |
| 3  | D5  | 1-S     | 0.19-0.35 | 2%  | —         | 1025 | 4.74-4.76 |
| 4  | D5  | 1-S     | 0.25-0.29 | 2%  | —         | 1025 | 4.74-4.75 |
| 5A | D5  | 1-S     | 0.22-0.42 | 2%  | 3.58      | 950  | 4.44      |
| 5B |     |         |           |     |           | 1000 | 4.74      |
| 5C |     |         |           |     |           | 1025 | 4.72      |

Although the present invention has been described in terms of the presently preferred embodiments, it is to be understood that such disclosure is not to be interpreted as limiting. Various alterations and modifications will no doubt become apparent to those skilled in the art after having read the above disclosure.

The invention claimed is:

1. A lithium-containing transition metal oxide-based cylindrical hollow target body adapted for use in a sputtering target assembly, said cylindrical hollow target body being suitable for bonding on a backing tube so to form said sputtering target assembly, said cylindrical hollow target body having a relative density value ≥90.0%, and wherein said lithium-containing transition metal oxide consists of a metal oxide microstructure that contains a bimodal grain size distribution.

2. The cylindrical hollow target body according to claim 1, having a relative density value superior or equal to 91.0% and inferior or equal to 99.8%.

3. The cylindrical hollow target body according to claim 1, having a resistance value ≤5 kΩ cm.

4. The cylindrical hollow target body according to claim 2, wherein said lithium-containing transition metal oxide has a mean grain diameter superior or equal to 5 μm and inferior or equal to 50 μm.

5. The cylindrical hollow target body according to claim 1, wherein said lithium-containing transition metal oxide has a mean grain diameter superior or equal to 5 μm and inferior or equal to 20 μm.

6. The cylindrical hollow target body according to claim 5, wherein each mode of said bi-modal grain size distribution is centered at a mean diameter value inferior to 50 μm.

7. The cylindrical hollow target body according to claim 6, wherein each mode of said bi-modal grain size distribution is centered at a mean diameter value superior or equal to 5 μm and inferior or equal to 20 μm.

8. The cylindrical hollow target body according to claim 1, wherein the lithium-containing transition metal oxide has a general formula: $LiMO_2$ or $LiMM'O_2$, wherein M is a transition metal selected from the group consisting of: Ni, Co, Mn, Ti, Al, V, Cr, Y, Sr, Ca, Zr, Zn, Si, Mg, Ga, W, Fe, Cu, La, or at least one combination thereof, and M' is a dopant selected from the group consisting of: Ti, Al, V, Cr, Y, Sr, Ca, Zr, Zn, Si, Mg, Ga, W, Fe, Cu, La, or at least one combination thereof.

9. The cylindrical hollow target body according to claim 8, wherein the $LiMO_2$ or $LiMM'O_2$ lithium-containing transition metal oxide has a Li/M or Li/(M+M') atomic ratio superior or equal to 0.90 and inferior or equal to 1.25.

10. The cylindrical hollow target body according to claim 8, wherein the $LiMM'O_2$ lithium-containing transition metal oxide has a M'/M atomic ratio superior or equal to 0.001 and inferior or equal to 0.05.

11. The cylindrical hollow target body according to claim 8, wherein the $LiMO_2$ lithium-containing transition metal oxide has a general formula: $LiC_oO_2$.

12. The cylindrical hollow target body according to claim 11, wherein the Li/Co ratio is equal to 1.00±0.50.

13. The cylindrical hollow target body according to claim 1, presenting an outer surface and/or an inner surface roughness superior or equal to 0.2 μm and inferior or equal to 3.0 μm.

14. The cylindrical hollow target body according to claim 1, presenting an outer surface and/or an inner surface roughness equal to 2.5±0.25 μm.

15. The cylindrical hollow target body according to claim 1, presenting an axial length range superior or equal to 100 mm and inferior or equal to 1000 mm.

16. The cylindrical hollow target body according to claim 1, presenting an outer diameter superior or equal to 75 mm and inferior or equal to 175 mm, and an inner diameter superior or equal to 50 mm and inferior or equal to 160 mm.

17. The cylindrical hollow target body according to claim 1, having a purity of at least 99.995% by weight.

18. A process for manufacturing a lithium-containing transition metal oxide-based cylindrical hollow target body, comprising the following steps:
   providing a lithium-containing transition metal oxide material;
   providing an aqueous solution;
   contacting said lithium-containing transition metal oxide material and said aqueous solution under agitation so to form a slurry wherein said lithium-containing transition metal oxide material is dispersed in said aqueous solution;
   wet-milling said slurry;

adding under agitation at least one binder in said slurry resulting in a homogenous slurry comprising said at least one binder;

spray-drying said slurry comprising said at least one binder so to form a lithium-containing transition metal oxide-based granulate; and molding said lithium-containing transition metal oxide-based granulate in a hollow cylindrical-shaped mold under cold isostatic pressure (CIP) conditions so to form a molded body;

heating said molded body so as to remove said at least one binder; and sintering, after said heating step, said molded body so to obtain the lithium-containing transition metal oxide cylindrical hollow target body consisting in a lithium transition metal oxide microstructure that contains a bimodal grain size distribution.

19. The process according to claim 18, comprising a first step of machining said cylindrical hollow body so to shape it in an axial length range superior or equal to 100 mm and inferior or equal to 1000 mm, in an outer diameter superior or equal to 75 mm and inferior or equal to 175 mm, and an inner diameter superior or equal to 50 mm and inferior or equal to 160 mm.

20. The process according to claim 18, comprising a second step of machining said cylindrical hollow body so to shape it in an outer surface and/or an inner surface roughness superior or equal to 0.2 µm and inferior or equal to 3.0 µm.

21. The process according to claim 18, wherein the step of molding said lithium-containing transition metal oxide-based granulate is done under CIP with a pressure range between 2000 to 4000 bars.

22. The process according to claim 21, wherein the step of molding is performed at a temperature ranging between 20° C. and 30° C.

23. The process according to claim 18, wherein the step of wet-milling is performed so to obtain a lithium-containing transition metal oxide-based granulate comprising at least 50% of the total number of granulates with a size between 40 µm and 120 µm.

24. The process according to claim 18, wherein the step of heating so as to remove said at least one binder is performed at a first temperature superior or equal to 150° C. and inferior or equal to 600° C., and wherein the sintering step is performed at a second temperature that is superior to the first temperature and inferior or equal to 1050° C.

25. The process according to claim 18, comprising a step of providing a lithium-containing transition metal oxide material under a powder form having median particle size of less than 40 µm.

26. The process according to claim 18, wherein the wet-milling step is performed so to provide suspending particles powder having a median particle size superior or equal to 0.15 µm and inferior or equal to 2.0 µm.

27. The process according to claim 19, wherein the wet-milling step is performed so to provide suspending particles powder having a bi-modal particle size distribution wherein a first mode is centered at a first particle size value comprised between 0.1 µm and 0.3 µm, and wherein a second mode is centered at a second particle size value comprised between 1.0 µm and 7.0 µm.

28. The process according to claim 18, wherein the wet-milling step is performed so to obtain a slurry that has a viscosity superior or equal to 30 cP and inferior or equal to 120 cP.

29. The process according to claim 18, wherein the step of adding of at least one binder step is performed so to obtain a slurry that has a viscosity superior or equal to 25 cP and inferior or equal to 125 cP.

30. The process according to claim 18, wherein said at least one binder is added to said slurry in a quantity represented by 0.25 wt % to 3.0 wt % of the lithium-containing transition metal oxide material.

31. The process according to claim 18, wherein the step of sintering results in a lithium-containing transition metal oxide that has a mean grain diameter superior or equal to 5 µm and inferior or equal to 40 µm.

32. The process according to claim 18, wherein the step of sintering results in a lithium-containing transition metal oxide that has a mean grain diameter superior or equal to 5 µm and inferior or equal to 20 µm.

33. The process according to claim 18, wherein the step of sintering results in a lithium-containing transition metal oxide presenting a bi-modal grain size distribution wherein each mode of said bi-modal grain size distribution is centered at a mean diameter value inferior or equal to 50 µm.

34. The process according to claim 33, wherein the step of sintering results in a lithium-containing transition metal oxide presenting a bi-modal grain size distribution wherein each mode of said bi-modal grain size distribution is centered at a mean diameter value superior or equal to 5 µm and inferior or equal to 20 µm.

35. The process according to claim 18, comprising a step of providing a lithium-containing transition metal oxide powder having a general formula: $LiMO_2$ or $LiMM'O_2$, wherein M is a transition metal selected from the group consisting of: Ni, Co, Mn, Ti, Al, V, Cr, Y, Sr, Ca, Zr, Zn, Si, Mg, Ga, W, Fe, Cu, La, or at least one combination thereof, and M' is a dopant selected from the group consisting of: Ti, Al, V, Cr, Y, Sr, Ca, Zr, Zn, Si, Mg, Ga, W, Fe, Cu, La, or at least one combination thereof.

36. The process according to claim 35, comprising a step of providing a lithium-containing transition metal oxide powder having a Li/M or Li/(M+M') atomic ratio superior or equal to 0.90 and inferior or equal to 1.25.

37. The process according to claim 35, comprising a step of providing a lithium-containing transition metal oxide powder having a M'/M atomic ratio superior or equal to 0.001 and inferior or equal to 0.05.

38. The process according to claim 18, comprising a step of providing a lithium-containing transition metal oxide powder having as a general formula: $LiC_oO_2$.

39. The process according to claim 38, comprising a step of providing a lithium-containing transition metal oxide powder having as a general formula: $LiC_oO_2$ and wherein the Li/Co ratio is equal to 1.0±0.50.

40. The process according to claim 18, for manufacturing a lithium-containing transition metal oxide-based cylindrical hollow target body having a relative density value ≥90.0%.

41. The process according to claim 18, for manufacturing a lithium-containing transition metal oxide-based cylindrical hollow target body having a resistance value ≤5 kΩ cm.

42. The process according to claim 18, for manufacturing a lithium-containing transition metal oxide-based cylindrical hollow target body having a relative density value between 91.0% and 99.8%.

43. A sputtering target assembly comprising the cylindrical hollow target body according to claim 1.

* * * * *